US008941729B2

(12) United States Patent
Kikuchi et al.

(10) Patent No.: US 8,941,729 B2
(45) Date of Patent: Jan. 27, 2015

(54) ELECTRONIC COMPONENT HANDLING APPARATUS, ELECTRONIC COMPONENT TESTING APPARATUS, AND ELECTRONIC COMPONENT TESTING METHOD

(75) Inventors: Aritomo Kikuchi, Saitama (JP); Hiroto Nakamura, Saitama (JP)

(73) Assignee: Advantest Corporation, Tokyo (JP)

( * ) Notice: Subject to any disclaimer, the term of this patent is extended or adjusted under 35 U.S.C. 154(b) by 954 days.

(21) Appl. No.: 13/082,668

(22) Filed: Apr. 8, 2011

(65) Prior Publication Data

US 2011/0254945 A1  Oct. 20, 2011

(30) Foreign Application Priority Data

Apr. 15, 2010  (JP) ................................. 2010-094158

(51) Int. Cl.
*H04N 7/18* (2006.01)
*G01R 31/28* (2006.01)

(52) U.S. Cl.
CPC ........ *G01R 31/2893* (2013.01); *G01R 31/2891* (2013.01)
USPC ....................................................... 348/126

(58) Field of Classification Search
CPC .................................................... G01R 31/309
USPC ....................................................... 348/126
See application file for complete search history.

(56) References Cited

U.S. PATENT DOCUMENTS

| 2005/0151551 A1* | 7/2005 | Okuda et al. ................... 324/758 |
| 2007/0109000 A1* | 5/2007 | Inoue et al. ................... 324/754 |
| 2009/0278559 A1 | 11/2009 | Inoue et al. |

FOREIGN PATENT DOCUMENTS

| JP | 10-332764 | 12/1998 |
| JP | 2007-163463 | 6/2007 |
| WO | 03/075023 | 9/2003 |

OTHER PUBLICATIONS

Antares Advanced Test Technologies, PoP Contractor-Challenges & Solutions, received Dec. 6, 2013.

* cited by examiner

*Primary Examiner* — Sath V Perungavoor
*Assistant Examiner* — James Pontius
(74) *Attorney, Agent, or Firm* — Greenblum & Bernstein, P.L.C.

(57) ABSTRACT

An electronic device handling apparatus, which handles an electronic device under test having a first main surface provided thereon with first device terminals and a second main surface provided thereon with second device terminals, includes: a contact arm having a holding-side contact arm to which a first socket is attached and a suction pad which holds the electronic device under test; an alignment apparatus which positions the first socket and the electronic device under test; and the alignment apparatus which positions, with respect to a second socket, the electronic device under test being held by the suction pad and contacting the first socket, wherein the contact arm presses the second device terminals of the electronic device under test to the second socket.

3 Claims, 46 Drawing Sheets

ELECTRONIC COMPONENT HANDLING APPARATUS, ELECTRONIC COMPONENT TESTING APPARATUS, AND ELECTRONIC COMPONENT TESTING METHOD

TECHNICAL FIELD

The present invention relates to an electronic device handling apparatus for handling various types of electronic devices such as semiconductor integrated circuits, an electronic device test apparatus comprising the same, and an electronic device test method.

BACKGROUND ART

An electronic device test apparatus is known which positions an electronic device under test having input and output terminals provided on one main surface thereof with respect to a socket of a test head thereafter to test the electronic device under test (refer to Patent Document 1, for example).

PRIOR ART DOCUMENT(S)

Patent Document(s)

[Patent Document 1] International Publication No. 03/075023

SUMMARY OF THE INVENTION

Problems to be Solved by the Invention

However, the above known technique may not be applied to a test for an electronic device under test having input and output terminals provided on both main surfaces thereof.

Problems to be solved by the present invention or objects of the present invention include to provide an electronic device handling apparatus for testing an electronic device under test having input and output terminals (hereinafter, also referred simply to as device terminals) provided on both surface thereof, an electronic device test apparatus comprising the same, and an electronic device test method.

Means for Solving the Problems

The electronic device handling apparatus according to the present invention is an electronic device handling apparatus for handling an electronic device under test, the electronic device under test having a first main surface provided thereon with a first device terminal and a second main surface provided thereon with a second device terminal, characterized in that the electronic device handling apparatus comprises: a contact arm having an attaching part to which a first socket contacting the first device terminal is attached and a holding means which holds the first main surface of the electronic device under test; a first positioning means which positions the first socket and the electronic device under test; and a second positioning means which positions, with respect to the second socket, the electronic device under test being held by the holding means and contacting the first socket, and the contact arm presses the second device terminal of the electronic device under test to the second socket (refer to claim 1).

In the above invention, the first positioning means may have: a first imaging apparatus which images the first main surface of the electronic device under test; a first image processing means which calculates, based on a first image information imaged by the first imaging apparatus, a first relative position of the electronic device under test with respect to the first socket attached to the attaching part; and a first positional correction means which corrects a position of the electronic device under test or a position of the first socket based on the first relative position, and the second positioning means may have: a second imaging apparatus which images the second main surface of the electronic device under test being held by the holding means and contacting the first socket; a second image processing means which calculates a second relative position of the electronic device under test with respect to the second socket based on a second image information imaged by the second imaging apparatus; and a second positional correction means which corrects a position of the electronic device under test based on the second relative position.

In the above invention, the electronic device handling apparatus may further comprise a first moving means which causes the contact arm to move, the contact arm may have a fixed part fixed to the first moving means, the first positional correction means and the second positional correction means may be provided as an identical positional correction means, the positional correction means may have: a planar movement apparatus which causes the attaching part of the contact arm to move in a plane relative to the fixed part; and a locking means which is provided between the fixed part and the attaching part of the contact arm and causes a relative planar movement of the attaching part with respect to the fixed part to be locked or non-locked, and the planar movement apparatus may be fixed relative to a base table of the electronic device handling apparatus.

In the above invention, the electronic device handling apparatus may further comprise: a holding part which holds the electronic device under test; and a second moving means which causes the holding part to move to a receiving position where the contact arm is capable of receiving the electronic device under test, and the planar movement apparatus may be provided at a position higher than the receiving position.

In the above invention, the electronic device handling apparatus may further comprise: a first moving means which causes the contact arm to move; a holding part which holds the electronic device under test; and a second moving means which causes the holding part to move to a receiving position where the contact arm is capable of receiving the electronic device under test, the contact arm may have a fixed part fixed to the first moving means, the first positional correction means may have: a first planar movement apparatus which causes the holding part to move in a plane relative to the second moving means; and a first locking means which is provided between the holding part and the second moving means and causes a relative planar movement of the holding part with respect to the second moving means be locked or non-locked, the second positional correction means may have: a second planar movement apparatus which causes the attaching part of the contact arm to move in a plane relative to the fixed part; and a second locking means which is provided between the fixed part and the attaching part of the contact arm and causes a relative planar movement of the attaching part with respect to the fixed part to be locked or non-locked, and the first planar movement apparatus and the second planar movement apparatus may be fixed relative to a base table of the electronic device handling apparatus.

In the above invention, the first planar movement apparatus and the second planar movement apparatus may be provided as an identical planar movement apparatus.

In the above invention, the electronic device handling apparatus may further comprise: a holding part which holds the electronic device under test; and a moving means which causes the holding part to move to a receiving position where the contact arm is capable of receiving the electronic device under test, and the first positional correction means may have a planar movement apparatus which is arranged between the holding part and the moving means and causes the electronic device under test to move in a plane via the holding part.

In the above invention, the electronic device handling apparatus may further comprise: a third imaging apparatus which images the first socket attached to the attaching part of the contact arm; and a fourth imaging apparatus which images the second socket attached to a test head, the first image processing means may have: a first socket terminal extraction means which extracts a position of a first socket terminal from a third image information imaged by the third imaging apparatus, the first socket terminal being electrically connected with the first device terminal within the first socket; a first device terminal extraction means which extracts a position of the first device terminal from the first image information; and a first calculation means which compares the position of the first socket terminal and the position of the first device terminal to calculate the first relative position, and the second image processing means may have: a second socket terminal extraction means which extracts a position of a second socket terminal from a fourth image information imaged by the fourth imaging apparatus, the second socket terminal being electrically connected with the second device terminal within the second socket; a second device terminal extraction means which extracts a position of the second device terminal from the second image information; and a second calculation means which compares the position of the second socket terminal and the position of the second device terminal to calculate the second relative position.

In the above invention, the first imaging apparatus and the fourth imaging apparatus may be provided as an identical imaging apparatus.

In the above invention, the second imaging apparatus and the third imaging apparatus may be provided as an identical imaging apparatus.

The electronic device test apparatus according to the present invention is an electronic device test apparatus for testing an electronic device under test, the electronic device under test having a first main surface provided thereon with a first device terminal and a second main surface provided thereon with a second device terminal, characterized in that the electronic device test apparatus comprises: the above electronic device handling apparatus in which a first socket contacting the first device terminal is attached to a contact arm; and a test head which has a second socket contacting the second device terminal and inputs and outputs test signals for the electronic device under test, and the first socket and the second socket are electrically conducted when the contact arm presses the electronic device under test to the second socket.

The electronic device test method according to the present invention is an electronic device test method for testing an electronic device under test, the electronic device under test having a first main surface provided thereon with a first device terminal and a second main surface provided thereon with a second device terminal, characterized in that the electronic device test method comprises: a first positioning step for positioning a first socket and the electronic device under test; a first contacting step for causing the first socket and the electronic device under test to contact each other; a second positioning step for positioning the electronic device under test with respect to a second socket in a status where the first socket and the electronic device under test are contacted with each other; a second contacting step for causing the electronic device under test to contact the second socket; and a testing step for testing the electronic device under test in a status where the electronic device under test is caused to intervene between the first socket and the second socket.

In the above invention, the first positioning step may include: a first imaging step for imaging the first main surface of the electronic device under test; a first recognition step for recognizing, based on a first image information imaged in the first imaging step, a first relative position of the electronic device under test with respect to the first socket; and a first positional correction step for correcting a position of the first socket or the electronic device under test based on the first relative position, and the second positioning step may include: a second imaging step for imaging the second main surface of the electronic device under test; a second recognition step for recognizing, based on a second image information imaged in the second imaging step, a second relative position of the electronic device under test with respect to the second socket; and a second positional correction step for correcting a position of the electronic device under test based on the second relative position.

In the above invention, the first positioning step may further include a third imaging step for imaging the first socket, the first recognition step may include: a first socket terminal extraction step for extracting a position of a first socket terminal from a third image information imaged by the third imaging step, the first socket terminal being electrically connected with the first device terminal within the first socket; a first device terminal extraction step for extracting a position of the first device terminal from the first image information; and a first calculation step for comparing the position of the first socket terminal and the position of the first device terminal to calculate the first relative position, the second positioning step may further include a fourth imaging step for imaging the second socket, and the second recognition step may include: a second socket terminal extraction step for extracting a position of a second socket terminal from a fourth image information imaged by the fourth imaging step, the second socket terminal being electrically connected with the second device terminal within the second socket; a second device terminal extraction step for extracting a position of the second device terminal from the second image information; and a second calculation step for comparing the position of the second socket terminal and the position of the second device terminal to calculate the second relative position.

In the above invention, the first positioning step may further include a third imaging step for imaging the first socket provided thereon with a first alignment mark, and the first recognition step may include: a first mark extraction step for extracting a position of the first alignment mark from a third image information imaged by the third imaging step; a first device terminal extraction step for extracting a position of the first device terminal from the first image information; and a first calculation step for comparing the position of the first alignment mark and the position of the first device terminal to calculate the first relative position.

In the above invention, the second positioning step may further include a fourth imaging step for imaging the second socket provided thereon with a second alignment mark, and the second recognition step may include: a second mark extraction step for extracting a position of the second alignment mark from a fourth image information imaged by the fourth imaging step; a second device terminal extraction step for extracting a position of the second device terminal from the second image information; and a second calculation step for comparing the position of the second alignment mark and the position of the second device terminal to calculate the second relative position.

Advantageous Effect of the Invention

According to the present invention, it is enabled to test an electronic device under test having device terminals provided on the both surfaces.

EMBODIMENTS FOR CARRYING OUT THE INVENTION

Hereinafter, embodiments according to the present invention will be described with reference to the drawings.

First Embodiment

Figure 1:
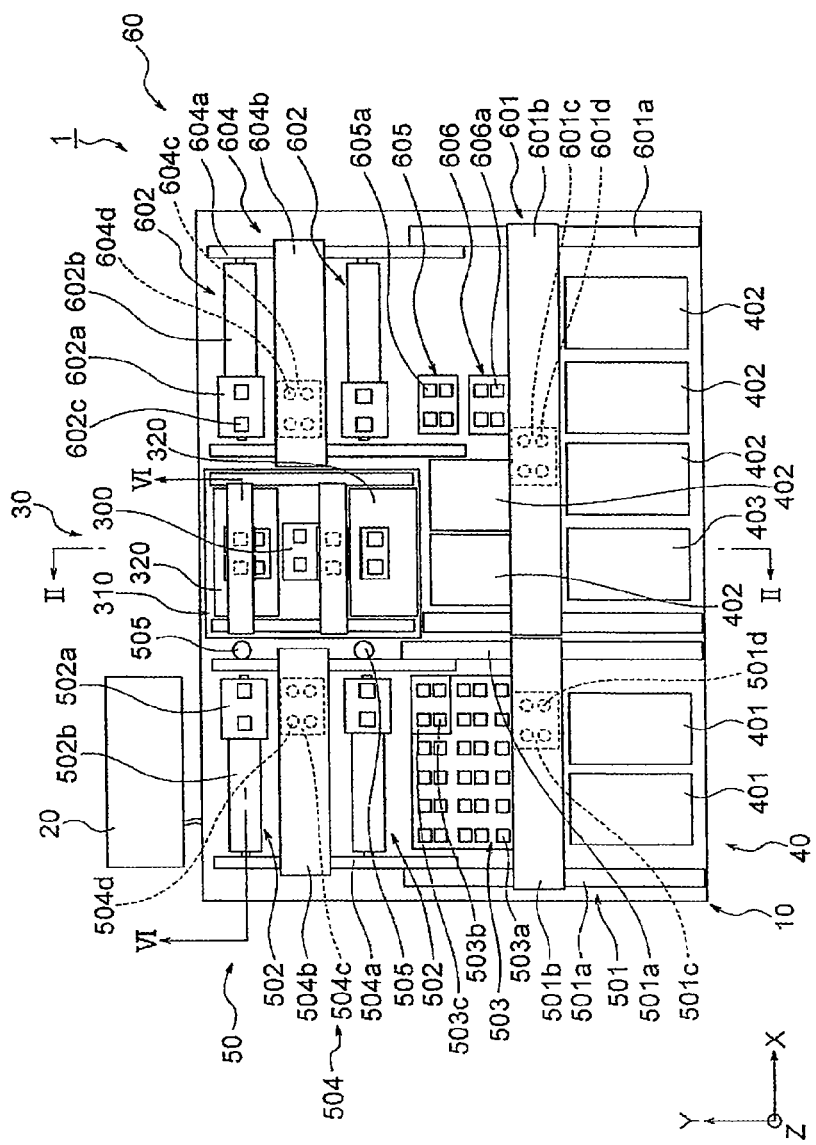
FIG. 1 is a plan view of an electronic device test apparatus according to the first embodiment of the present invention.
Figure 2:
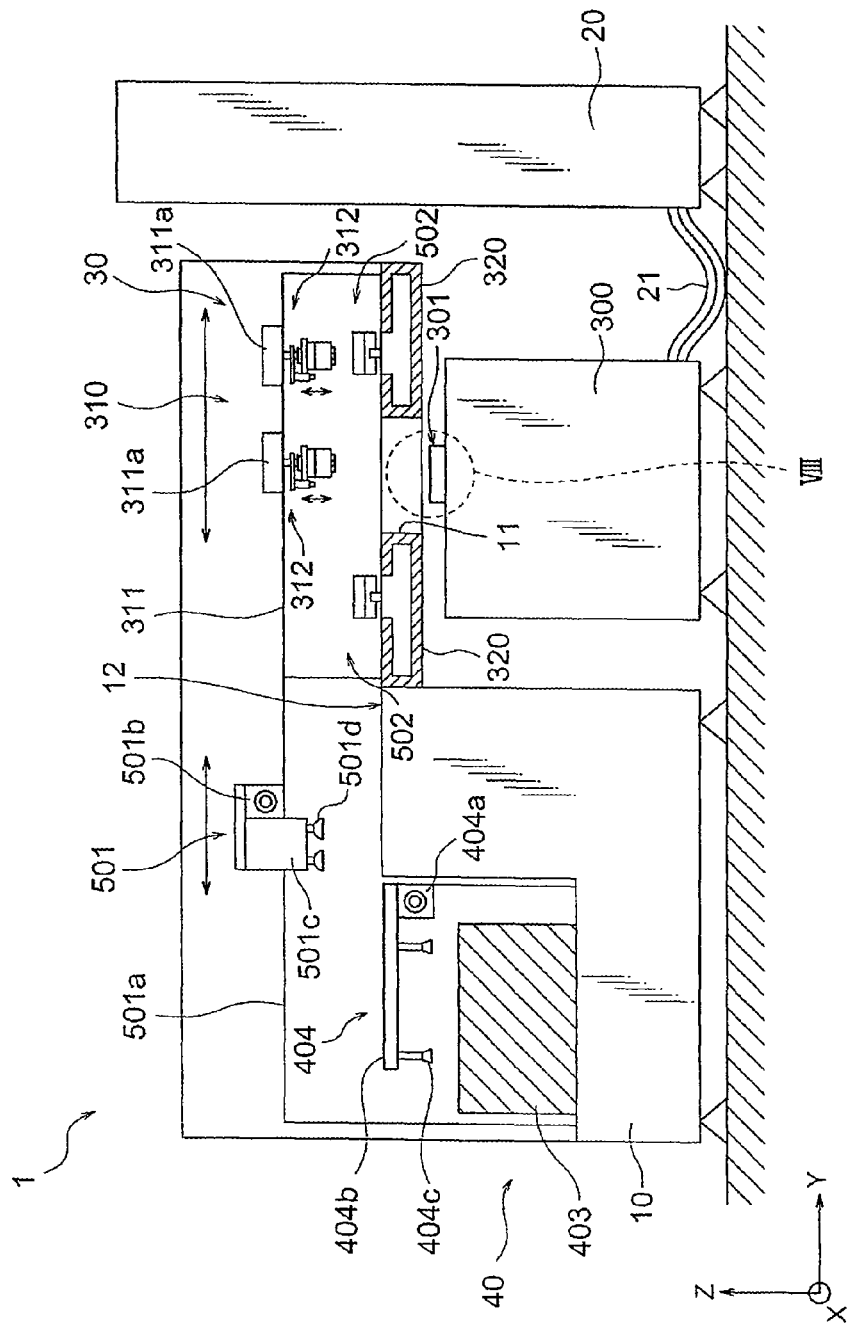
FIG. 2 is a cross sectional view along the line II-II of FIG. 1.

FIG. 1 is a plan view of an electronic device test apparatus according to the present embodiment, and FIG. 2 is a cross sectional view along the line of FIG. 1.

As shown in FIG. 1 and FIG. 2, the electronic device test apparatus 1 comprises an electronic device handling apparatus (hereinafter also referred to as handler) 10, a test head 300 and a tester 200, and the test head 300 and the tester 200 are connected with each other via cables 21.

In this electronic device test apparatus 1, electronic devices under test 100 on supply trays before testing, which are stored in stockers 401 for supply trays within the handler 10, are carried to a YZ moving apparatus 310, which presses the electronic devices under test 100 onto a second socket 301 of the test head 300 to perform testing the electronic devices under test 100 via this test head 300 and the cables 21, and thereafter the electronic devices under test 100 completed to be tested are put into classification trays stored in stockers 402 for classification trays in accordance with testing results. Note that, in FIG. 2, the stockers 402 for classification trays placed at the nearer side of the test head 300 shown in FIG. 1 are omitted to be depicted.

The handler 10 has a test part 30, an IC storage part 40, a loader part 50, and an unloader part 60.

Prior to describing details for each part of the handler 10, an electronic device under test 100 to be handled by this handler 10 will now be described.

Figure 3:
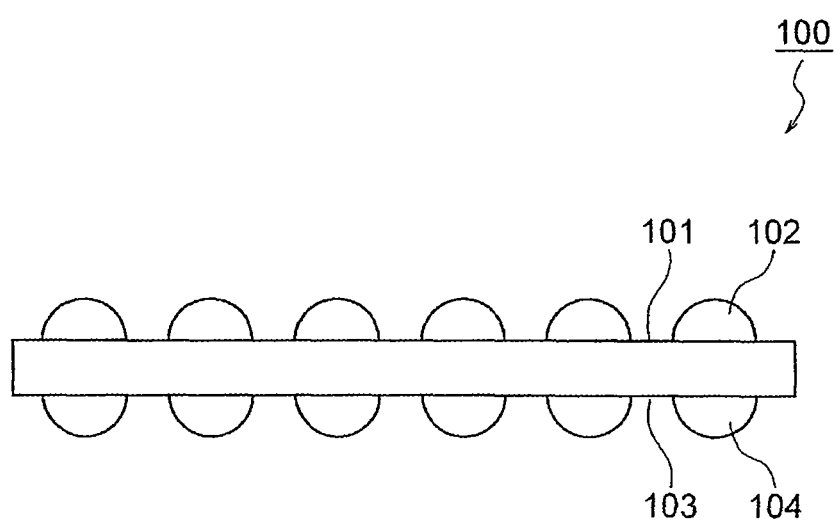
FIG. 3 is a side elevational view of an electronic device under test according to the first embodiment of the present invention.
Figure 4:
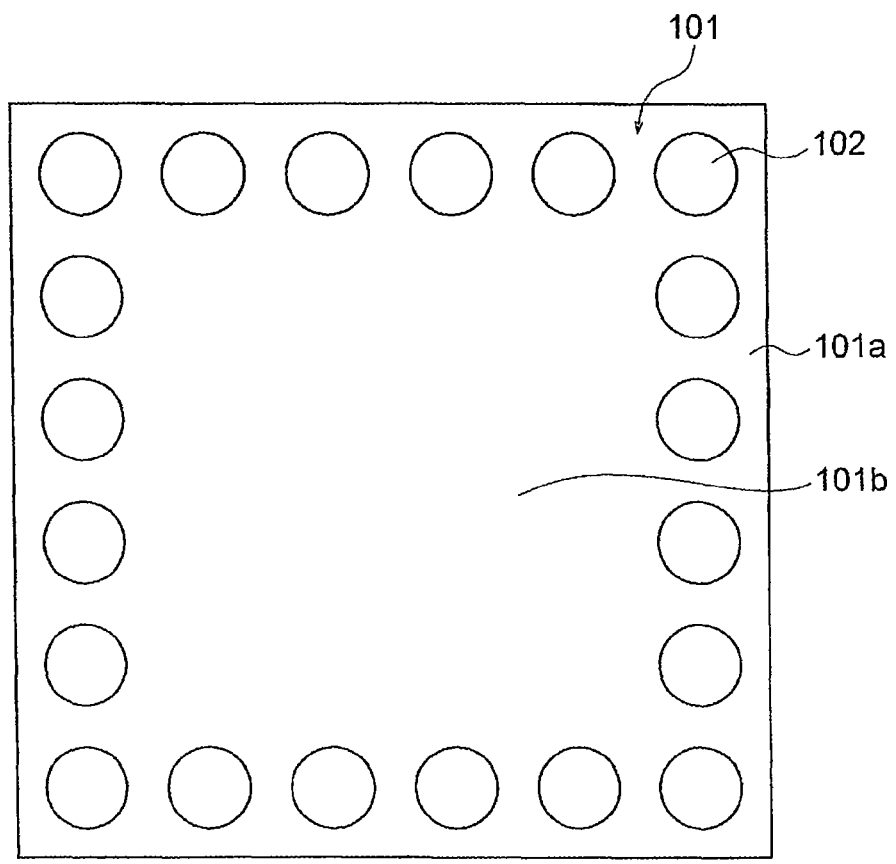
FIG. 4 is a plan view of the electronic device under test according to the first embodiment of the present invention.
Figure 5:
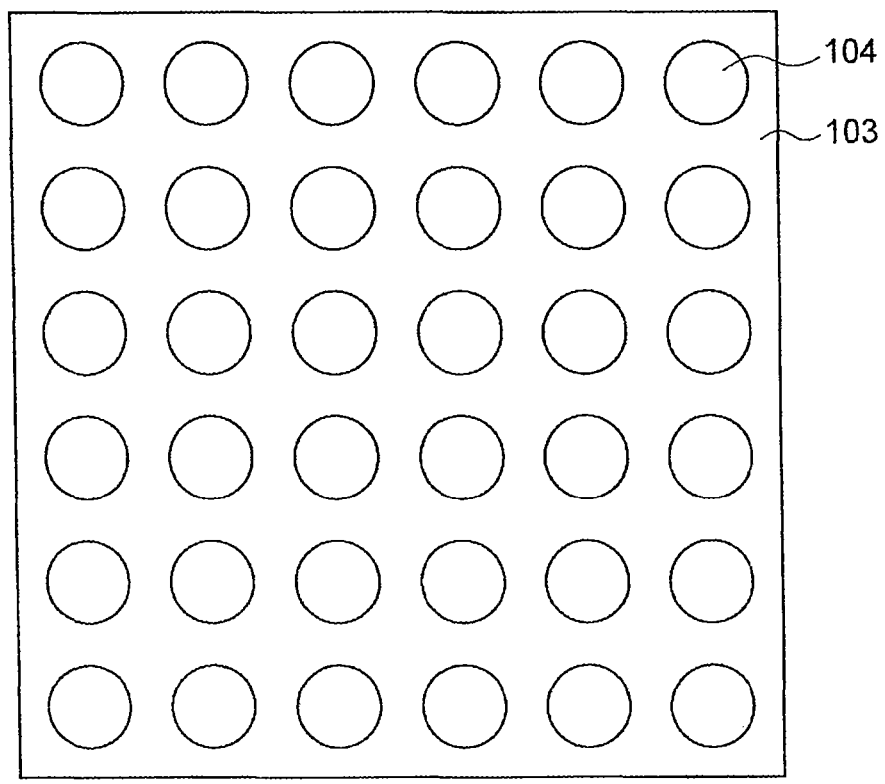
FIG. 5 is a bottom plan view of the electronic device under test according to the first embodiment of the present invention.

FIG. 3 is a side elevational view of an electronic device under test according to the present embodiment, FIG. 4 is a plan view of the electronic device under test according to the present embodiment, and FIG. 5 is a bottom plan view of the electronic device under test according to the present embodiment.

The electronic device under test 100 has, as shown in FIG. 3, a first main surface (top surface) 101 and a second main surface (back surface) 103. This first main surface 101 of the electronic device under test 100 is, as shown in FIG. 4, arranged thereon with first device terminals 102 at an outer border area 101a. Note that, in the present embodiment, twenty (20) of the first device terminals 102 are arranged with substantially equal intervals so as to represent a rectangular shape. The first main surface 101 has a center area 101b where in contrast no first device terminals 102 are provided thereby to ensure a flat region. Note that this center area 101b is to be contacted with a suction pad 317c of a contact arm 315, as will be described later (refer to FIG. 12).

On the other hand, the second main surface 103 is, as shown in FIG. 5, entirely arranged thereon with second device terminals 104 in a matrix state. Although both the first and second device terminals 102 and 104 are formed as bumps in the present embodiment, they are not particularly limited to bumps. Moreover, the number and the arrangement of the first and second device terminals are not particularly limited. As such electronic device under test 100, a logic IC may be mentioned, for example.

Detailed structure of each part of the handler 10 will now be described.

<IC Storage Part 40>

The IC storage part 40 is means for storing electronic devices under test 100 before testing and after testing, and is comprised primarily of stockers 401 for supply trays, stockers 402 for classification trays, a stocker 403 for empty trays, and a tray carrying apparatus 404.

Within each stocker 401 for supply trays, a plurality of supply trays which store a plurality of electronic devices under test 100 before testing are stacked and accommodated. The handler 10 according to the present embodiment involves two stockers 401 for supply trays, as shown in FIG. 1.

Within each stocker 402 for classification trays, a plurality of classification trays which store a plurality of electronic device under test 100 after testing are stacked and accommodated. The handler 10 according to the present embodiment involves five stockers 402 for classification trays, as shown in FIG. 1. Providing these five stockers 402 for classification trays allows the electronic devices under test 100 to be classified and stored with up to five categories according to the test results. That is, in addition to classification between good and defective devices, it is possible to classify good devices into ones with operating speeds which are high, medium and low, or defective devices into ones where retesting is required or not.

Note that, for example with respect to the five stockers 402 for classification trays shown in FIG. 1, electronic devices under test 100 with test results of which occurrence frequency is comparatively low may be classified into two stockers 402 for classification trays near the test part 30, while electronic devices under test 100 with test results of which occurrence frequency is comparatively high may be classified into three stockers 402 for classification trays far from the test part 30.

The stocker 403 for empty trays is a stocker to which empty trays are to be accommodated. This stocker 403 for empty trays is arranged between the stockers 401 for supply trays and the stockers 402 for classification trays in the plan view shown in FIG. 1.

The tray carrying apparatus 404, which is a carrying means capable of moving in the X-axis direction and the Z-axis direction, as shown in FIG. 2, primarily has an X-axis direction rail 404a and a movable head part 404b. This tray carrying apparatus 404 is allocated with a working area covering the stockers 401 for supply trays, a part of the stockers 402 for classification trays, and the stocker 403 for empty trays.

In turn, the tray carrying apparatus 404 is configured such that the X-axis direction rail 404a fixed to a base table 12 of the handler 10 supports, in a cantilever form, the movable head part 404b to be movable in the X-axis direction, and the movable head part 404b is provided thereon with a Z-axis direction actuator not shown and suction pads 404c.

The tray carrying apparatus 404 causes the suction pads 404c to adsorb and hold an empty tray having been empty within the stockers 401 for supply trays, moves the empty tray upward by the Z-axis direction actuator, and carries the empty tray to the stocker 403 for empty trays by causing the movable head part 404b to move on the X-axis direction rail 404a. Similarly, when a classification tray within a stocker 402 for classification trays is filled with electronic devices under test 100 after testing, the tray carrying apparatus 404 carries an empty tray from the stocker 403 for empty trays to the stocker 402 for classification trays by adsorbing and holding the empty tray, moving it upward by the Z-axis direction actuator, and causing the movable head part 404b to move on the X-axis direction rail 404a.

Herein not shown, each stocker 401, 402, 403 is provided with an elevator capable of moving up-and-down in the Z-axis direction. Note that the number of the above stockers is arbitrarily set as needed.

<Loader Part 50>

Figure 6:
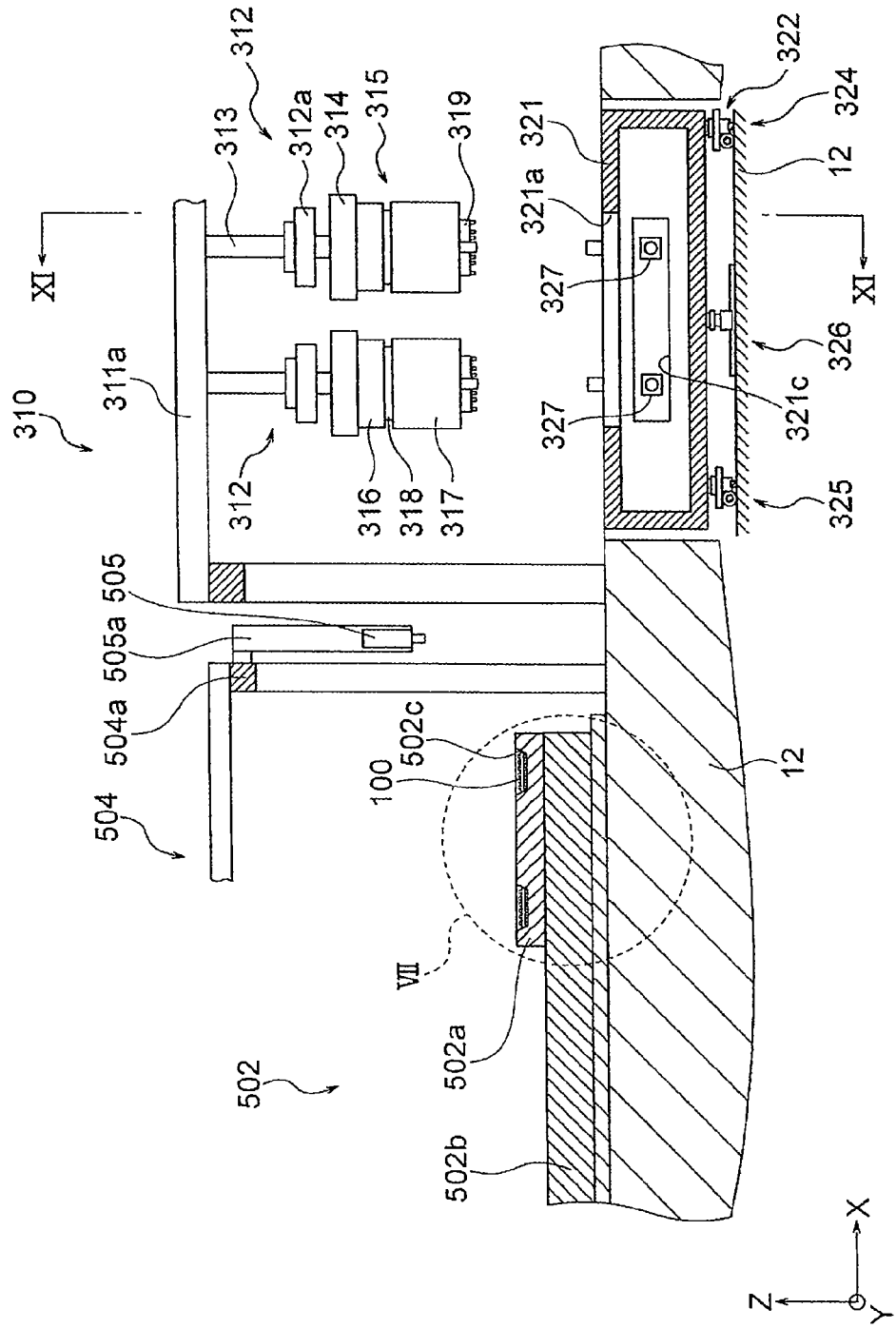
FIG. 6 is a cross sectional view along the line VI-VI of FIG. 1.
Figure 7:
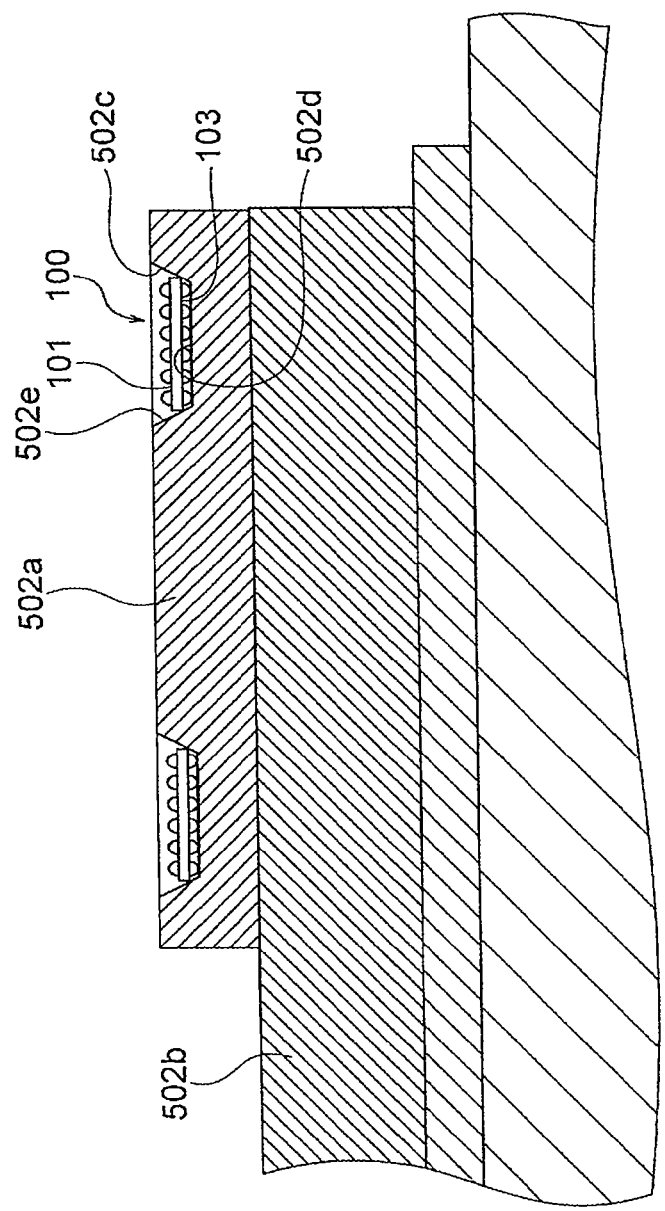
FIG. 7 is an enlarged cross sectional view of the part VII of FIG. 6.

FIG. 6 is a cross sectional view along the line VI-VI of FIG. 1, and FIG. 7 is an enlarged cross sectional view of the part VII of FIG. 6.

The loader part 50 is, as shown in FIG. 1, means for supplying electronic devices under test 100 from a stocker 401 for supply trays of the IC storage part 40 to the test part 30. This loader part 50 has a loader pick-and-place 501, two buffer parts 502 for loader, a heat plate 503, a buffer pick-and-place 504, and a CCD camera 505.

The loader pick-and-place 501 is means for carrying electronic devices under test 100 on supply trays of the stockers 401 for supply trays within the IC storage part 40 to the heat plate 503, and has two Y-axis direction rails 501a, an X-axis direction rail 501b, and a movable head part 501c, as shown in FIG. 1 and FIG. 2.

The two Y-axis direction rails 501a are provided on the base table 12 of the handler 10, and arranged such that the stockers 401 for supply trays and the heat plate 503 intervene between the Y-axis direction rails 501a in the plan view shown in FIG. 1. The X-axis direction rail 501b is supported by the two Y-axis direction rails 501a so as to be movable in the Y-axis direction. The X-axis direction rail 501b in turn supports the movable head part 501c having a Z-axis direction actuator (not shown) such that the movable head part 501c is movable in the X-axis direction. Further, the movable head part 501c has four suction pads 501d at the lower portion thereof, and moves the four suction pads 501d up-and-down in the Z-axis direction by driving the Z-axis direction actuator provided therewith.

This loader pick-and-place 501 causes the four suction pads 501d to be positioned above four respective electronic devices under test 100 on a supply tray, adsorbs the four electronic devices under test 100 at a same time, moves them toward above the heat plate 503, positions them above respective recesses 503a formed on the surface of the heat plate 503, and releases them. Note that one suction pad 501d is capable of adsorbing one electronic device under test 100.

The heat plate 503 is a heat source for applying a certain heat stress to the electronic device under test 100, and is a metallic plate of which the lower portion is attached with a heater (not shown), for example. This heat plate 503 is arranged between the stockers 401 for supply trays and the buffer parts 502 for loader in the plan view shown in FIG. 1, and thus located within the working area of the loader pick-and-place 501. Here, the working area of the loader pick-and-place 501 and the working area of the buffer pick-and-place 504 are overlapped with each other at a region 503c, which is defined by a corner formed with the X-axis positive direction and the Y-axis positive direction within the heat plate 503.

In addition, the upper surface of the heat plate 503 is formed thereon with a plurality of recesses 503a into which electronic devices under test 100 are put down. Note that, from four recesses 503b arranged within the region 503c among these recesses 503a, the electronic devices under test 100 are passed to the buffer pick-and-place 504.

Alternatively, because alignment for positioning the electronic devices under test 100 is performed by an alignment apparatus 320 prior to testing, as will be described later, the surface of the heat plate 503 may be formed merely as a flat surface without recesses 503a, 503b such that the loader pick-and-place 501 may put the electronic devices under test 100 on that flat surface. Alternatively, the surface of the heat plate may be formed as a flat surface provided with suction pads of which suction faces are orientated upward in the vertical direction, such that the loader pick-and-place 501 may put the electronic devices under test 100 on these suction pads, thereby allowing the electronic devices under test 100 to be absorbed by these suction pads provided with the heat plate.

The buffer pick-and-place 504 is means for carrying the electronic devices under test 100 accommodated in the recesses 503b of the heat plate 503 to a movable part 502a of a buffer part 502 for loader. This buffer pick-and-place 504 has two Y-axis direction rails 504a, an X-axis direction supporting member 504b, and a movable head part 504c thereby to obtain the working area thereof, which covers over from the area where the recesses 503b are located within the heat plate 503 to the buffer parts 502 for loader.

As shown in FIG. 1 and FIG. 6, the two Y-axis direction rails 504a of the buffer pick-and-place 504 are provided on the base table 12 of the handler 10, and the X-axis direction supporting member 504b is supported on the two Y-axis direction rails 504a so as to be movable in the Y-axis direction. The lower portion of this X-axis direction supporting member 504b is fixed thereon with the movable head part 504c having a Z-axis direction actuator (not shown). The movable head part 504c has four suction pads 504d at the lower end portion thereof, and moves the four suction pads 504d up-and-down in the Z-axis direction by driving the Z-axis direction actuator provided therewith.

This buffer pick-and-place 504 adsorbs, using the four suction pads 504d, respective four electronic devices under test 100 accommodated in the four recesses 503b of the heat plate 503, moves them toward the Y-axis negative direction in the figures to above a buffer part 502 for loader, and releases two electronic devices under test 100 above two recesses 502c formed on the movable part 502a of that buffer part 502 for loader. Thereafter, the buffer pick-and-place 504 moves remaining two electronic devices under test 100 adsorbed by it toward the Y-axis positive direction in the figures to above the other buffer part 502 for loader, and releases the two electronic devices under test 100 above two recesses 502c formed on the movable part 502a of that buffer parts 502 for loader.

Each buffer part 502 for loader is means for carrying the electronic devices under test 100 from the working area of the buffer pick-and-place 504 to the working area of a YZ moving apparatus 310, and is positioned below the buffer pick-and-place 504, as shown in FIG. 6. This buffer part 502 for loader has the movable part 502a and an X-axis direction actuator 502b.

The X-axis direction actuator 502b is fixed onto the base table 12 of the handler 10, and the movable part 502a is supported at one end portion of the X-axis direction actuator 502b. In addition, the upper surface of the movable part 502a is formed thereon with two recesses 502c each capable of accommodating one electronic device under test 100. The bottom surface 502d of each recess 502c has, as shown in FIG. 7, a shape depending on the outer shape of the electronic device under test 100, and the inner surface 502e of the recess 502c is sloped inwardly downward to the bottom surface 502d.

For this reason, each electronic device under test 100 released from the buffer pick-and-place 504 is guided by this inner surface 502e to be positioned. The electronic device under test 100 positioned in such a manner is maintained to be at a certain position (in the recess 502c) in movable part 502a even during the movement of the movable part 502a. Thus, according to the present embodiment, the recess 502c preliminarily positions an electronic device under test 100 thereby comparatively reducing the alignment time for electronic devices under test 100 using the alignment apparatus 320.

The buffer part 502 for loader holding two electronic devices under test 100 by the movable part 502a expands the X-axis direction actuator 502b thereby causing the electronic devices under test 100 to move from the working area of the buffer pick-and-place 504 to the working area of the YZ moving apparatus 310.

As described above, by providing the buffer parts 502 for loader and the buffer pick-and-place 504, the loader pick-and-place 501 and the YZ moving apparatus 310 are enabled to concurrently operate without any interference therebetween. Moreover, the present embodiment involves two buffer parts 502 for loader to efficiently supply electronic devices under test 100 to the test head 300 thereby allowing the operation rate of the test head 300 to be increased. Note that the number of the buffer parts 502 for loader is not limited to two, and may be arbitrarily set in accordance with a time period required for positional alignment of electronic devices under test 100 as will be described later, and also with a time period required for testing electronic devices under test 100 etc.

The CCD camera 505 is an apparatus for imaging the first main surface 101 of an electronic device under test 100 maintained by the movable part 502a of the buffer parts 502 for loader, and is located above the working area of the buffer parts 502 for loader. This CCD camera 505 is, for example shown in FIG. 1 and FIG. 6, fixed via a fixing arm 505a to a frame for supporting the Y-axis direction rails 504a of the buffer pick-and-place 504 such that the optical axis thereof is directed toward the Z-axis negative direction. Note that the image imaged by this CCD camera 505 is transmitted to an image processing apparatus 70 as will be described later, thereafter being image processed in order for an electronic device under test 100 and a first socket 319 to be positioned. Also note that this CCD camera 505 corresponds to one example of the first imaging apparatus according to the present invention.

<Test Part 30>

Figure 8:
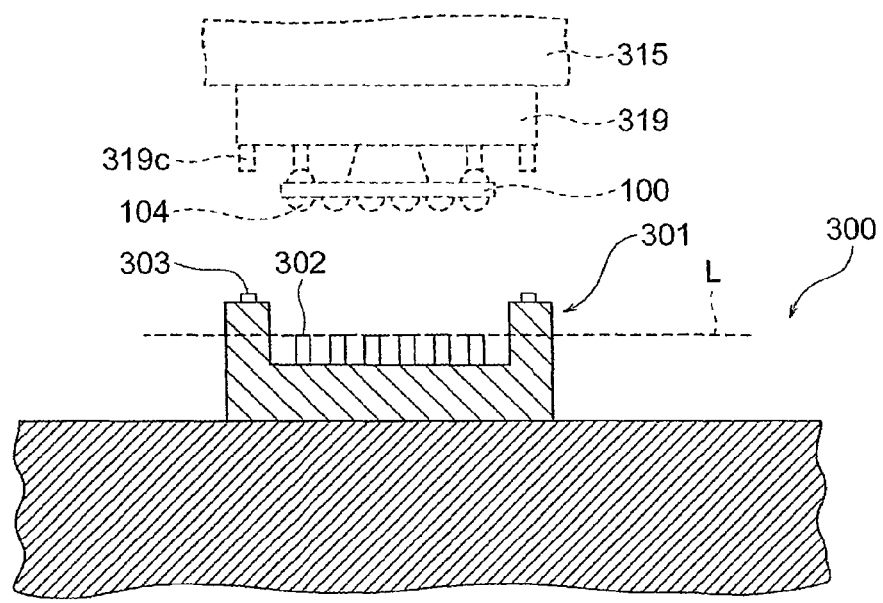
FIG. 8 is an enlarged cross sectional view of the part VIII of FIG. 2.
Figure 9:
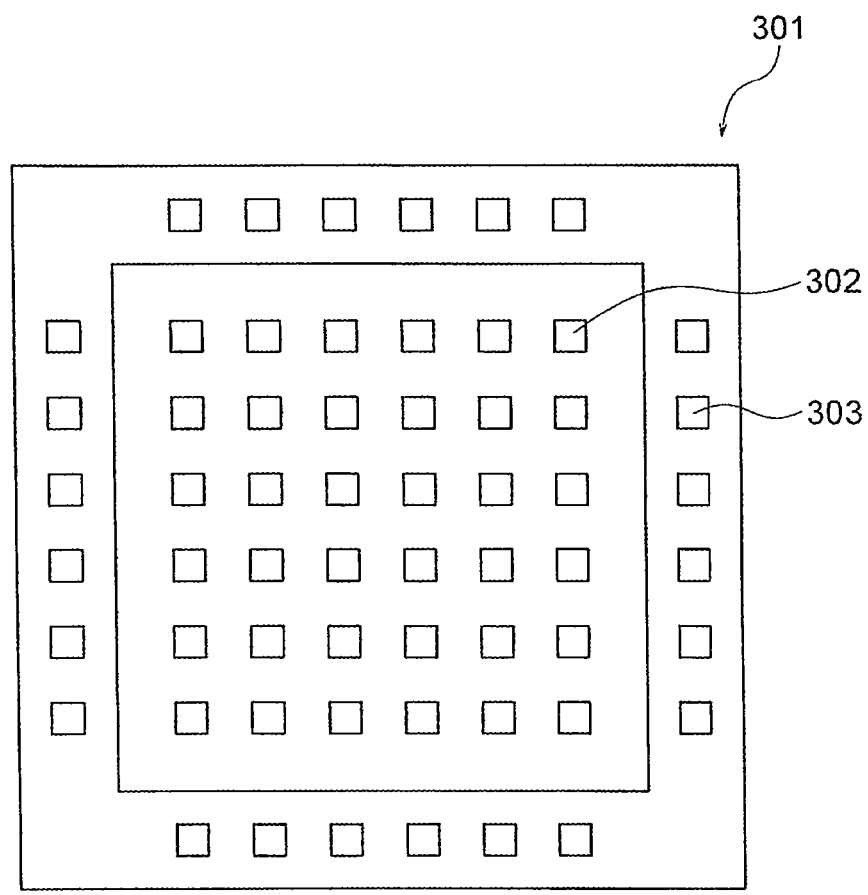
FIG. 9 is a plan view of a second socket according to the first embodiment of the present invention.
Figure 10:
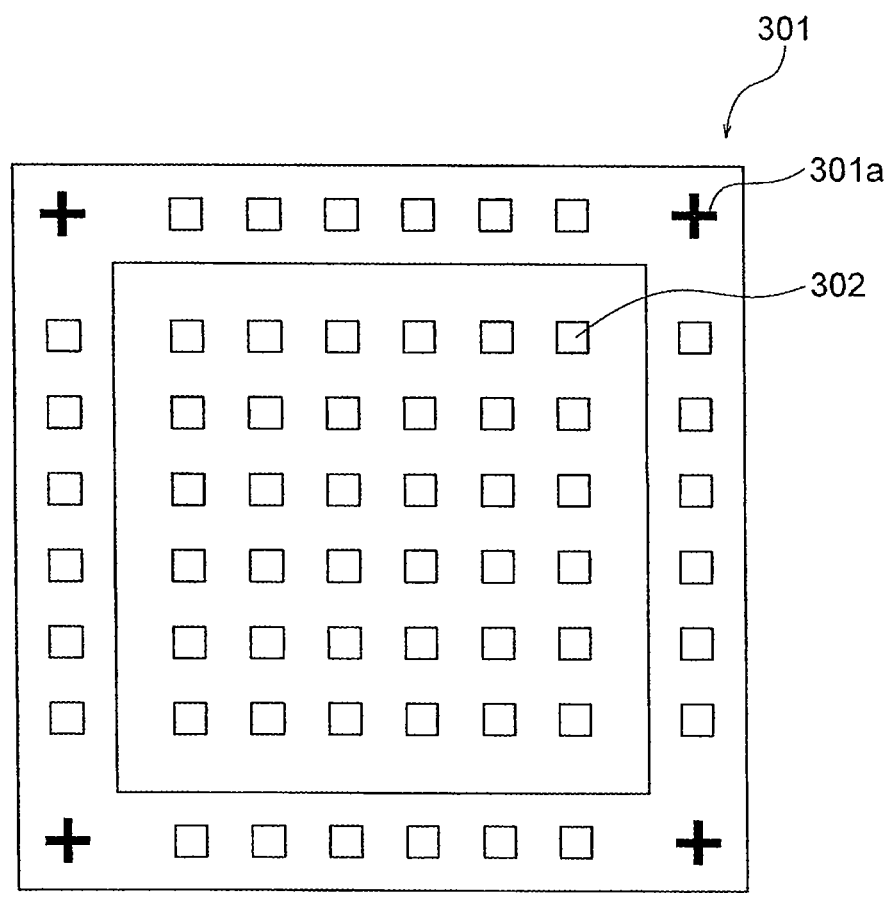
FIG. 10 is a plan view illustrating a modified example of the second socket according to the first embodiment of the present invention.
Figure 11:
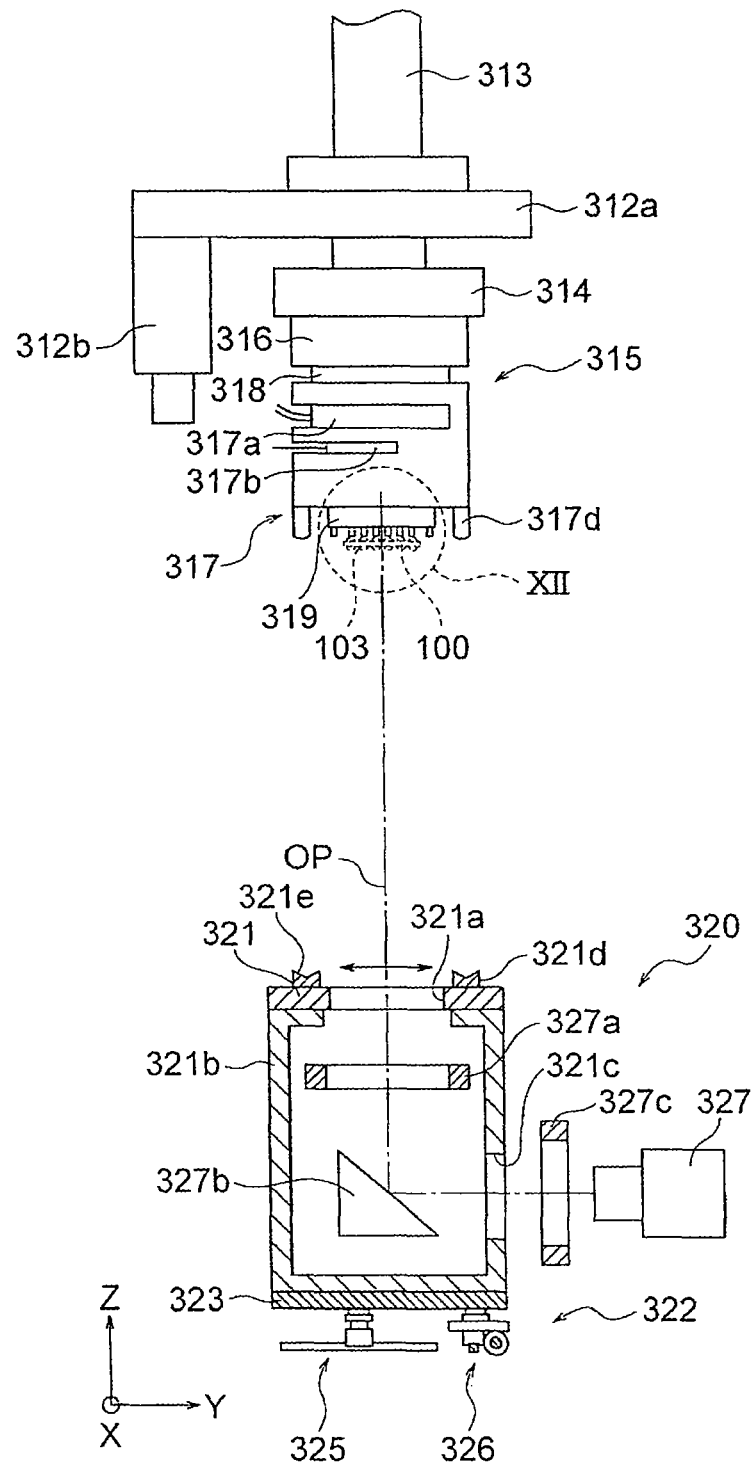
FIG. 11 is a schematic cross sectional view along the line XI-XI of FIG. 6.
Figure 12:
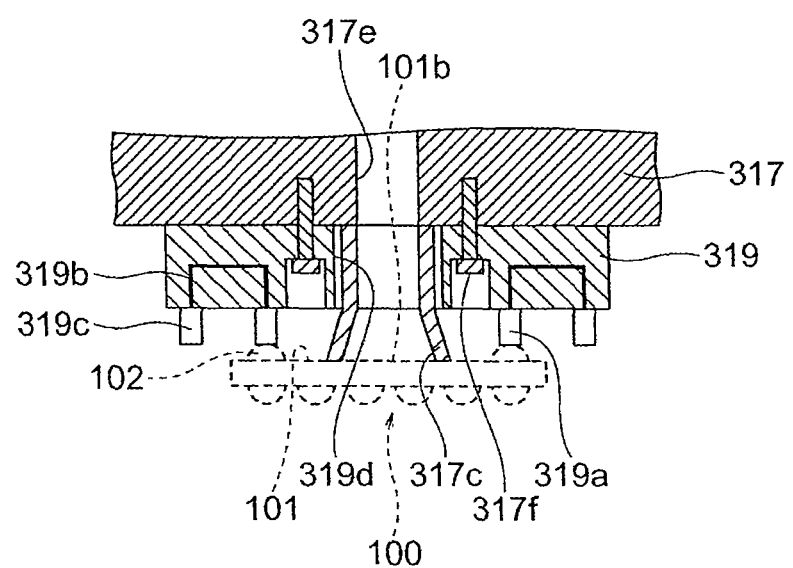
FIG. 12 is an enlarged cross sectional view of the part XII of FIG. 11.
Figure 13:
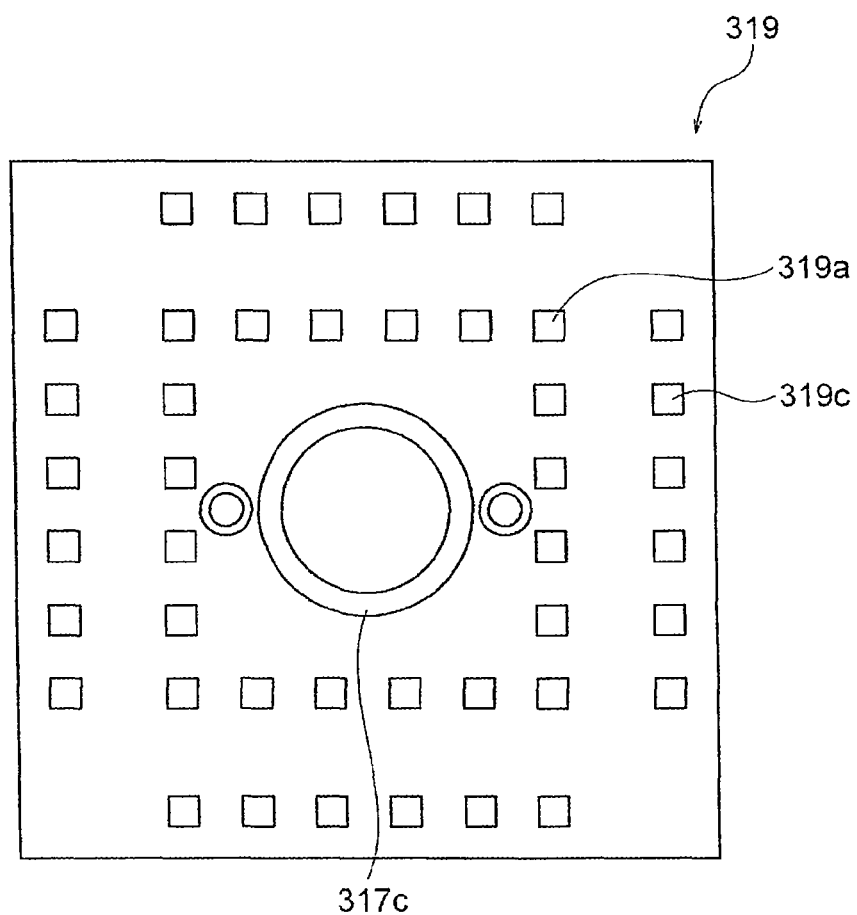
FIG. 13 is a bottom plan view of a first socket according to the first embodiment of the present invention.
Figure 14:
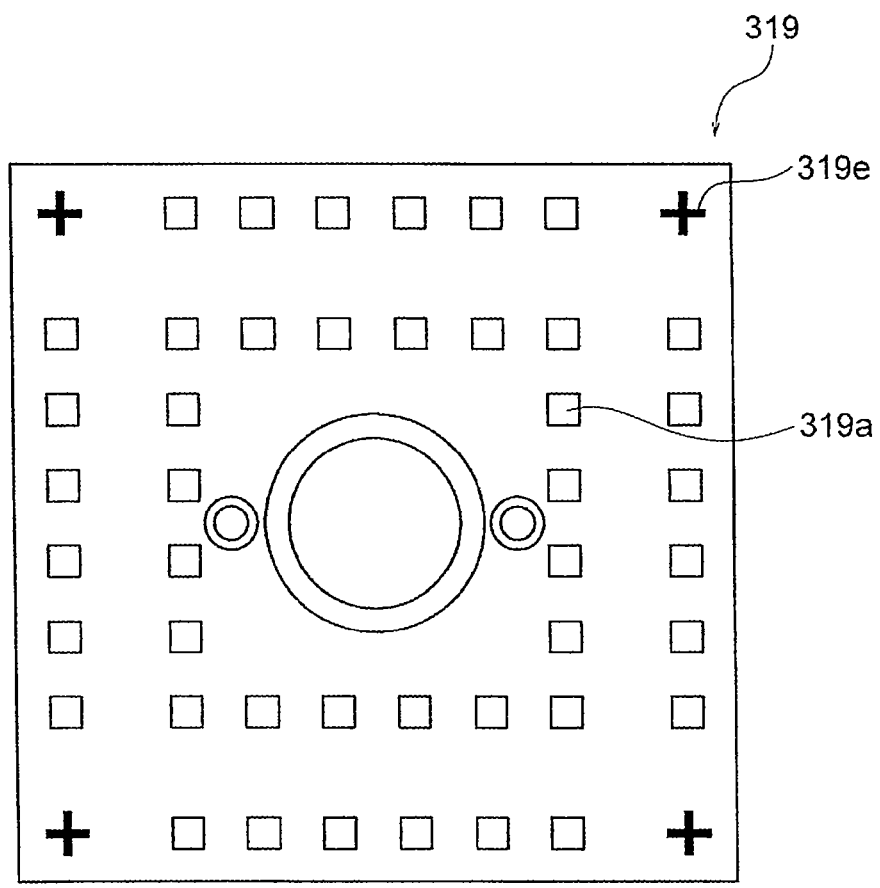
FIG. 14 is a bottom plan view illustrating a modified example of the first socket according to the first embodiment of the present invention.
Figure 15:
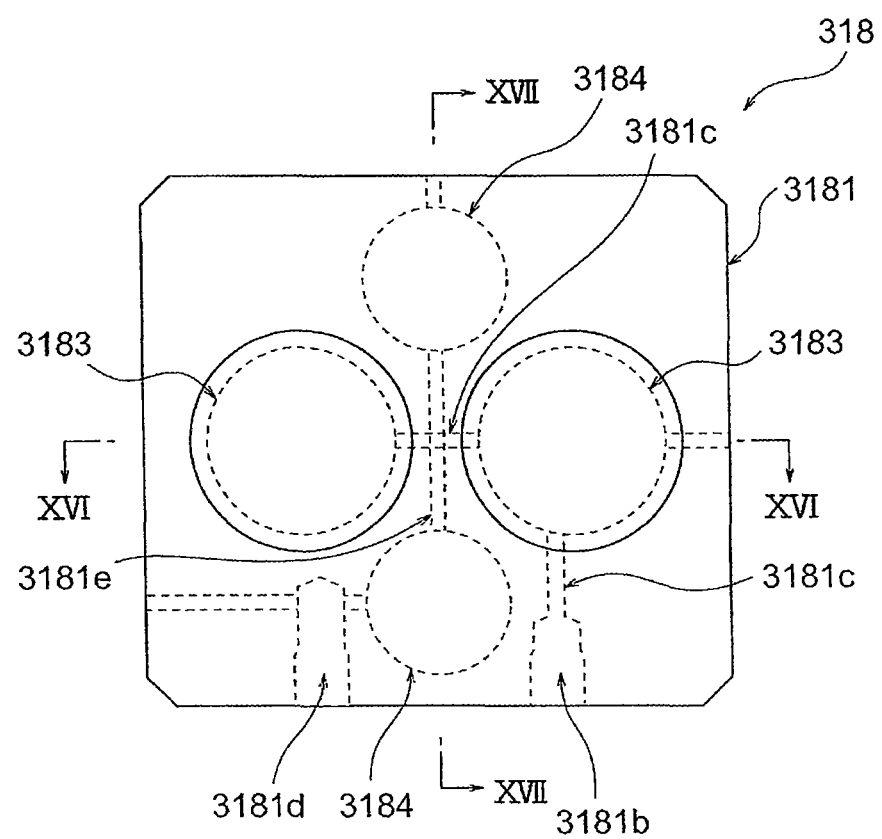
FIG. 15 is a plan view of the upper portion of a lock-and-free mechanism according to the first embodiment of the present invention.
Figure 16:
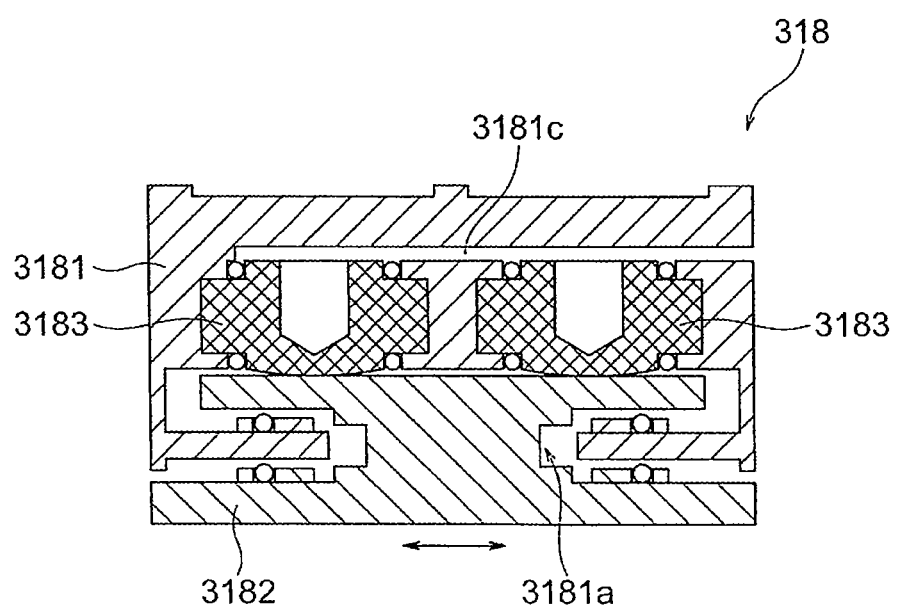
FIG. 16 is a cross sectional view along the line XVI-XVI of FIG. 15.
Figure 17:
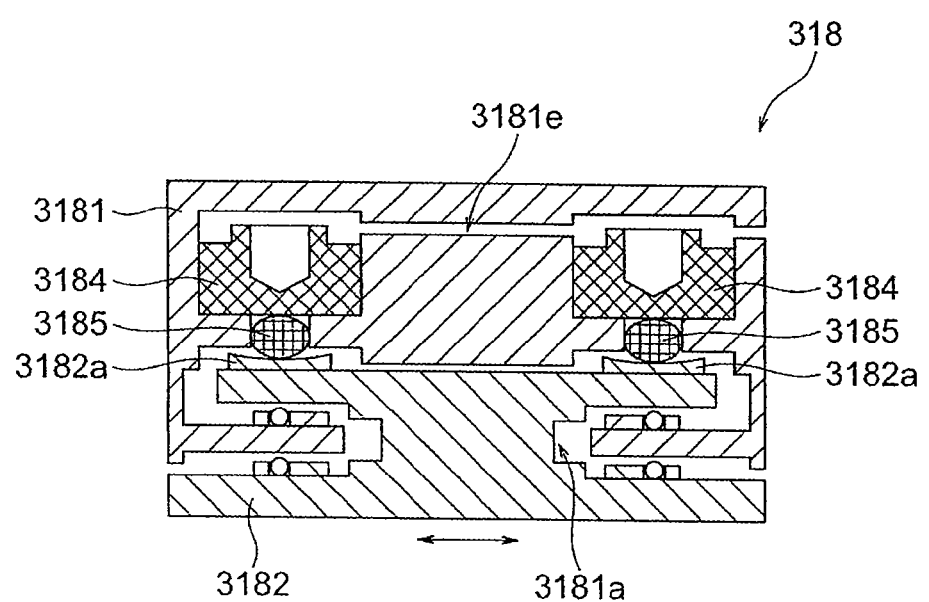
FIG. 17 is a cross sectional view along the line XVII-XVII of FIG. 15.
Figure 18:
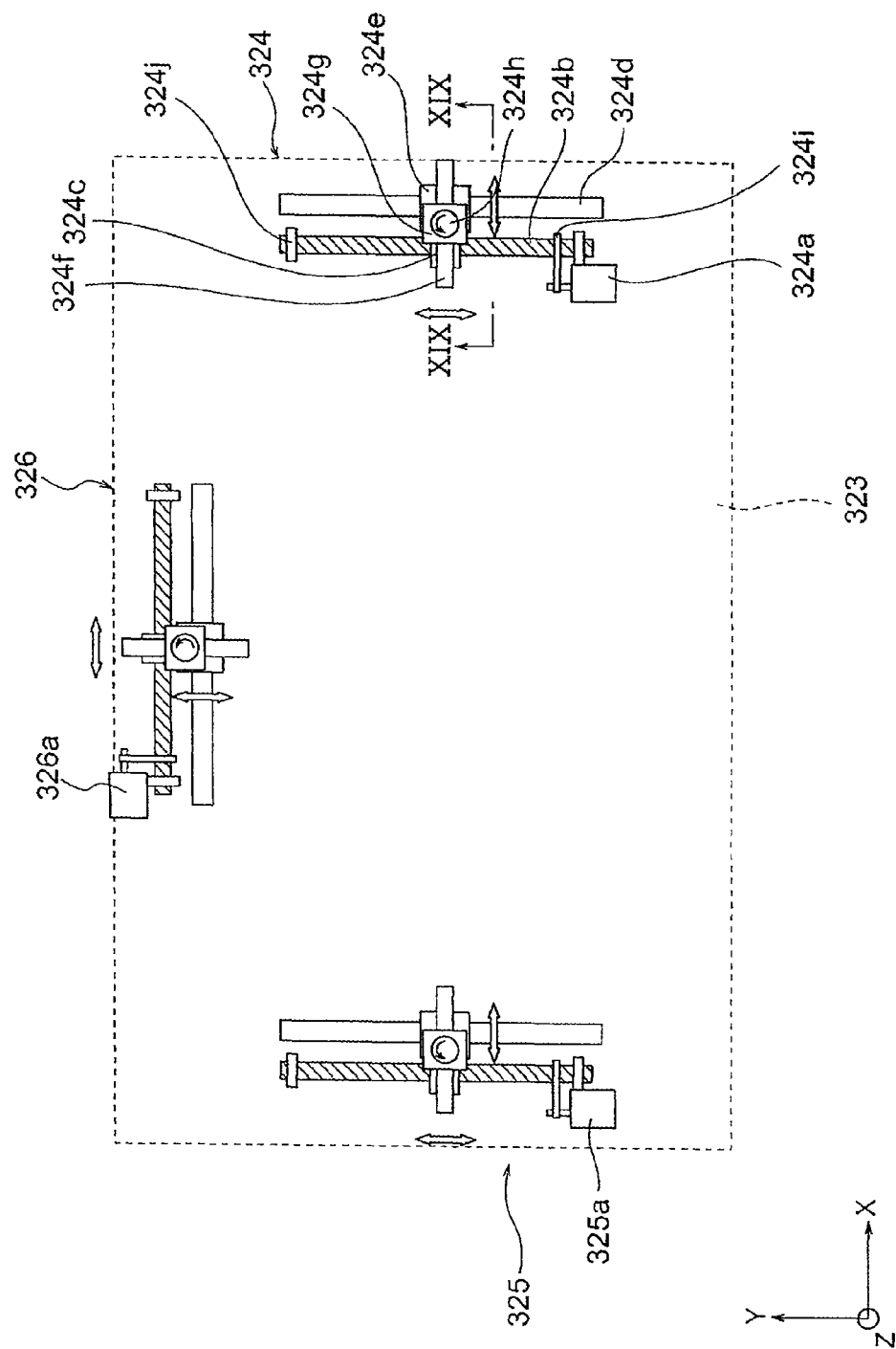
FIG. 18 is a plan view of an alignment movable part driving apparatus according to the first embodiment of the present invention.
Figure 19:
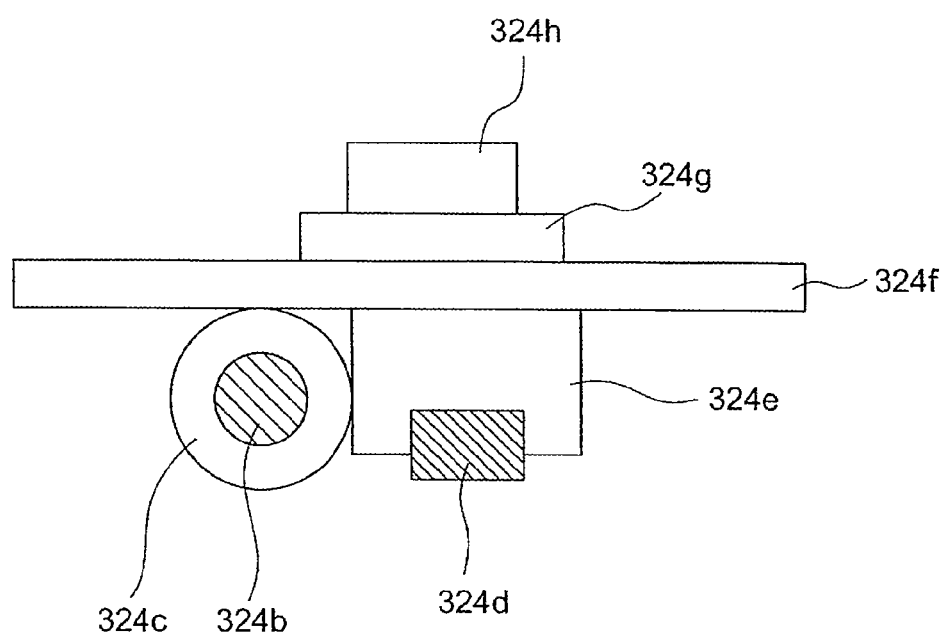
FIG. 19 is a cross sectional view along the line XIX-XIX of FIG. 18.
Figure 20:
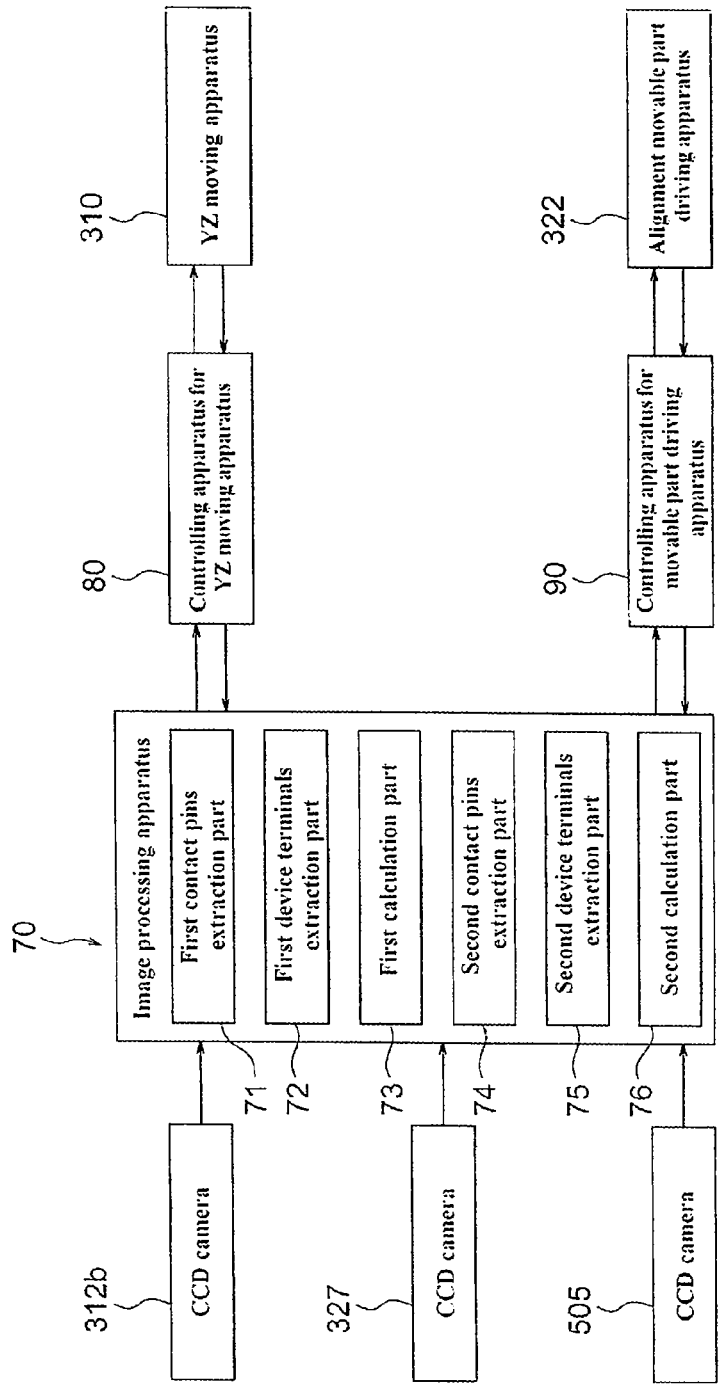
FIG. 20 is a block diagram illustrating the configuration of an image processing apparatus according to the first embodiment of the present invention.
Figure 21:
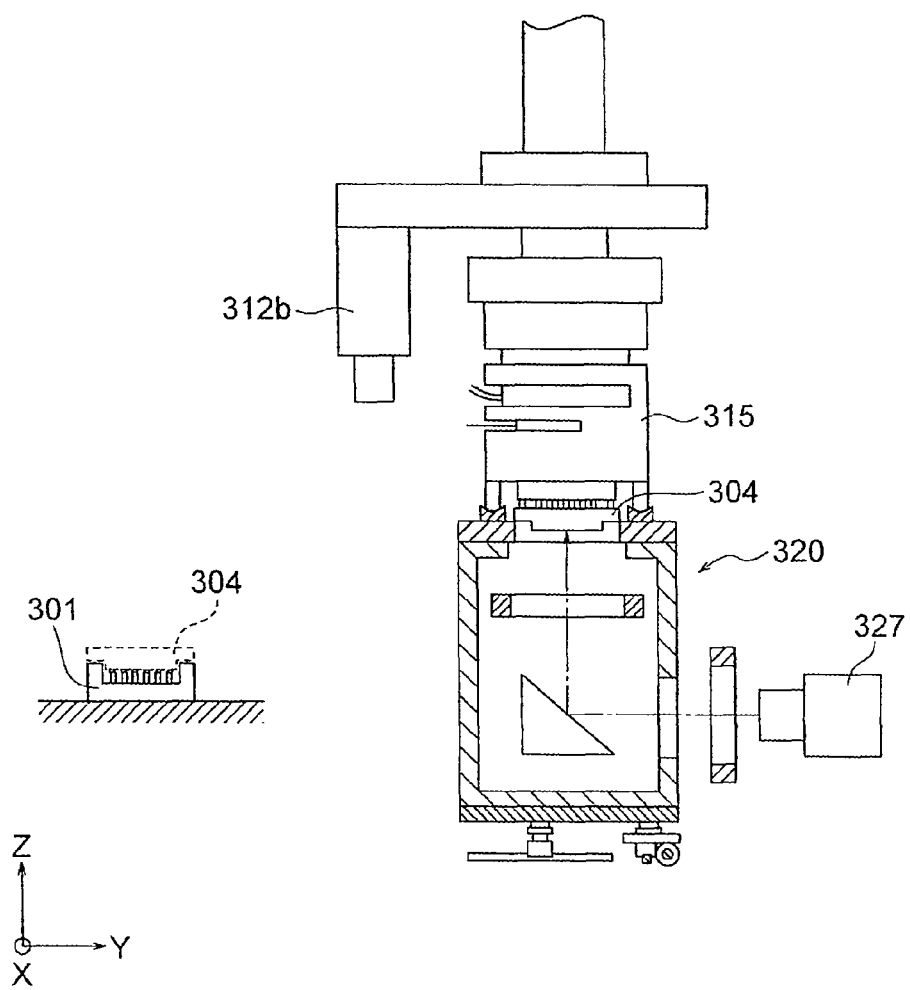
FIG. 21 is a schematic cross sectional view illustrating a modified example of the calibration of a CCD camera according to the first embodiment of the present invention.

FIG. 8 is an enlarged cross sectional view of the part VIII of FIG. 2, FIG. 9 is a plan view of a second socket according to the present embodiment, FIG. 10 is a plan view illustrating a modified example of the second socket according to the present embodiment, FIG. 11 is a schematic cross sectional view along the line XI-XI of FIG. 6, FIG. 12 is an enlarged cross sectional view of the part XII of FIG. 11, FIG. 13 is a bottom plan view of a first socket according to the present embodiment, FIG. 14 is a bottom plan view illustrating a modified example of the first socket according to the present embodiment, and FIG. 15 is a plan view of the upper portion of a lock-and-free mechanism according to the present embodiment. FIG. 16 is a cross sectional view along the line XVI-XVI of FIG. 15, FIG. 17 is a cross sectional view along the line XVII-XVII of FIG. 15, FIG. 18 illustrates an alignment movable part driving apparatus according to the present embodiment, FIG. 19 is a cross sectional view along the line XIX-XIX of FIG. 18, FIG. 20 is a block diagram illustrating the configuration of an image processing apparatus according to the present embodiment, and FIG. 21 is a schematic cross sectional view illustrating a modified example of the calibration of a CCD camera according to the present embodiment.

The test part 30 is means for performing positional alignment of an electronic device under test 100 and also for causing the electronic device under test 100 to contact with the first socket 319 and a second socket 301 thereby to perform test. This test part 30 has the YZ moving apparatus 310 and two alignment apparatuses 320.

More specifically, the test head 300 according to the present embodiment is attached thereto with two second sockets 301, as shown in FIG. 8. Note that one of these two second sockets 301 is omitted to be depicted. When the types of electronic devices under test 100 to be tested and other factors have been determined to be changed, for example, the second sockets 301 are replaced with sockets suitable to the replaced type.

These two second sockets 301 are arranged so as to substantially correspond to the arrangement of the contact arms 315 provided with movable head parts 312 of the YZ moving apparatus 310. In addition, each socket 301 has, as shown in FIG. 8 and FIG. 9, a recessed shape of which the bottom face is provided thereon with a plurality of contact pins 302, which are arranged in a matrix state substantially corresponding to the arrangement of the second device terminals 104 of the electronic device under test 100. Furthermore, the upper end of that recess shape is provided thereon with connecting terminals 303 to be electrically connected with the connecting terminals 319c of the first socket 319 attached to the contact arm 315.

Note that, as shown in FIG. 10, alignment marks 301a may be provided on the upper surface of each second socket 301. This allows the position of the socket to be recognized on the basis of the positions of the alignment marks 301a during the image recognition by means of the image processing apparatus 70, as will be described later.

As shown in FIG. 2, the base table 12 of the handler 10 within the test part 30 is formed therein with an opening area 11. Through this opening area 11, each second socket 301 of the test head 300 is exposed into the handler 10, and the contact arm 315 is thus capable of pressing an electronic device under test 100 onto the second socket 301.

The YZ moving apparatus 310, which is means for moving electronic devices under test 100 between the alignment apparatus 320 and the test head 300, assists the alignment apparatus 320 to perform positional alignment of electronic devices under test 100, and also assists the test head 300 to test electronic devices under test 100.

This YZ moving apparatus 310 supports two X-axis direction supporting members 311a to be movable in the Y-axis direction on two Y-axis direction rails 311 provided on the base table 12 of the handler 10. In addition, the two movable head parts 312 are supported by respective substantially center portions of the X-axis direction supporting members 311a so as to correspond to the arrangement of the second sockets 301. Each movable head part 312 involves its working area covering the alignment apparatus 320 as will be described later and the test head 300. Note that the two X-axis direction supporting members 311a to operate on the pair of Y-axis direction rails 311 are controlled so as not to interfere with each other.

Each movable head part 312 comprises, as shown in FIG. 6, a Z-axis direction actuator 313, a basement 314, and the contact arm 315 thereby to allow an electronic device under test 100 held by the contact arm 315 to move in the Y-axis direction and the Z-axis direction. The movable head part 312 further comprises, as shown in FIG. 11, a camera supporting member 312a and a CCD camera 312b. Note that, in FIG. 6, the CCD camera 312b is omitted to be depicted for convenience in explaining. Also note that this CCD camera 312b corresponds to one example of the fourth imaging apparatus according to the present invention.

One end of this Z-axis direction actuator 313 is fixed to the X-axis direction supporting member 311a, and the other end thereof is fixed to the basement 314. In addition, the Z-axis direction actuator 313 supports the camera supporting member 312a provided thereon with the CCD camera 312b.

This CCD camera 312b is a camera for imaging the second socket 301 attached to the test head 300. The CCD camera 312b is placed at the test head 300 side end portion of the camera supporting member 312a such that the optical axis thereof is directed toward the Z-axis negative direction. Note that, not limited to this placement fashion, the CCD camera 312b may alternatively be attached to the test head 300 side end portion of the basement 314 supported by the end of the Z-axis direction actuator 313. The movability of the CCD camera 312b in the Z-axis direction by the Z-axis direction actuator 313 allows for the focus adjustment of the CCD camera 312b.

The basement 314 intervenes between the contact arm 315 and the Z-axis direction actuator 313 to connect them with each other. The upper end of this basement 314 is connected with the Z-axis direction actuator 313. In turn, the lower end of this basement 314 is connected with a basement-side contact arm 316 of the contact arm 315.

The contact arm 315 has, as shown in FIG. 11, a holding-side contact arm 317, a lock-and-free mechanism 318, and the basement-side contact arm 316.

The basement-side contact arm 316 is connected with the basement 314 and fixed to the Z-axis direction actuator 313 via the basement 314. In addition, the lower end surface of the basement-side contact arm 316 is attached thereon with the holding-side contact arm 317 via the lock-and-free mechanism 318.

The center portion of the holding-side contact arm 317 is, as shown in FIG. 12, formed therein with a suction opening 317e in the substantially orthogonal direction with respect to the first main surface 101 of the electronic device under test 100. In addition, the holding-side contact arm 317 has a suction pad 317c. This suction pad 317c is attached for the suction opening 317e in the status where the end portion of the suction pad 317c projects from an insertion opening 319d of the first socket 319. This suction pad 317c is connected to a vacuum pump not particularly shown via the suction opening 317e, and if the vacuum pump reduces the pressure within the suction pad 317c in the status where the suction pad 317c contacts the center area 101b of the first main surface 101 of an electronic device under test 100, then the first main surface 101 of the electronic device under test 100 is adsorbed by the suction pad 317c, and the electronic device under test 100 is thus held by the holding-side contact arm 317.

Moreover, the holding-side contact arm 317 is, as shown in FIG. 11, embedded therein with a heater 317a and a temperature sensor 317b, wherein the heater 317a maintains the high temperature heat stress applied by the heat plate 503, the temperature sensor 317b detects the temperature of the holding-side contact arm 317 to indirectly detect the temperature of the electronic device under test 100, and thus the detected temperature is provided for the ON/OFF control of the heater 317a and the like.

Furthermore, the end of the bottom surface of the holding-side contact arm 317 is provided thereon with pin-like contacting members 317d capable of being engaged with engaging members 321d of an alignment movable part 321 as will be described later. If these contacting members 317d are engaged with the engaging members 321d of the alignment movable part 321, then, during non-locked status of the lock-and-free mechanism 318, the holding-side contact arm 317 is enabled to follow the movement of the alignment movable part 321.

In addition, the lower surface of the holding-side contact arm 317 is, as shown in FIG. 12, fixed detachably thereon with the first socket 319 by means of bolts 317f. Note that the attaching method of the first socket 319 to the holding-side contact arm 317 is not particularly limited, and magnets and the like may alternatively be used, for example.

This first socket 319 has, as shown in FIG. 12 and FIG. 13, contact pins 319a, wirings 319b, and connecting terminals 319c. Note that, as shown in FIG. 14, alignment marks 319e may be provided on the upper surface of the first socket 319. This also allows the position of the first socket 319 to be recognized on the basis of the positions of the alignment marks 319e during the image recognition by the image processing means 70, as will be described later.

The contact pins 319a are arranged at the lower surface in the drawings of the first socket 319 with an arrangement substantially identical to that of the first device terminals 102 so as to be capable of contacting with the first device terminals 102 of an electronic device under test 100. That is, in the present embodiment, twenty (20) of the contact pins 319a are arranged so as to represent a rectangular shape, as shown in FIG. 13. Note that the number and the arrangement of these contact pins 319a may be arbitrarily changed depending on the number and the arrangement of the first device terminals 102 of an electronic device under test 100.

The wirings 319b electrically connect the contact pins 319a and the connecting terminals 319c.

The connecting terminals 319c are terminals to be contacted with the connecting terminals 303 of the second socket 301 attached to the test head 300 (refer to FIG. 37), and are arranged with an arrangement substantially identical to that of the connecting terminals 303 of the second socket 301. If these connecting terminals 319c contact the connecting terminals 303 of the second socket 301, then the contact pins 319a and the test head 300 are electrically connected via the second socket 301.

That is, in the present embodiment, testing signals to be input to the first device terminals 102 of an electronic device under test 100 are input through a path in the order of the test head 300, the connecting terminals 303 of the second socket 301, the connecting terminals 319c of the first socket 319, the contact pins 319a of the first socket 319, and the first device terminals 102 of the electronic device under test 100. On the other hand, the response signals responding to the input signals are output through a path in the order of the first device terminals 102 of the electronic device under test, the contact pins 319a of the first socket 319, the connecting terminals 319c of the first socket 319, the connecting terminals 303 of the second socket 301, and the test head 300. When the types of electronic devices under test 100 to be tested and other factors have been determined to be changed, for example, the first socket 319 is replaced with a socket suitable for the replaced type, similarly as the second socket 301.

In addition, the center portion of this first socket 319 is formed therein with the insertion opening 319d connected to the suction opening 317e of the holding-side contact arm 317, and the suction pad 317c is inserted into this insertion opening 319d.

The holding-side contact arm 317 according to the present embodiment is enabled to hold the first main surface 101 of an electronic device under test 100 by means of the suction pad 317c in the status where the first device terminals 102 of the electronic device under test 100 are electrically connected with the contact pins 319a.

The lock-and-free mechanism 318 is means for causing a planar motion of the holding-side contact arm 317 relatively to the basement-side contact arm 316 to be locked or non-locked. Note that the direction of the planar movement herein is a planar direction substantially parallel to the virtual plane L (refer to FIG. 8) on which the plurality of connecting terminals 303 of the second socket 301 attached to the test head 300 are positioned. In other words, the lock-and-free mechanism 318 renders a slide movement and a rotational motion to be the locked status or the non-locked status, wherein the slide movement is of the X-axis direction and the Y-axis direction on a plane parallel to the virtual plane L, and the rotational motion is of a θ rotation around the Z-axis orthogonal to the virtual plane L.

Furthermore, a centering capability is provided which recovers the holding-side contact arm 317 along the X-axis and the Y-axis and around the Z-axis for θ rotation after releasing the electronic device under test 100 such that the center line of the holding-side contact arm 317 comes to be substantially identical with the center line of the basement-side contact arm 316.

As shown in FIG. 15 to FIG. 17, the lock-and-free mechanism 318 is comprised of a lock-and-free fixed part 3181, a lock-and-free movable part 3182, pistons 3183 for locking, pistons 3184 for centering, and balls 3185 for centering.

The lock-and-free fixed part 3181, which has an outer shape of substantially rectangular block, is formed with a hollow space within lower side inner portion thereof in order to receive a part of the lock-and-free movable part 3182. In addition, in order to hold the received lock-and-free movable part 3182 movably in a plane, the center portion of the bottom of the lock-and-free fixed part 3181 is provided therein with an opening area 3181a.

Furthermore, the inner portion of the lock-and-free fixed part 3181 is formed with hollow spaces for accommodating two pistons 3183 for locking, two pistons 3184 for centering, and two balls 3185 for centering. In addition, one side surface of the lock-and-free fixed part 3181 is formed therein with an air supply port 3181b for locking to supply air to the pistons 3183 for locking, and air paths 3181c for locking are also formed from the air supply port 3181b for locking to the two pistons 3183 for locking.

Similarly, the side surface of the lock-and-free fixed part 3181 is formed therein with an air supply port 3181d for centering to supply air to the pistons 3184 for centering, and air paths 3181e for centering are also formed from the air supply port 3181d for centering to the two pistons 3184 for centering. Note that the air paths 3181c for locking and the air paths 3181e for centering are not to intersect one another.

The lock-and-free movable part 3182, which has a shape of substantially cylindrical block of which side portion is constricted at the middle area, is maintained with respect to the lock-and-free fixed part 3181 due to the upper portion than the constricted portion, which is received by the hollow space within the lower inward of the lock-and-free fixed part 3181, and due to the constricted portion, which is positioned corresponding to the opening area 3181a, thereby being suppressed from moving in the Z-axis direction and allowed to move in the X-axis and the Y-axis directions and to rotate in the θ rotational direction around the Z-axis.

In addition, the upper portion of the lock-and-free movable part 3182 is formed thereon with two ball reception portions 3182a of which upper surfaces have spherical concave shapes for supporting the balls 3185 for centering. The center of the spherical concave shape of each ball reception portion 3182a is set to be identical with the center line of each piston 3184 for centering at the time of centering.

The pistons 3183 for locking are accommodated in hollow spaces formed in the lock-and-free fixed part 3181, and the lower end surface of each piston 3183 for locking is contacted with the upper surface of the lock-and-free movable part 3182.

In turn, the pistons 3184 for centering are accommodated in hollow spaces formed in the lock-and-free fixed part 3181, and the lower portions thereof contact respective balls 3185 for centering. Each ball 3185 for centering has a substantially spherical shape, and the motion thereof in the X-axis and the Y-axis directions is locked by the lock-and-free fixed part 3181. Thus, the upper portion of the ball 3185 for centering contacts the piston 3184 for centering and the lower portion of the ball 3185 for centering contacts the ball reception portion 3182a of the lock-and-free movable part 3182.

In the case of causing the lock-and-free mechanism 318 to be non-locked, all the pistons, i.e. the two pistons 3183 for locking and the two pistons 3184 for centering are not to be air supplied, and the lock-and-free movable part 3182 are thus allowed to move in a plane with respect to the lock-and-free fixed part 3181.

In the case of causing the lock-and-free mechanism 318 to be locked, the two pistons 3183 for locking are air supplied to fix the lock-and-free movable part 3182 with respect to the lock-and-free fixed part 3181. Note that the two pistons 3184 for centering are not to be air supplied in this case.

In the case of subjecting the lock-and-free mechanism 318 to centering, the two pistons 3183 for locking are stopped to be air supplied to cause the lock-and-free movable part 3182 to be once in the non-locked state, and thereafter the two pistons 3184 for centering are air supplied to press the balls 3185 for centering to follow the concave spherical shapes formed on the upper surfaces of the ball reception portions 3182a thereby causing the balls 3185 for centering to be positioned at the centers of the concave spherical shapes. The operation of the two balls 3185 for centering allows the lock-and-free movable part 3182 to be centered such that the center of the lock-and-free movable part 3182 comes to be identical with that of the lock-and-free fixed part 3181.

Note that the upper end surface of the lock-and-free fixed part 3181 is attached to the lower end surface of the basement-side contact arm 316, while the lower end surface of the lock-and-free movable part 3182 is attached to the upper end surface of the holding-side contact arm 317.

The alignment apparatus 320 is, in the present embodiment, means for causing the holding-side contact arm 317 to move in a plane thereby to position the first socket 319 attached to the holding-side contact arm 317 with respect to an electronic device under test 100, and is also means for positioning the electronic device under test 100 held by the holding-side contact arm 317 with respect to the second socket 301. In the present embodiment, this alignment apparatus 320 is provided on the base table 12 of the handler 10, as shown in FIG. 6.

Also in the present embodiment, one alignment apparatus 320 is assigned to one X-axis direction supporting member 311a (two contact arms 315), and a total of two alignment apparatuses 320 is thus provided in the entirety of the handler 10.

Therefore, while two contact arms 315 supported by one of the X-axis direction supporting member 311a of the YZ moving apparatus 310 execute testing, the remaining two contact arms 315 supported by the other X-axis direction supporting member 311a sequentially perform alignment of two electronic devices under test 100 thereafter to supply the aligned electronic devices under test 100 to the test head 300, thereby enabling the operating rate of the test head 300 to be improved. Note that the number of the alignment apparatuses 320 is not limited to the above number, and may be arbitrarily set depending on the time period required for alignment of electronic devices under test 100, the time period required for testing electronic devices under test 100 and the number of the second sockets and the first sockets etc.

In addition, as will be described in detail for a method of testing electronic device, the alignment apparatus 320 according to the present embodiment is capable of performing both the alignment of the first socket 319 to an electronic device under test 100 and the alignment of the electronic device under test 100 to the second socket 301. Accordingly, the handler 10 may be provided with lower cost compared to the case of providing respective alignment apparatuses required for two types of alignment.

This alignment apparatus 320 has, as shown in FIG. 11, an alignment movable part 321, an alignment movable part driving apparatus 322, an electronic device under test side illumination 327a, a reflecting mirror 327b for alignment, a CCD camera side illumination 327c, and a CCD camera 327. Note that, as shown in FIG. 6, only one alignment movable part 321 and only one alignment movable part driving apparatus 322 are provided, while two CCD cameras 327 are provided depending on the arrangement of the contact arms 315. Also note that, although the electronic device under test side illumination 327a, the reflecting mirror 327b for alignment, and the CCD camera side illumination 327c are omitted to be depicted in the same figure, there are provided respective two ones depending on the two CCD cameras 327. Still also note that the number thereof and the combination thereof may be arbitrarily changed, and thus are not particularly limited.

Each CCD camera 327 and each reflecting mirror 327b for alignment are arranged such that the optical axis OP of the CCD camera 327 (hereinafter also referred to as simply "optical axis OP") is reflected by the reflecting mirror 327b for alignment thereby to be directed toward the Z-axis positive direction. Thus, by providing the reflecting mirror 327b for alignment on the optical axis OP of the CCD camera 327, the CCD camera 327 is enabled to be transversely placed with respect to the XZ plane, thereby suppressing the height of the handler 10 in itself.

In addition, in order to obtain sufficient brightness for visually or imageably recognizing the second device terminals 104 of an electronic device under test 100 or the contact pins 319a of the first socket 319, the electronic device under test side illumination 327a with a circular shape and the CCD camera side illumination 327c also with a circular shape are arranged so as to ensure a imageable recognition coverage where the CCD camera 327 may imageably recognize at least all the second device terminals 104 of the electronic device under test 100 and all the contact pins 319a of the first socket 319 without interrupting the light propagation on the optical axis OP.

The CCD camera 327 arranged in such a manner images the second main surface 103 of an electronic device under test 100 held by the holding-side contact arm 317. This CCD camera 327 also images the first socket 319 attached to the holding-side contact arm 317. Thus, the present embodiment enables the CCD camera 327 to image both the second main surface 103 on an electronic device under test 100 and the first socket 319.

Accordingly, compared with the case of providing a single purpose CCD camera for imaging the second main surface 103 of an electronic device under test 100 and another single purpose CCD camera for imaging the first socket 319, the present embodiment allows the handler 10 to be provided with lower cost, but the present invention is not particularly limited to this. Note that this CCD camera 327 corresponds to one example of each of the third imaging apparatus and the fourth imaging apparatus in the present invention.

The alignment movable part 321 having a first opening area 321a is provided above the electronic device under test side illumination 327a. The first opening area 321a has a size enough to pass an electronic device under test 100 and not to pass the above-described contacting members 317d provided on the edge area of the bottom of each holding-side contact arm 317 of the movable head parts 312. Accordingly, the CCD camera 327 is enabled to imageably recognize all the second device terminals 104 of the electronic device under test 100 and all the contact pins 319a of the first socket 319, in the status where the alignment movable part 321 holds the contact arm 315.

The alignment movable part 321 is connected to a movable plane 323 of the alignment movable part driving apparatus 322 via an alignment movable part supporting member 321b, and is capable of moving in the X-axis and the Y-axis directions and motion of θ rotation around the Z-axis. The alignment movable part 321 is provided with the engaging members 321d, which are formed around the first opening area 321a, to be engaged with the contacting members 317d of the contact arm 315. The upper surface of each engaging member 321d is formed with a recess 321e capable of being engaged with each contacting member 317d. The engagement between these recesses 321e and the top ends of the engaging members 321d allows the contact arm 315 to be positioned with respect to the alignment movable part 321.

A second opening part 321c is provided with the alignment movable part supporting member 321b so as to ensure imageable recognition coverage where the CCD camera 327 may imageably recognize at least all the second device terminals 104 of an electronic device under test 100 and all the contact pins 319a of the first socket 319, without interrupting the light propagation on the optical axis OP. Note that the electronic device under test side illumination 327a, the reflecting mirror 327b for alignment, the CCD camera side illumination 327c, and the CCD camera 327 are supported separately from the alignment movable part 321, the alignment movable part supporting member 321b, and the alignment movable part driving apparatus 322 so as not to move responding to the drive of the alignment movable part driving apparatus 322.

When the holding-side contact arm 317 is pressed to the alignment movable part 321 by the Z-axis direction actuator 313 and the lock-and-free mechanism 318 comes into the non-locked status, the alignment movable part driving apparatus 322 is enabled to cause a planar movement of the holding-side contact arm 317 in the X-axis and the Y-axis directions and of θ rotation around the Z-axis.

The alignment movable part driving apparatus 322 is, as shown in FIG. 6, means for moving the alignment movable part 321 in the X-axis and the Y-axis directions on the XY plane and θ rotating the alignment movable part 321 around the Z-axis, and is provided on the base table 12 of the handler 10.

This alignment movable part driving apparatus 322 has, as shown in FIG. 11 and FIG. 18, the movable plane 323, a first Y-axis direction moving apparatus 324, a second Y-axis direction moving apparatus 325, and an X-axis direction moving apparatus 326. Note that the structure of the alignment movable part driving apparatus 322 is not limited to those as will be described hereinafter.

The movable plane 323 is a plate-like member, and is respectively fixed to the first Y-axis direction moving apparatus 324, the second Y-axis direction moving apparatus 325, and the X-axis direction moving apparatus 326 while supporting the alignment movable part supporting member 321b.

The first Y-axis direction moving apparatus 324 is provided along the Y-axis in the figures, and is an apparatus for moving the alignment movable part 321 in the Y-axis direction via the movable plane 323 and the alignment movable part supporting member 321b.

This first Y-axis direction moving apparatus 324 has, as shown in FIG. 18 and FIG. 19, a motor 324a, a ball screw 324b, a ball nut 324c, a guide 324d, a guide block 324e, an orthogonal guide 324f, an orthogonal guide block 324g, and a rotating support member 324h.

A belt 324i is wound across the shaft of the motor 324a and the ball screw 324b thereby to transmit the driving force of the motor 324a to the ball screw 324b. Alternatively, the driving force of the motor 324a may be transmitted to the ball screw 324b via gears, or the shaft of the motor 324a and the ball screw 324b are jointed to be a same rotating shaft.

Both ends of the ball screw 324*b* are supported by bearing members 324*j* such that the ball screw 324*b* is rotatable. In addition, the ball nut 324*c* is screwed with this ball screw 324*b*. Accordingly, if the ball screw 324*b* is rotated by the driving force of the motor 324*a*, the ball nut 324*c* moves along the axis direction of the ball screw 324*b*.

The guide 324*d* is a rail-like member provided parallel to the ball screw 324*b*. The guide block 324*e* is movably provided on this guide 324*d*. The guide block 324*e* is joined with the ball nut 324*c* and thus moves with the ball nut 324*c*.

The orthogonal guide 324*f* is also rail-like member along the direction orthogonal to the guide 324*d*, and is fixed on the guide block 324*e*. The orthogonal guide block 324*g* is provided on the orthogonal guide 324*f* so as to be movable along the longitude direction of the orthogonal guide 324*f* (the direction orthogonal to the guide 324*d*).

The rotating support member 324*h* is supported by the orthogonal guide 324*f* so as to be rotatable around the Z-axis as the rotating axis in the status where the upper end of the rotating support member 324*h* is fixed to the movable plane 323.

The first Y-axis direction moving apparatus 324 according to the present embodiment allows the movable plane 323 to move to any position along the Y-axis direction by the motor 324*a*, the ball screw 324*b* and the ball nut 324*c*, while allowing the movable plane 323 to freely slide in the X-axis direction by the orthogonal guide 324*f* and the orthogonal guide block 324*g* and also allowing for the free rotational motion of the movable plane 323 around the Z-axis by the rotating support member 324*h*.

The second Y-axis direction moving apparatus 325 is, as shown in FIG. 18, provided parallel to the first Y-axis direction moving apparatus 324 with a sufficient space therebetween. This second Y-axis direction moving apparatus 325 has the identical structure with the first Y-axis direction moving apparatus 324, i.e. a motor 325*a*, a ball screw, a ball nut, a guide, a guide block, an orthogonal guide, an orthogonal guide block, and a rotating support member.

That is, the second Y-axis direction moving apparatus 325 also allows the movable plane 323 to move to any position along the Y-axis direction by the motor 325*a*, the ball screw and the ball nut, while allowing the movable plane 323 to freely slide in the X-axis direction by the orthogonal guide and the orthogonal guide block and also allowing for the free rotational motion of the movable plane 323 around the Z-axis by the rotating support member.

The X-axis direction moving apparatus 326 is, as shown in FIG. 18, provided along the X-axis direction between the first and the second Y-axis direction moving apparatuses 324 and 325. This X-axis direction moving apparatus 326 also has the identical structure with the first Y-axis direction moving apparatus 324, i.e. a motor 326*a*, a ball screw, a ball nut, a guide, a guide block, an orthogonal guide, an orthogonal guide block, and a rotating support member.

That is, the X-axis direction moving apparatus 326 also allows the movable plane 323 to move to any position along the X-axis direction by the motor 326*a*, the ball screw and the ball nut, while allowing the movable plane 323 to freely slide in the Y-axis direction by the orthogonal guide and the orthogonal guide block and also allowing for the free rotational motion of the movable plane 323 around the Z-axis by the rotating support member.

In the alignment movable part driving apparatus 322 according to the present embodiment, if it is required to move the alignment movable part 321 via the movable plane 323 along the Y-axis direction, then the motors 324*a* and 325*a* of the first and the second Y-axis direction moving apparatuses 324 and 325 will be rotated in the same direction. Moreover, if it is required to move the alignment movable part 321 via the movable plane 323 along the X-axis direction, then the motor 326*a* of the X-axis direction moving apparatus 326 will be rotated.

Furthermore, if it is required to perform a rotational motion of the alignment movable part 321 around the Z-axis, then the motor 324*a* of the first Y-axis direction moving apparatus 324 and the motor 325*a* of the second Y-axis direction moving apparatus 325 will be rotated in different directions from each other, and the motor 326*a* of the X-axis direction moving apparatus 326 is also rotated.

Hereinafter, the block diagram shown in FIG. 20 of a system for alignment of an electronic device under test 100 by CCD cameras 312*b*, 327, and 505 will be described. The system is primarily comprised of the CCD cameras 312*b*, 327, and 505, the image processing apparatus 70, a controlling apparatus 80 for YZ moving apparatus, which controls the YZ moving apparatus 310, and a controlling apparatus 90 for movable part driving apparatus, which controls the alignment movable part driving apparatus 322.

The CCD cameras 312*b*, 327, and 505 are connected with the image processing apparatus 70 so as to transmit picked up image information thereto. The image processing apparatus 70 is means for performing image processing to the picked up image information by the CCD camera 312*b* and 327, recognizing the positions of the contact pins 302 and 319*a* on the basis of the sockets 301 and 319 within the image, and calculating alignment amounts (a first and a second relative positions as will be described later) of the first socket 319 and the electronic device under test 100.

A first contact pins extraction part 71 of the image processing apparatus 70 performs an image processing for extracting positions of the contact pins 319*a* from image information of the first socket 319 having been imaged and transmitted by the CCD camera 327. This allows the position and the attitude of the first socket 319 to be recognized even though the first socket 319 has been replaced depending on the change in type of the electronic device under test 100 and the like. Similarly, a second contact pins extraction part 74 performs an image processing for extracting positions of the contact pins 302 from image information of the second socket 301 having been imaged and transmitted by the CCD camera 312*b*. This allows the position and the attitude of the second socket 301 to be recognized even though the second socket 301 has been replaced depending on the change in type of the electronic device under test 100 and the like.

A first device terminals extraction part 72 of the image processing apparatus 70 performs an image processing for image information having been imaged and transmitted by the CCD camera 505 with respect to an electronic device under test 100, and extracts the positions of the first device terminals 102 of the electronic device under test 100 within the image. Similarly, a second device terminals extraction part 75 performs an image processing for image information having been imaged and transmitted by the CCD camera 327 with respect to the electronic device under test 100, and extracts the positions of the second device terminals 104 of the electronic device under test 100 within the image.

A first calculation part 73 of the image processing apparatus 70 compares the positions of the contact pins 319*a* of the first socket 319 with the positions of the first device terminals 102 of the electronic device under test 100 thereby to calculate a first relative position of the first socket 319 with respect to the electronic device under test 100.

On the other hand, a second calculation part 76 compares the positions of the contact pins 302 of the second socket 301 with the positions of the second device terminals 104 of the electronic device under test 100 thereby to calculate a second relative position of the second socket 301 with respect to the electronic device under test 100.

The image processing apparatus 70 is, as shown in 20, connected with the controlling apparatus 80 for YZ moving apparatus and the controlling apparatus 90 for movable part driving apparatus so as to be capable of transmitting and receiving various types of signals and the like thereto and therefrom, and transmits information for the calculated relative positions to the controlling apparatus 90 for movable part driving apparatus. The controlling apparatus 90 for movable part driving apparatus performs control of the motors 324a, 325a, and 326a to complete the positional alignment of the first socket 319 or the electronic device under test 100.

Here, in the image processing apparatus 70, the coordinate systems on the images imaged by the CCD cameras 312b, 327, and 505 are caused to correspond to one another by calibrations between the camera 312b, 327, and 505.

One example of a specific method of calibration may include the steps of preparing a transparent gauge having depicted thereon with X coordinate axis and Y coordinate axis, handling the gauge within the handler 10 likewise as the electronic device under test 100, imaging the gauge by each of the CCD cameras 312b, 327, and 505 thereafter image processing, and using the XY coordinate axes of the gauge for calibration as standard X-Y coordinate systems among the CCD cameras 312b, 327, and 505.

Particularly for the calibration between the CCD cameras 312b and 327, as shown in FIG. 21, an imaging jig 304 positioned with respect to the second socket 301 may be used in such a manner where the suction pad 317c of the contact arm 315 adsorbs and holds the imaging jig 304, the CCD camera 327 images the imaging jig 304, and standard X-Y coordinates for the CCD cameras 312b and 327 are made up based on image information of the imaging jig 304 and image information of the second socket 301 imaged by the CCD camera 312b.

<Unloader Part 60>

The unloader part 60, which is means for ejecting electronic devices under test 100 having completed to be tested from the test part 30 to the IC storage part 40, has an unloader pick-and-place 601, two buffer parts 602 for unloader, a buffer pick-and-place 604, an exit stage 605, and unsoak plate 606, as shown in FIG. 1.

Each of the buffer parts 602 for unloader is means for moving the electronic devices under test 100 from the working area of YZ moving apparatus 310 to the working area of the buffer pick-and-place 604. The buffer part 602 for unloader has a movable part 602a and an X-axis direction actuator 602b.

The X-axis direction actuator 602b is fixed onto the base table 12 of the handler 10. The movable part 602a is supported at the end portion of this X-axis direction actuator 602b. In addition, the upper surface of the movable part 602a is formed therein with two recesses 602c for accommodating electronic devices under test 100.

The YZ moving apparatus 310 puts down the electronic devices under test 100 having completed to be tested into the recesses 602c of the movable part 602a of the buffer part 602 for unloader, which has been moved into the working area of the YZ moving apparatus 310. Thereafter, the buffer part 602 for unloader shortens the X-axis direction actuator 602b to move the movable part 602a into the working area of the buffer pick-and-place 604. Alternatively, without providing the recesses 602c on the movable part 602a, the surface of the movable part 602a may be formed, for example, as a flat surface provided with suction pads of which suction faces are orientated upward in the vertical direction.

The buffer pick-and-place 604, which is means for moving the electronic devices under test 100 accommodated in the movable part 602a of the buffer part 602 for unloader to the exit stage 605, has two Y-axis direction rails 604a, an X-axis direction supporting member 604b, and a movable head 604c thereby to have a working area across the buffer parts 602 for unloader to the exit stage 605.

The two Y-axis direction rails 604a of the buffer pick-and-place 604 are provided on the base table 12 of the handler 10, and the X-axis direction supporting member 604b is supported above these two Y-axis direction rails 604a so as to be movable in the Y-axis direction. The lower portion of this X-axis direction supporting member 604b is fixed thereon with the movable head part 604c having a Z-axis direction actuator (not shown). In addition, the movable head part 604c, which has four suction pads 604d on the lower end portion thereof, moves the four suction pads 604d up-and-down in the Z-axis direction by driving the provided Z-axis direction actuator.

As described above, by providing the buffer parts 602 for unloader and the buffer pick-and-place 604, the YZ moving apparatus 310 and the unloader pick-and-place 601 are enabled to concurrently operate without any interference therebetween.

The exit stage 605 is means for receiving four electronic devices under test 100 from the buffer pick-and-place 604 thereafter to pass them to the unloader pick-and-place 601, and the exit stage 605 is placed at an area where the working area of the buffer pick-and-place 604 and the working area of the unloader pick-and-place 601 are overlapped. The exit stage 605 is formed thereon with four recesses 605a capable of accommodating the electronic devices under test 100.

The unsoak plate 606, which is provided therein with a heater, heats the electronic devices under test 100 having been tested under a cooled status to suppress the occurrence of dew condensation on the electronic devices under test 100. Also the unsoak plate 606 is formed thereon with four recesses 606a for accommodating electronic devices under test.

The unloader pick-and-place 601, which is means for carrying electronic devices under test 100 from the exit stage 605 to a classification tray within the stocker 402 for classification trays, primarily has two Y-axis direction rails 601a, an X-axis direction rail 601b, and a movable head part 601c, and also has the working area involving the exit stage 605 and the stockers 402 for classification trays.

The two Y-axis direction rails 601a of the unloader pick-and-place 601 are provided on the base table 12 of the handler 10, and the X-axis direction rail 601b is supported between the Y-axis direction rails 601a so as to be movable in the Y-axis direction. The X-axis direction rail 601b supports the movable head part 601c provided thereon with the Z-axis direction actuator (not shown) such that the movable head part 601c is movable in the X-axis direction. Furthermore, the movable head part 601c has four suction pads 601d at the lower end portion thereof, and moves the four suction pads 601d up-and-down in the Z-axis direction by driving the provided Z-axis direction actuator.

As described above, in the electronic device test apparatus 1 according to the present embodiment, the handler 10 is enabled to test electronic devices under test 100 having device terminals 102 and 104 on both surfaces.

In addition, the handler 10 according to the present embodiment comprises the CCD cameras 312b, 327, and 505, the image processing apparatus 70, and the alignment apparatus 320, and thus this alignment apparatus 320 performs, based on the commands from the image processing apparatus 70, the positioning of the first socket 319 with respect to an electronic device under test 100 and the positioning of the electronic device under test 100 with respect to the second socket 301. Accordingly, even in the case of testing electronic devices under test 100 with device terminals 102 and 104 provided on both surfaces thereof, the occurrence frequency of miss contacts may be reduced between the device terminals 102 and 104 and the contact pins 302 and 319a of the sockets 301 and 319. The above advantageous effect is significant particularly in the case where the device terminals 102 and 104 are arranged with small pitches.

Note that, although in the present embodiment the CCD camera 505 is attached to the Y-axis direction rail 504a of the buffer pick-and-place 504 via the fixing arm 505a in order to image the first main surface 101 of an electronic device under test 100, the CCD camera 312b of the YZ moving apparatus 310 may alternatively be used for imaging the first main surface 101 of an electronic device under test 100 without providing the CCD camera 505. This allows the handler 10 to be provided with lower cost because of no need for providing the CCD camera 505.

Moreover, the contact arm 315 according to the present embodiment has the basement-side contact arm 316 fixed to the YZ moving apparatus 310, the holding-side contact arm 317 to which the first socket 319 is attached, and the lock-and-free mechanism 318 for causing the planar movement of the holding-side contact arm 317 relatively to the basement-side contact arm 316 to be locked or non-locked. Furthermore, this holding-side contact arm 317 has the suction pad 317c for adsorbing an electronic device under test 100.

Accordingly in the present embodiment, when the suction pad 317c adsorbs an electronic device under test 100, the contact status is maintained between the first socket 319 and the electronic device under test 100. In this status, if the lock-and-free mechanism 318 is caused to be non-locked, then the first socket 319 and the electronic device under test 100 are enabled to integrally move in a plane. This suppresses the electronic device under test 100 from missing the positioning with respect to the first socket 319 even at the time of performing alignment of the electronic device under test 100 to the second socket 301, thereby allowing the occurrence frequency of miss contacts to be reduced for electronic devices under test with device terminals provided on both surface thereof.

In addition, the present embodiment performs the alignment of the first socket 319 and an electronic device under test 100 such that the lock-and-free mechanism 318 allows the holding-side contact arm 317 to move in a plane, and the holding-side contact arm 317 is moved by the alignment apparatus 320 fixed relatively to the base table 12 of the handler 10. More specifically, according to the present embodiment, because the contact arm 315 is required to have no driving part in itself, the contact arm 315 may be provided with lightweight. This allows the YZ moving apparatus 310 to move fast thereby reducing the carrying time of electronic devices under test 100, and the efficiency of testing may thus be improved.

Hereinafter, an electronic device test method according to the present embodiment will be described.

Figure 22:
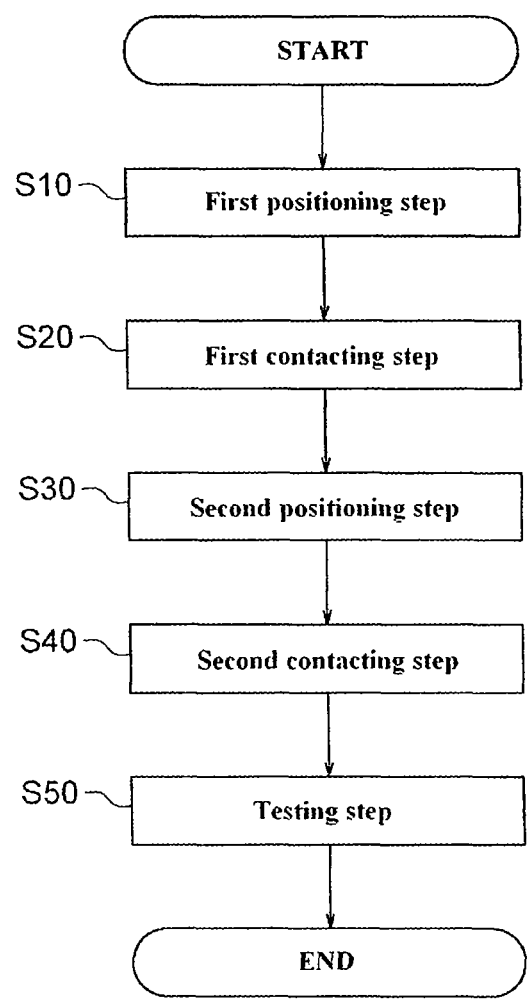
FIG. 22 is a flowchart illustrating the electronic device test method according to the first embodiment of the present invention.
Figure 23:
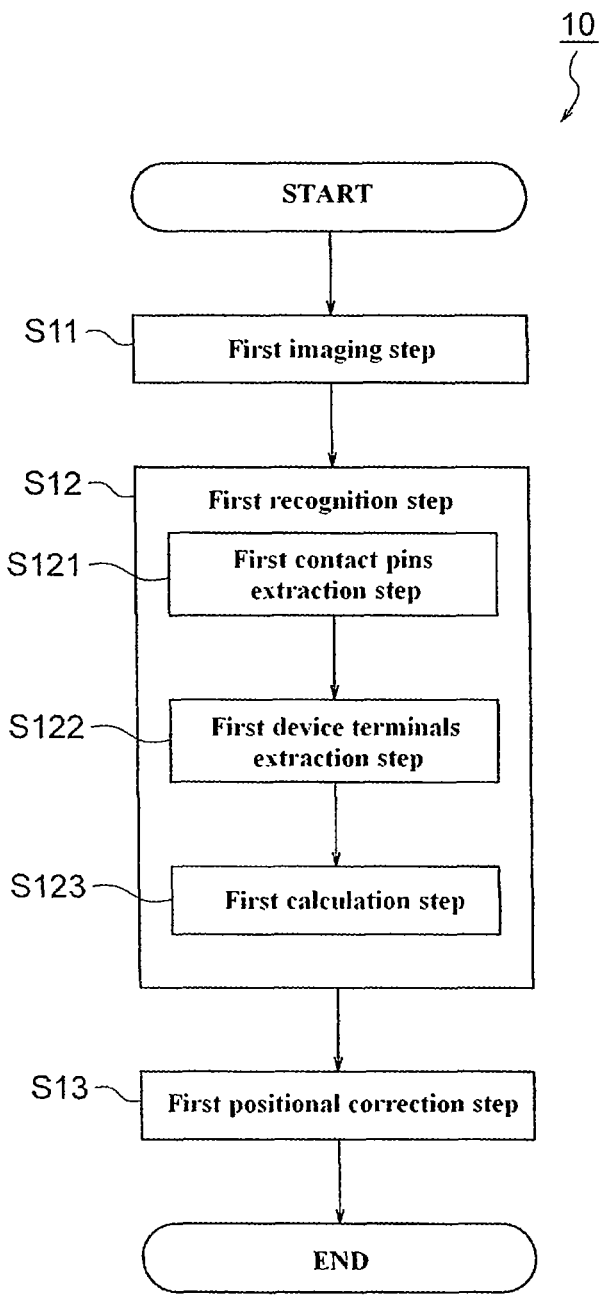
FIG. 23 is a flowchart illustrating a first positioning step of FIG. 22.
Figure 24:
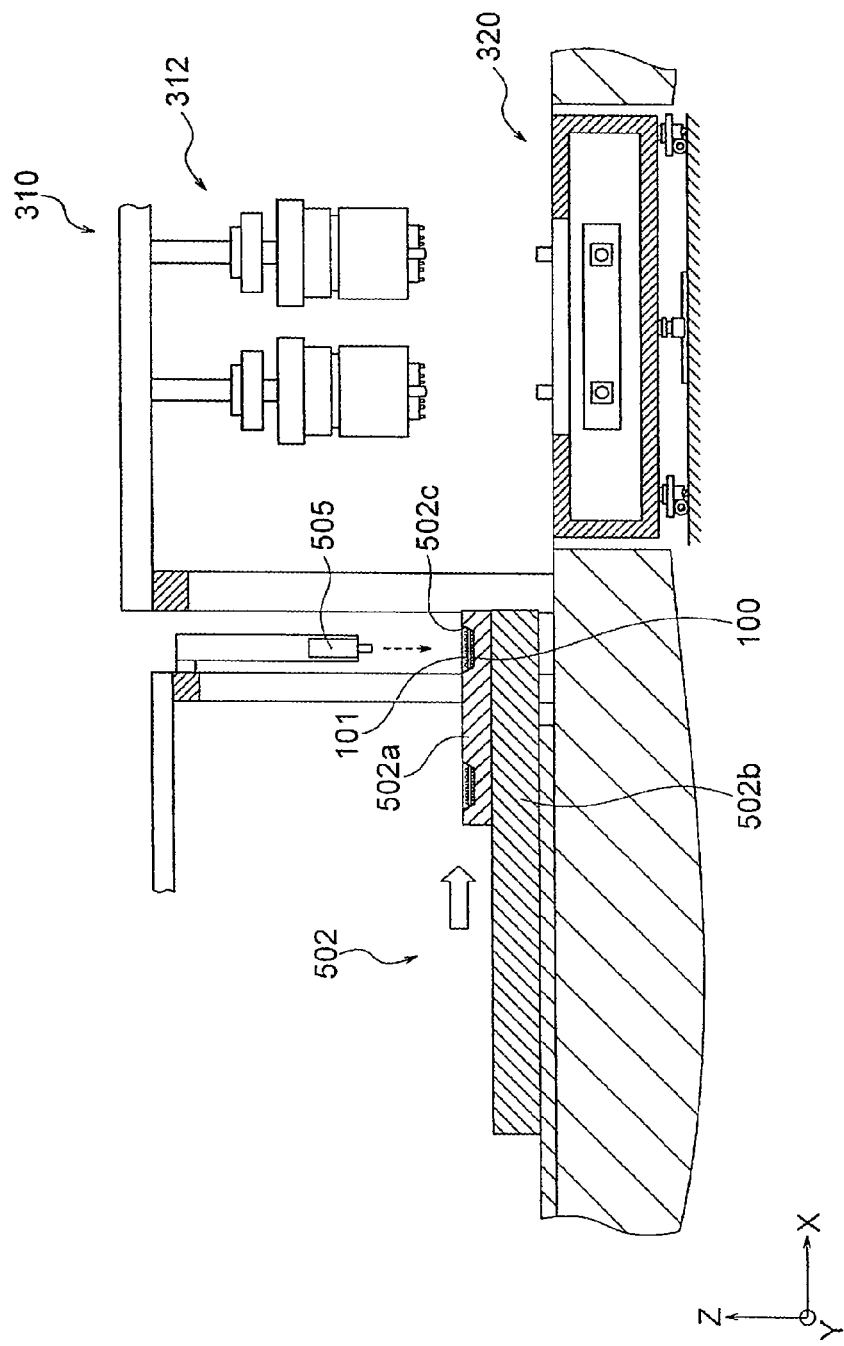
FIG. 24 is a cross sectional view (part 1) illustrating a first imaging step of FIG. 23.
Figure 25:
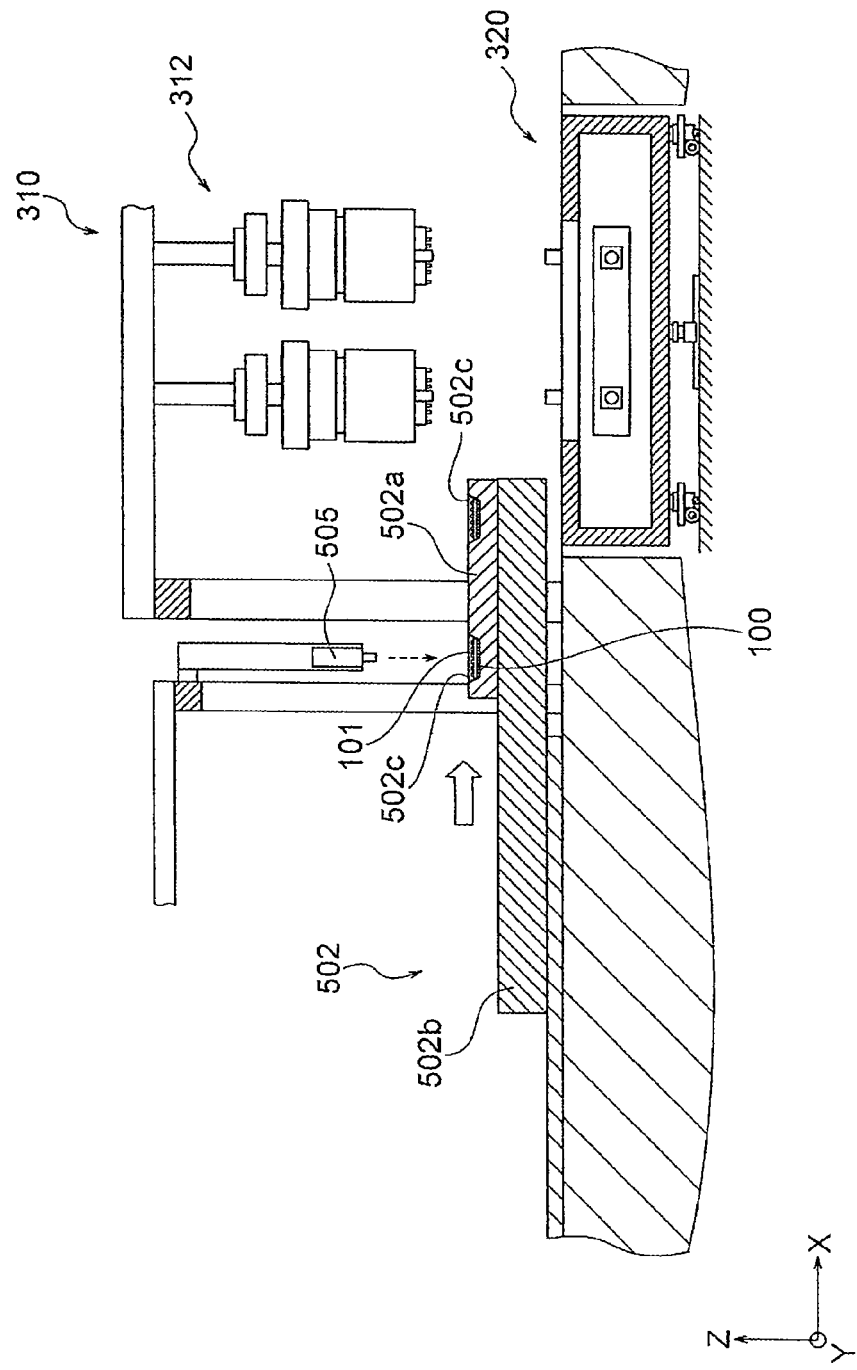
FIG. 25 is a cross sectional view (part 2) illustrating the first imaging step of FIG. 23.
Figure 26:
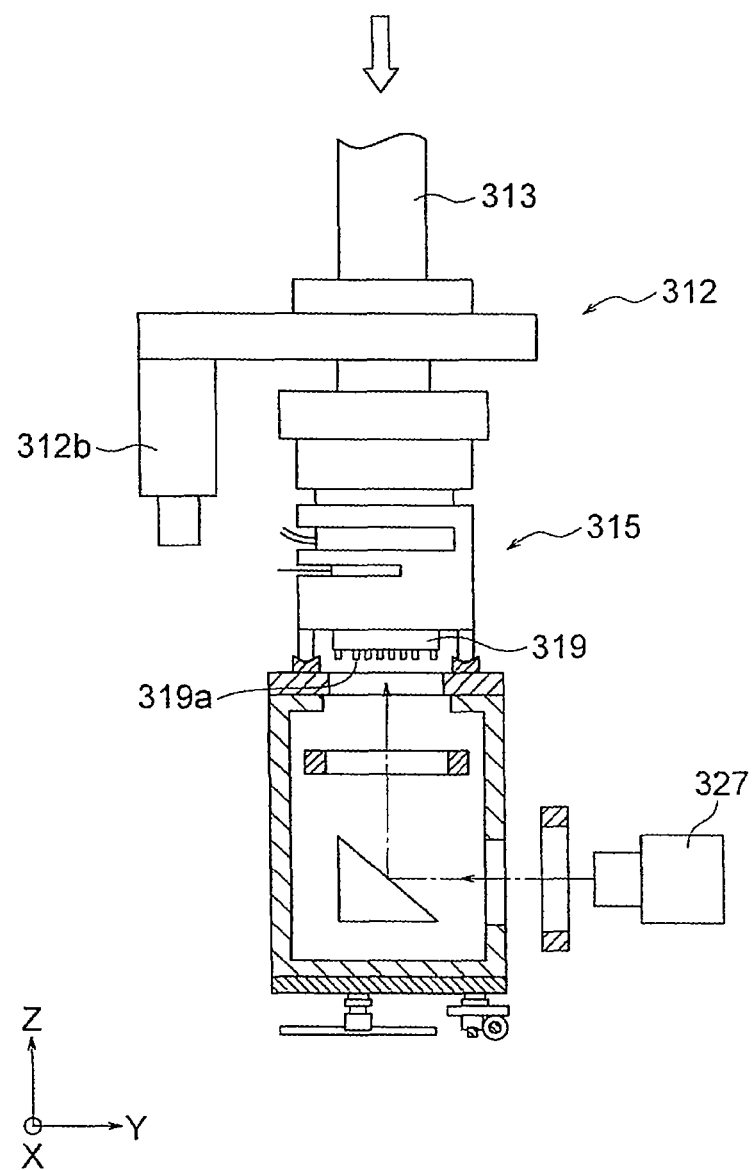
FIG. 26 is a schematic cross sectional view illustrating a third imaging step according to the first embodiment of the present invention.
Figure 27:
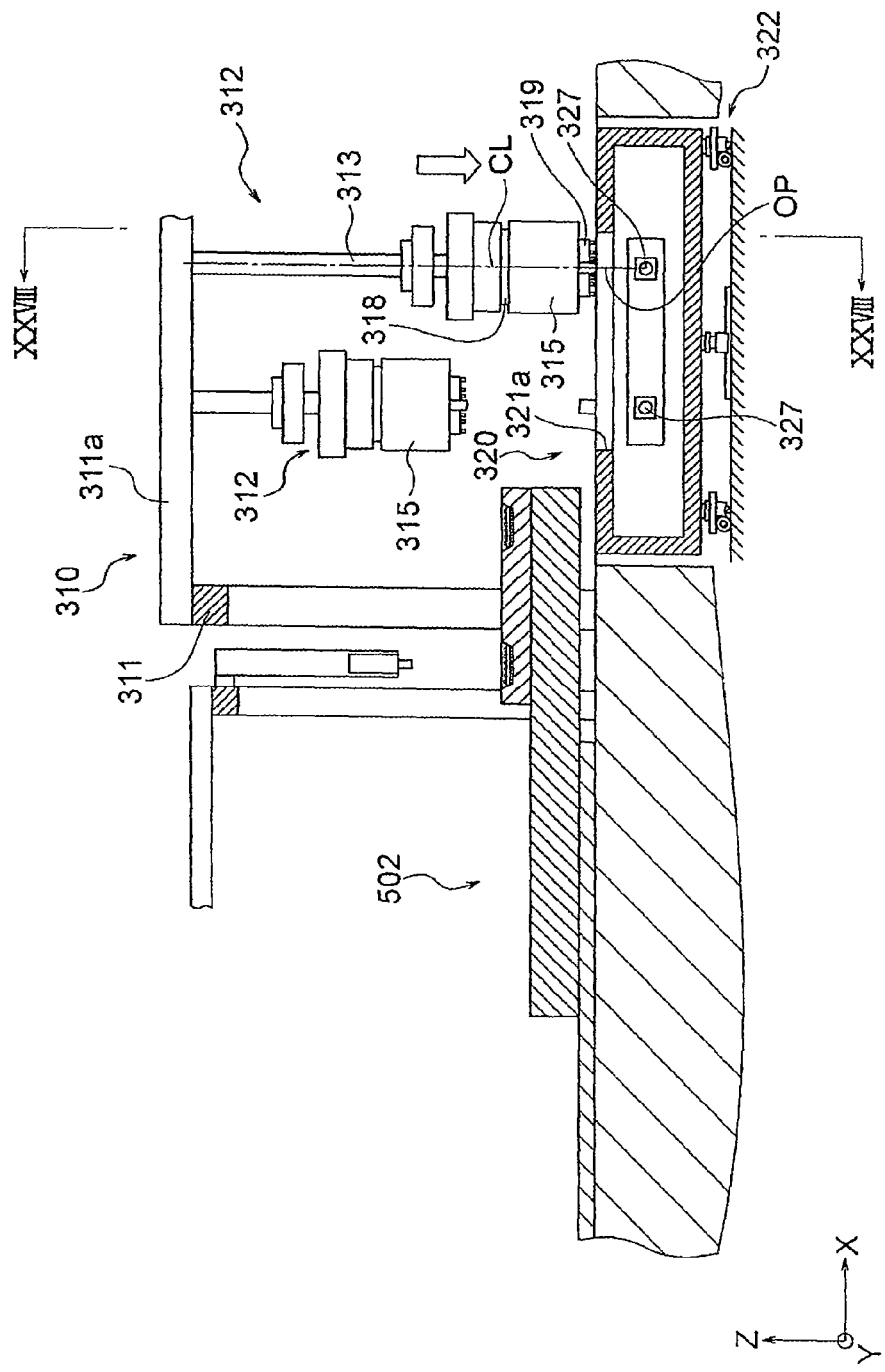
FIG. 27 is a cross sectional view illustrating a first positional correction step of FIG. 23.
Figure 28:
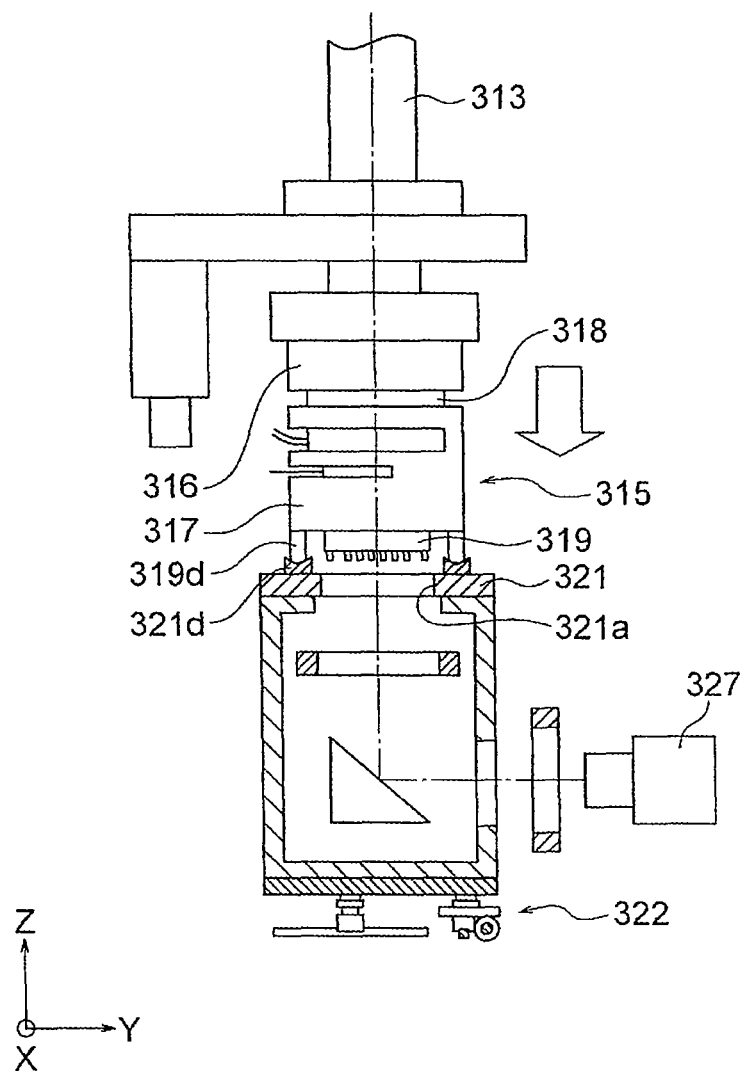
FIG. 28 is a schematic cross sectional view along the line XXVIII-XXVIII of FIG. 27.

FIG. 22 is a flowchart illustrating the electronic device test method according to the present embodiment, FIG. 23 is a flowchart illustrating a first positioning step of FIG. 22, FIG. 24 and FIG. 25 are cross sectional views illustrating a first imaging step of FIG. 23, FIG. 26 is a schematic cross sectional view illustrating a third imaging step according to the present embodiment, FIG. 27 is a cross sectional view illustrating a first positional correction step of FIG. 23, and FIG. 28 is a schematic cross sectional view along the line XXVIII-XXVIII of FIG. 27.

As shown in FIG. 22, the electronic device test method according to the present embodiment comprises a first positioning step S10, a first contacting step S20, a second positioning step S30, a second contacting step S40, and a testing step S50.

The first positioning step S10 includes, as shown in FIG. 23, a first imaging step S11, a first recognition step S12, and a first positional correction step S13.

In the first imaging step S11, as shown in FIG. 24, the X-axis direction actuator 502b of the buffer part 502 for loader is caused to expand, and the first main surface 101 of the electronic device under test 100 accommodated in the recess 502c located with the X-axis positive direction in the figures within the movable part 502a is positioned on the optical axis of the CCD camera 505. Then, the X-axis direction actuator 502b is once stopped, and the CCD camera 505 images the first main surface 101 of this electronic device under test 100.

Thereafter, as shown in FIG. 25, the X-axis direction actuator 502b of the buffer part 502 for loader is caused to further expand, and the electronic device under test 100 accommodated in the recess 502c located with the X-axis negative direction in the figures within the movable part 502a is positioned on the optical axis of the CCD camera 505. Then, similarly as the above, the CCD camera 505 images the first main surface 101 of the electronic device under test 100.

Image information of the electronic device under test 100 thus imaged by the CCD camera 505 is transmitted to the image processing apparatus 70.

Then in the first recognition step S12, the positions of the contact pins 319a of the first socket 319 and the positions of the first device terminals 102 of the electronic device under test 100 are extracted and used for calculating relative positions thereof. This first recognition step S12 includes, as shown in FIG. 23, a first contact pins extraction step S121 (a first socket terminals extraction step), a first device terminals extraction step S122, and a first calculation step S123.

Here, at least prior to execution of the first recognition step S12, as shown in FIG. 26, the CCD camera 327 images the first socket 319, and image information regarding the first socket 319 is transmitted to the image processing apparatus 70 (a third imaging step). Note that this third imaging step is sufficient to be performed, for example, when the socket 319 is replaced due to the change in the type of electronic devices under test 100 etc, and may not be performed for every testing of electronic devices under test 100.

In the first contact pins extraction step S121, the image processing apparatus 70 receives image information regarding the first socket 319, and the first contact pins extraction part 71 of the image processing apparatus 70 extracts positions of the contact pins 319a from image information regarding the first socket 319. Note that this first contact pins extraction step S121 is sufficient to be performed one time when the above third imaging step has been done, and may not be performed for every testing of electronic devices under test 100. Also note that, as shown in FIG. 14, if the alignment marks 319e are provided on the first socket 319, a first marks extraction step may be employed for extracting these alignment marks 319e as substitute for the first contact pins extraction step S121.

In the first device terminals extraction step S122, the image processing apparatus 70 receives image information regarding the first main surface 101 of the electronic device under test 100, and the first device terminals extraction part 72 of the image processing apparatus 70 extracts positions of the first device terminals 102 from image information regarding the electronic device under test 100 imaged by the above CCD camera 505.

Then in the first calculation step S123, the first calculation part 73 of the image processing apparatus 70 compares the positions of the contact pins 319a and the positions of the first device terminals 102 with one another thereby to calculate a first relative position of the first socket 319 with respect to the electronic device under test 100. Note that, if the first marks extraction step is provided, then the positions of the alignment marks 319e and the positions of the first device terminals 102 may be compared thereby to be used for calculating the first relative position of the first socket 319 with respect to the electronic device under test 100.

In the first positional correction step S13, based on the first relative position recognized in the first recognition step S12, the position of the first socket 319 attached to the contact arm 315 is corrected.

Initially, the X-axis direction supporting member 311a of the YZ moving apparatus 310 is moved on the Y-axis direction rails 311, and the first socket 319 is thus positioned above the first opening area 321a of the alignment apparatus 320.

Thereafter, as shown in FIG. 27 and FIG. 28, the Z-axis direction actuator 313 causes the contact arm 315 to move downward and applies a predetermined pressure to the contact arm 315 while causing the contacting member 317d of the contact arm 315 to be engaged with the engaging members 321d of the alignment movable part 321.

Subsequently, the image processing apparatus 70 sends a command to the controlling apparatus 80 for YZ moving apparatus, the command causing the lock-and-free mechanism 318 to be in the non-locked status. This allows the holding-side contact arm 317 to be movable in a plane relatively to the basement-side contact arm 316. Note that, in order for the engaging members 321d of the alignment movable part 321 and the contacting member 317d of the contact arm 315 to be readily engaged, the lock-and-free mechanism 318 may be caused to be in the non-locked status before those engagements.

Then, after causing the lock-and-free mechanism 318 to be in the non-locked status, the image processing apparatus 70 transmits, to the controlling apparatus 90 for movable part driving apparatus, information regarding the first relative position calculated in the first recognition step S12. The controlling apparatus 90 for movable part driving apparatus, after having received information regarding the first relative position, drives the motors 324a, 325a, and 326a of the alignment movable part driving apparatus 322 to compensate for the first relative position thereby performing the alignment of the first socket 319. The controlling apparatus 90 for movable part driving apparatus, after completing those drives, transmits a completion signal thereof to the image processing apparatus 70.

After that, the image processing apparatus 70 having received the completion signal compares again the position and the attitude of the electronic device under test 100 and those of the first socket 319, and if these are determined to fail to be coincident, the image processing apparatus 70 calculates a first relative position of the first socket 319 with respect to the electronic device under test 100 and transmits the first relative position to the alignment apparatus 320.

The image processing apparatus 70, after having confirmed that the position and the attitude of the electronic device under test 100 and those of the first socket 319 are coincident, transmits a command to the controlling apparatus 80 for YZ moving apparatus, the command causing the lock-and-free mechanism 318 to be in the locked status. The controlling apparatus 80 for YZ moving apparatus, after having received the command, performs, based on the command, a control to supply air to the pistons 3183 for locking of the lock-and-free mechanism 318, thereby causing the lock-and-free mechanism 318 to be in the locked status. This allows the alignment of the first socket 319 placed with the X-axis positive direction in FIG. 27 (the first positional correction step S13) to be completed. After completing the alignment, the contact arm 315 is moved upward by the Z-axis direction actuator 313.

Subsequently, in a similar manner, the position of another first socket 319 placed with the X-axis negative direction in FIG. 27 is aligned. After completing the alignment, the contact arm 315 is moved upward by the Z-axis direction actuator 313.

Hereinafter, the first contacting step S20 will be described.

Figure 29:
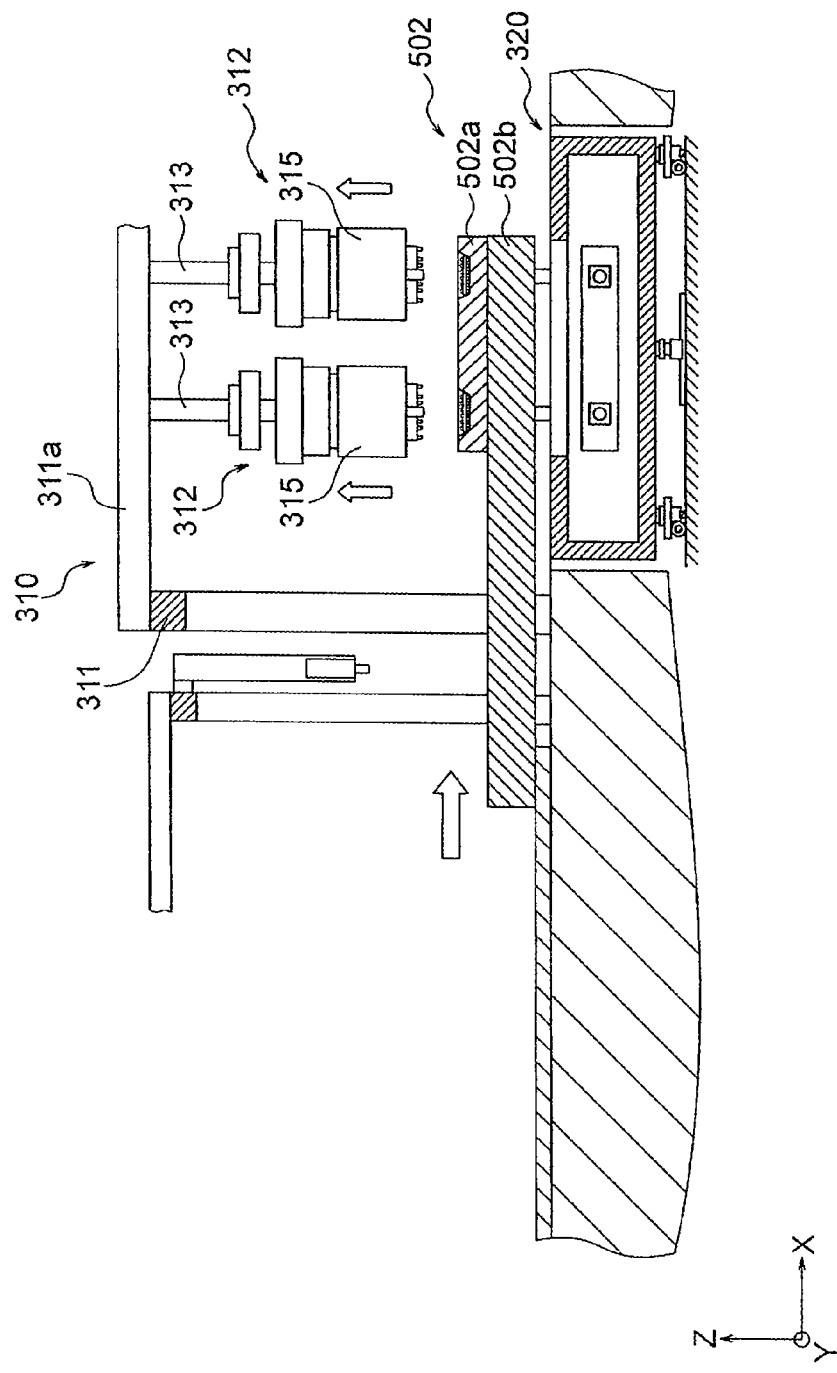
FIG. 29 is a cross sectional view (part 1) illustrating a first contacting step of FIG. 22.
Figure 30:
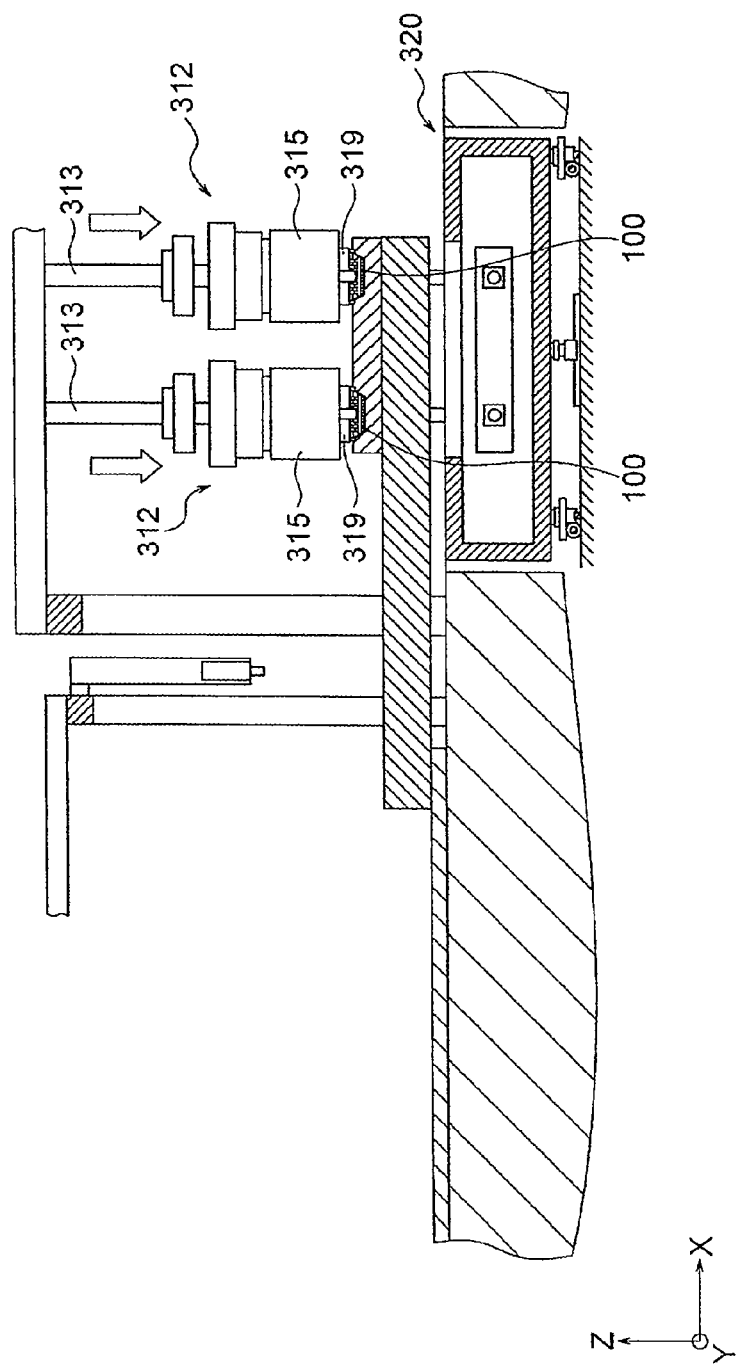
FIG. 30 is a cross sectional view (part 2) illustrating the first contacting step of FIG. 22.
Figure 31:
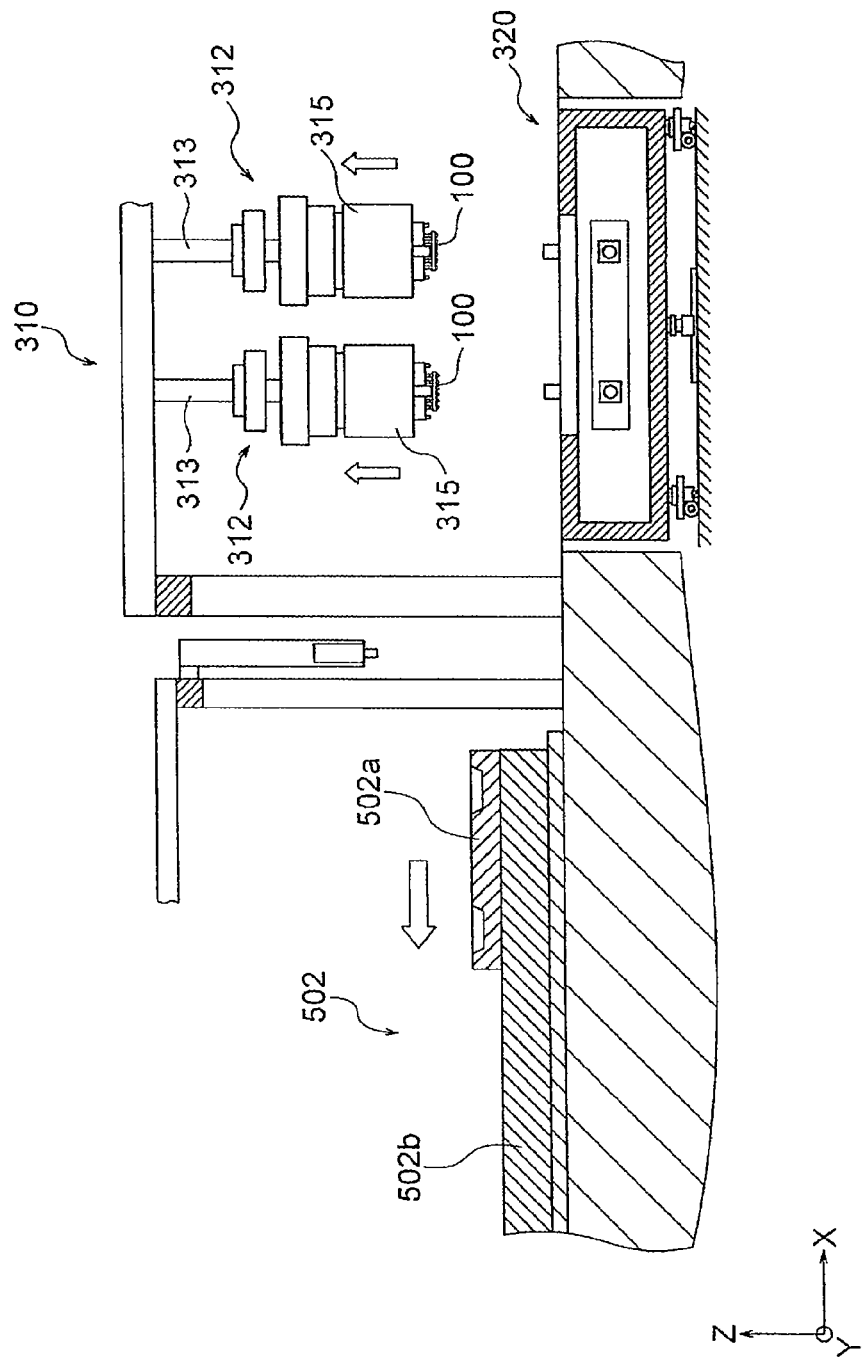
FIG. 31 is a cross sectional view (part 3) illustrating the first contacting step of FIG. 22.

FIG. 29 to FIG. 31 are cross sectional views illustrating the first contacting step in FIG. 22.

As shown in FIG. 29, the X-axis direction actuator 502b of the buffer part 502 for loader is caused to expand, and the movable part 502a is moved to a receiving position where the contact arms 315 are capable of receiving the electronic devices under test 100.

On the other hand, the YZ moving apparatus 310 causes the X-axis direction supporting member 311a to move on the Y-axis direction rails 311, and positions the contact arms 315 above that receiving position.

Thereafter, as shown in FIG. 30, the two contact arms 315 are moved downward by the Z-axis direction actuator 313, and the first socket 319 attached to each contact arm 315 is thus caused to contact each electronic device under test 100. As the first sockets 319 have already been aligned, the contact pins 319a of the first sockets 319 and the first device terminals 102 of the electronic devices under test 100 are contacted with one another (refer to FIG. 37). In this status, the vacuum pump not particularly illustrated is caused to operate such that the suction pads 317c of the contact arms 315 adsorb the first main surfaces 101 (the center areas 101b) of the electronic devices under test 100, and the contact arms 315 thus hold the electronic devices under test 100.

Subsequently, as shown in FIG. 31, the two contact arms 315 are moved upward by respective two Z-axis direction actuators 313. Then, the X-axis direction actuator 502b of the buffer part 502 for loader is moved toward the X-axis negative direction in the figures to evacuate the movable part 502a of the buffer part 502 for loader out of the working area of the YZ moving apparatus 310.

The second positioning step S30 in FIG. 22 will now be described.

Figure 32:
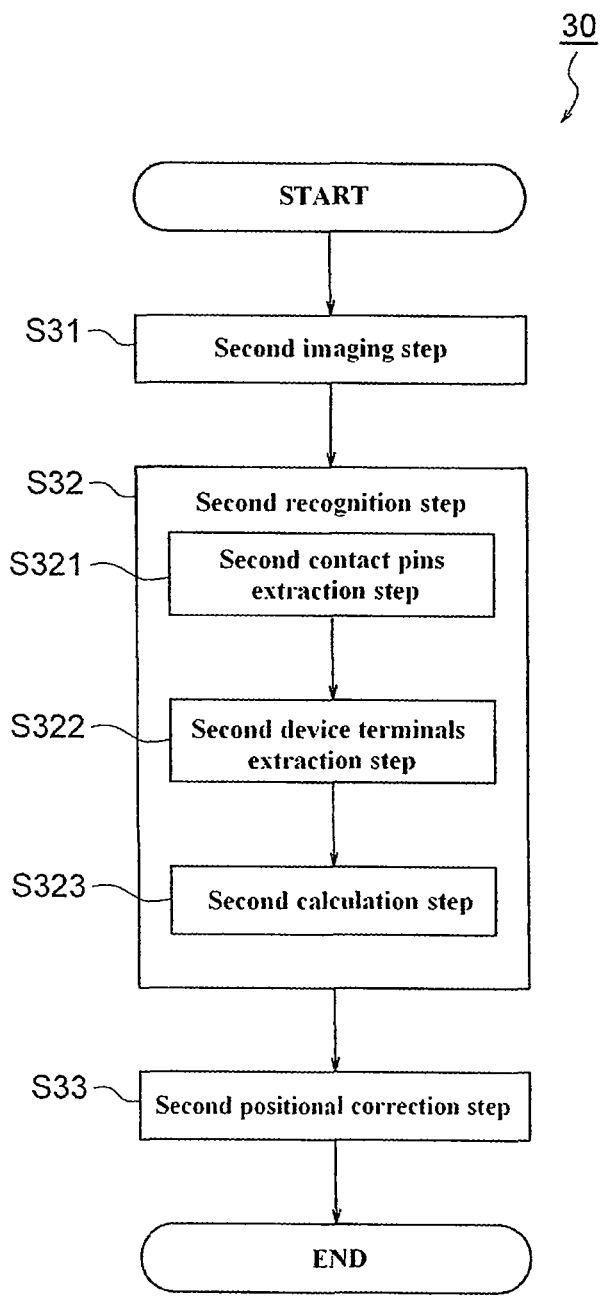
FIG. 32 is a flowchart illustrating a second positioning step of FIG. 22.
Figure 33:
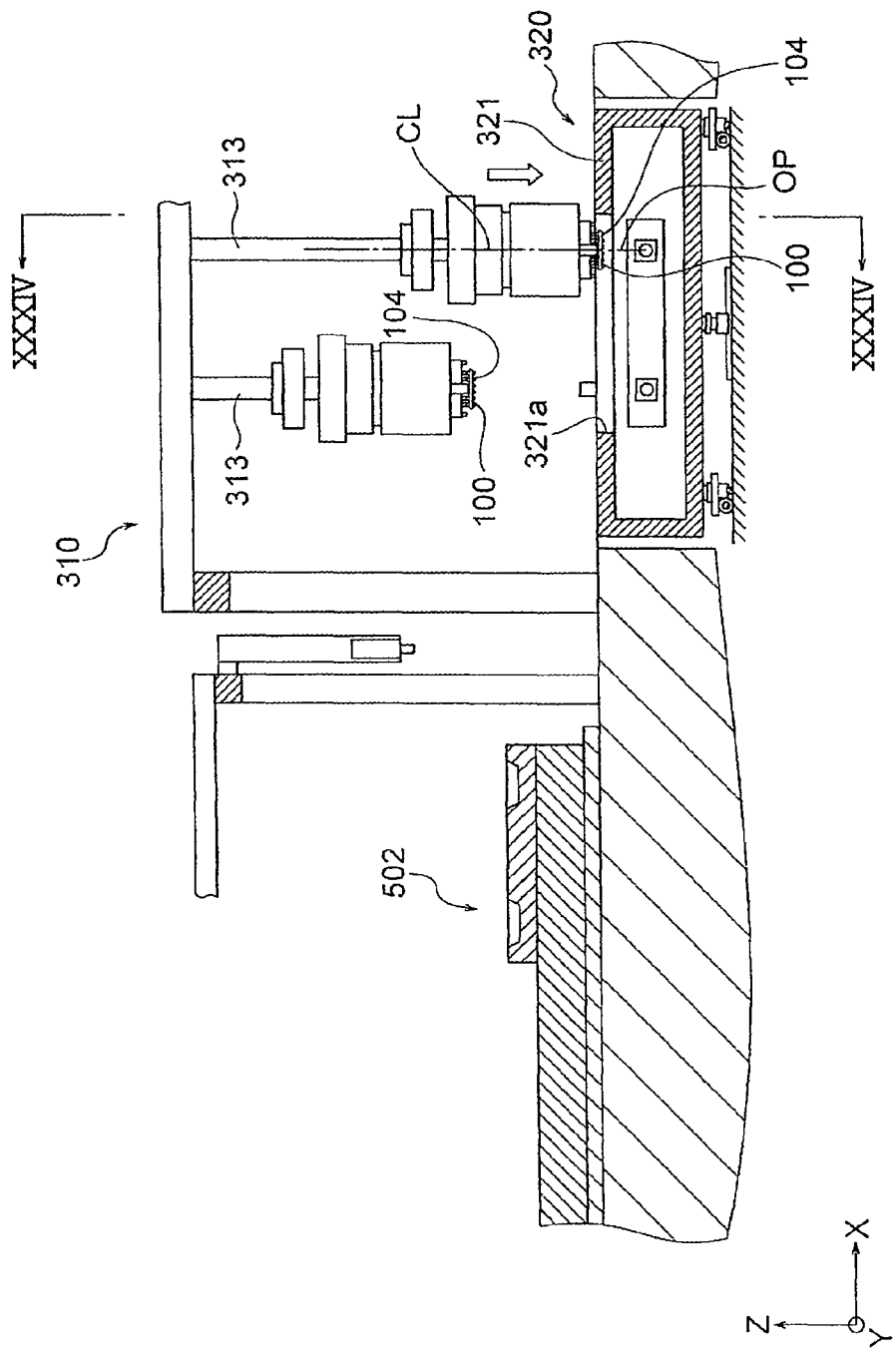
FIG. 33 is a cross sectional view illustrating the second positioning step of FIG. 22.
Figure 34:
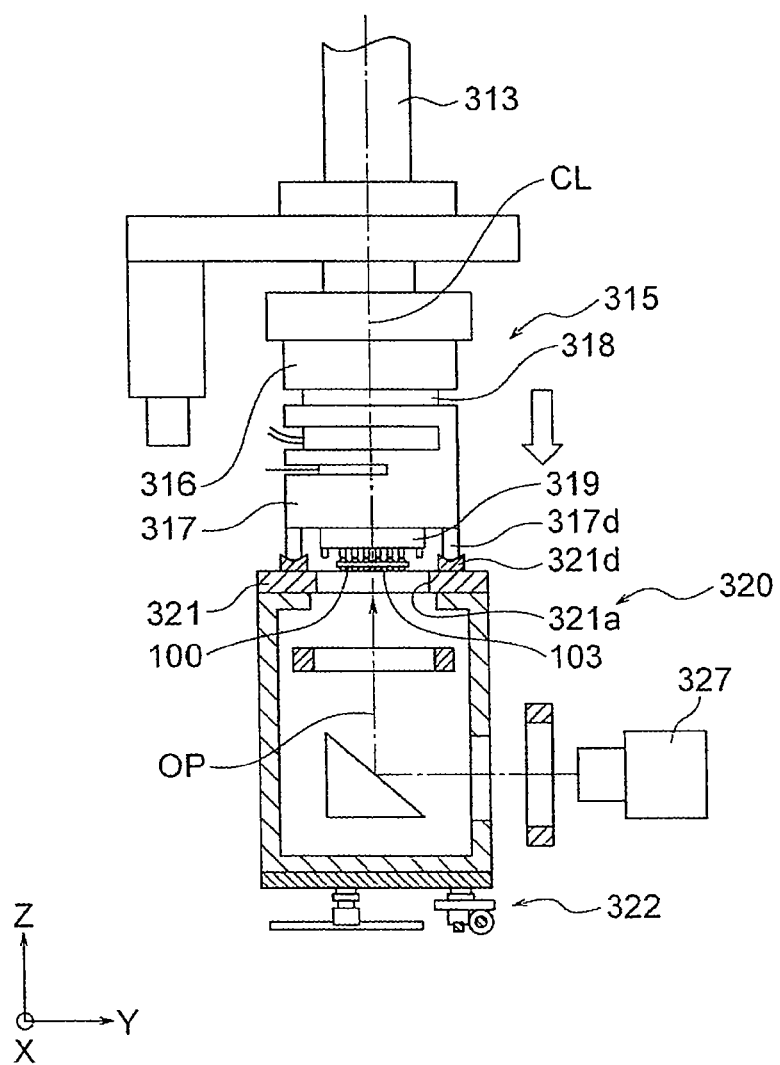
FIG. 34 is a schematic cross sectional view along the line XXXIV-XXXIV of FIG. 33.
Figure 35:
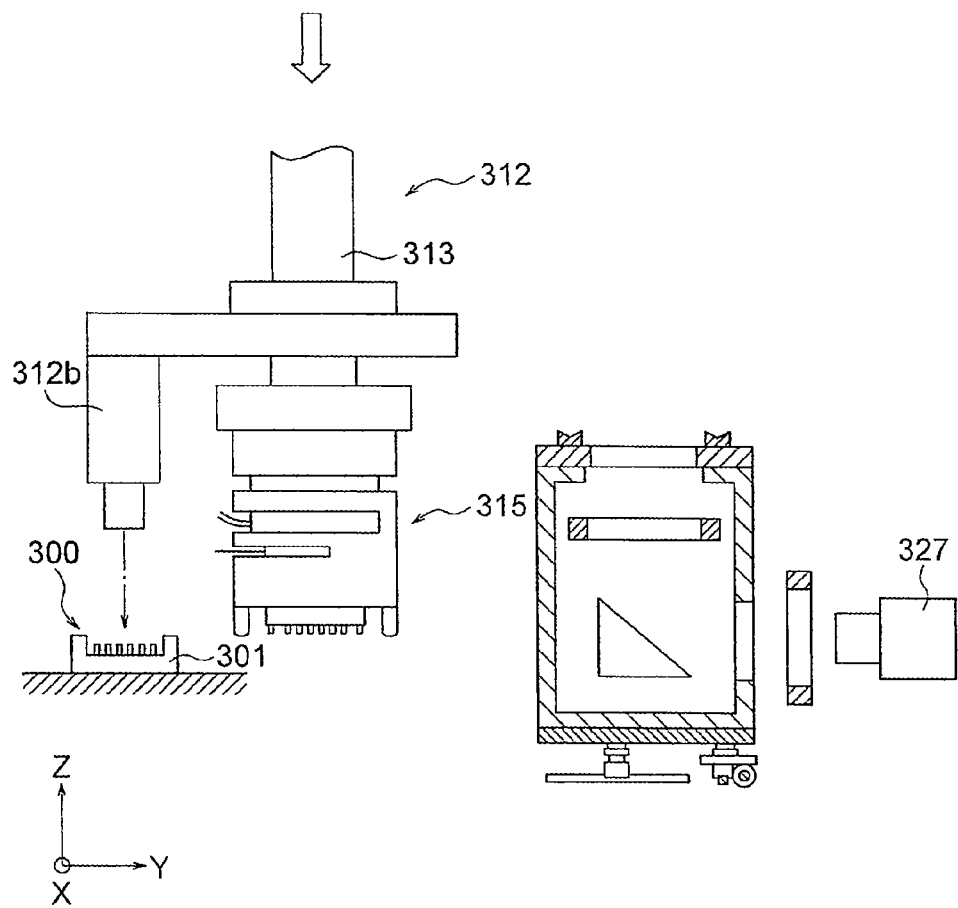
FIG. 35 is a schematic cross sectional view illustrating a fourth imaging step according to the first embodiment of the present invention.

FIG. 32 is a flowchart illustrating the second positioning step of FIG. 22, FIG. 33 is a cross sectional view illustrating the second positioning step of FIG. 22, FIG. 34 is a schematic cross sectional view along the line XXXIv-XXXIV of FIG. 33, and FIG. 35 is a schematic cross sectional view illustrating a fourth imaging step according to the present embodiment.

The second positioning step S30 includes, as shown in FIG. 32, a second imaging step S31, a second recognition step S32, and a second positional correction step S33.

In the second imaging step S31, each CCD camera 327 images the second main surface 103 of the electronic device under test 100 held by the contact arm 315.

Specifically, the X-axis direction supporting member 311a of the YZ moving apparatus 310 is initially moved on the Y-axis direction rails 311 such that the center line CL of the contact arm 315 placed with the X-axis positive direction in the figures and the optical axis OP of the CCD camera 327 placed with the X-axis positive direction in the figures are coincident with each other.

Thereafter, as shown in FIG. 33 and FIG. 34, by extending the Z-axis direction actuator 313 placed with the X-axis positive direction in the figures, the contact arm 315 is caused to be pressed toward the alignment apparatus 320 with a predetermined pressure to the contact arm 315 thereby also causing the contacting member 317d provided with the holding-side contact arm 317 to be engaged with the engaging members 321d of the alignment movable part 321.

Note that, in order for the engaging members 321d of the alignment movable part 321 and the contacting member 317d of the contact arm 315 to be readily engaged, the lock-and-free mechanism 318 may be caused to be in the non-locked status before those engagements.

After that, as shown in FIG. 34, the CCD camera 327 of the alignment apparatus 320 images the second main surface 103 of the electronic device under test 100. Image information imaged by the CCD camera 327 is transmitted to the image processing apparatus 70.

Thereafter, in the second recognition step S32, positions of the contact pins 302 of the second socket 301 attached to the test head 300 and positions of the second device terminals 104 of the electronic device under test 100 are extracted to be used for calculating relative positions thereof.

This second recognition step S32 includes, as shown in FIG. 32, a second contact pins extraction step S321 (a second socket terminals extraction step), a second device terminals extraction step S322, and a second calculation step S323.

Here, at least prior to execution of the second recognition step S32, as shown in FIG. 35, the CCD camera 312b images the second socket 301, and image information regarding the second socket 301 is transmitted to the image processing apparatus 70 (a fourth imaging step). Note that this fourth imaging step is sufficient to be performed, for example, when the socket 301 is replaced due to the change in the type of electronic devices under test 100 etc, and may not be performed for every testing of electronic devices under test 100.

In the second contact pins extraction step S321, the image processing apparatus 70 receives image information regarding the second socket 301, and the second contact pins extraction part 74 of the image processing apparatus 70 extracts positions of the contact pins 302 from image information regarding the second socket 301. Note that this second contact pins extraction step S321 is sufficient to be performed one time when the above fourth imaging step has been done, and may not be performed for every testing of electronic devices under test 100. Also note that, as shown in FIG. 10, if the alignment marks 301a are provided on the second socket 301, a second marks extraction step may be employed for extracting these alignment marks 301a as substitute for the second contact pins extraction step S321.

In the second device terminals extraction step S322, the image processing apparatus 70 receives image information regarding the second main surface 103 of the electronic device under test 100, and the second device terminals extraction part 75 of the image processing apparatus 70 extracts the second device terminals 104 from image information regarding the second main surface 103 of the electronic device under test 100.

In the second calculation step S323, the second calculation part 76 of the image processing apparatus 70 compares the positions of the contact pins 302 and the second device terminals 104 with one another thereby to calculate a second relative position of the electronic device under test 100 with respect to the second socket 301. Note that, if the second marks extraction step is provided, then the positions of the alignment marks 301a and the positions of the second device terminals 104 may be compared thereby to be used for calculating the second relative position of the electronic device under test 100 with respect to the second socket 301.

Subsequently, the image processing apparatus 70 sends a command to the controlling apparatus 80 for YZ moving apparatus, the command causing the lock-and-free mechanism 318 to be in the non-locked status. The controlling apparatus 80 for YZ moving apparatus, after having received the command, performs, based on the command, a control to stop the supply of air to the pistons 3183 for locking of the lock-and-free mechanism 318, thereby causing the lock-and-free mechanism 318 to be in the non-locked status. This allows the holding-side contact arm 317 to be movable in a plane relatively to the basement-side contact arm 316.

Then, in the second positional correction step S33, information regarding the second relative position calculated in the second recognition step S32 is initially transmitted to the controlling apparatus 90 for movable part driving apparatus. The controlling apparatus 90 for movable part driving apparatus, after having received this information regarding the second relative position, drives the motors 324a, 325a, and 326a of the alignment movable part driving apparatus 322 to compensate for the second relative position thereby performing the alignment of the position of the electronic device under test 100. The controlling apparatus 90 for movable part driving apparatus, after completing those drives, transmits a completion signal thereof to the image processing apparatus 70.

The image processing apparatus 70 having received the completion signal compares again the position and the attitude of the electronic device under test 100 and those of the second socket 301, and if these are determined to fail to be coincident, the image processing apparatus 70 calculates again a second relative position of the electronic device under test 100 with respect to the second socket 301 and transmits the calculated second relative position to the controlling apparatus 90 for movable part driving apparatus.

The image processing apparatus 70, after having confirmed that the position and the attitude of the electronic device under test 100 and those of the second socket 301 are coincident, transmits a command to the controlling apparatus 80 for YZ moving apparatus causing the lock-and-free mechanism 318 to be in the locked status. The controlling apparatus 80 for YZ moving apparatus performs, based on the command, a control to supply air to the pistons 3183 for locking of the lock-and-free mechanism 318, thereby completing the alignment. After completing the alignment, the contact arm 315 is moved upward by the Z-axis direction actuator 313.

Subsequently, in a similar manner, after imaging the second main surface 103 of another electronic device under test 100 placed with the X-axis negative direction in FIG. 33, the position of that electronic device under test 100 is aligned. After completing the alignment, the contact arm 315 is moved upward by the Z-axis direction actuator 313.

The second contacting step S40 will now be described.

Figure 36:
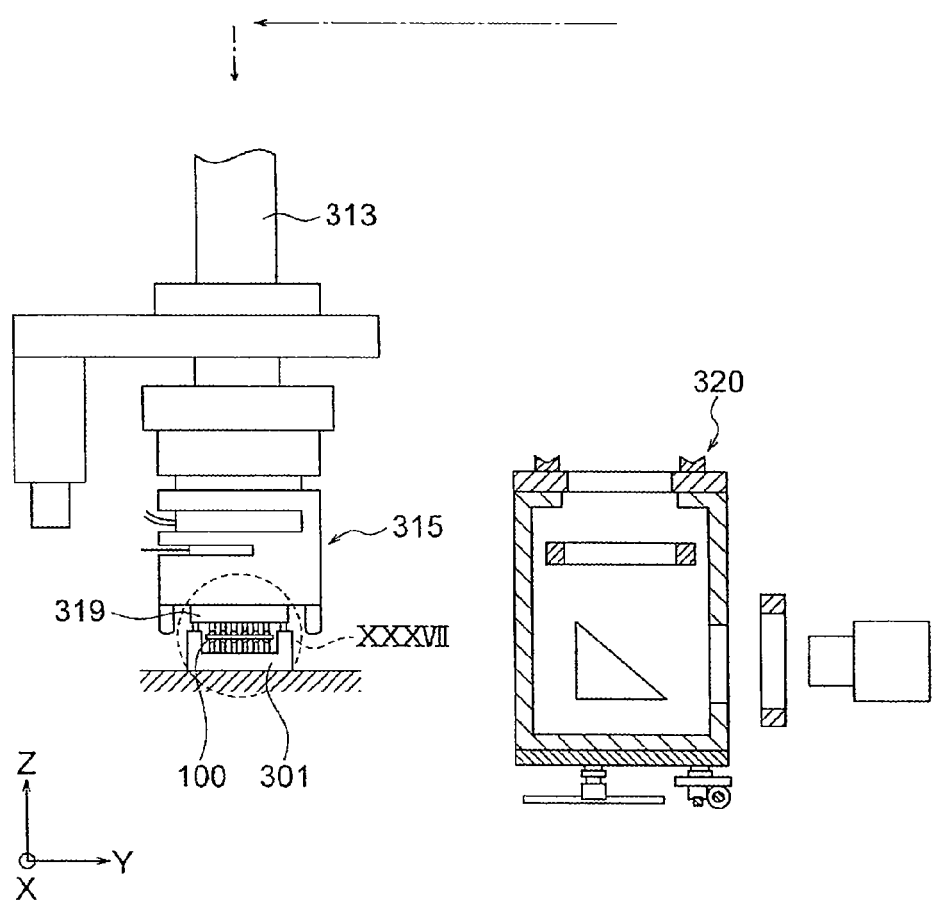
FIG. 36 is a schematic cross sectional view illustrating a second contacting step.
Figure 37:
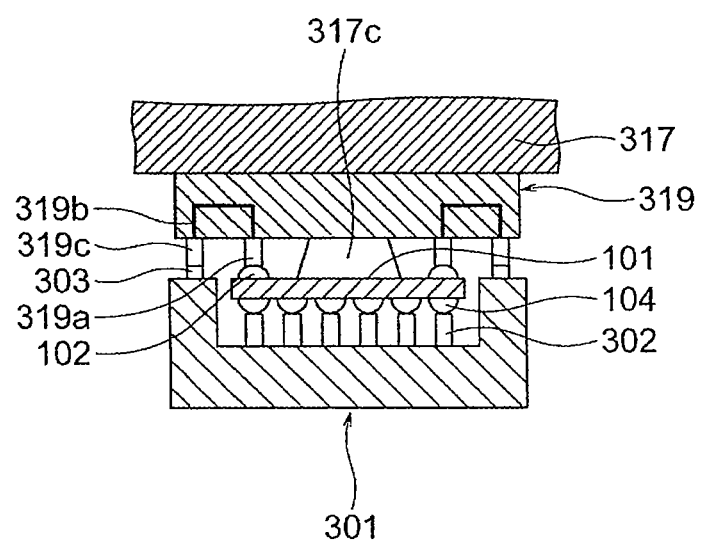
FIG. 37 is an enlarged cross sectional view of the part XXXVII of FIG. 36.

FIG. 36 is a cross sectional view illustrating the second contacting step, and FIG. 37 is an enlarged cross sectional view of the line XXXVII of FIG. 36.

In the second contacting step S40, the X-axis direction supporting member 311a of the YZ moving apparatus 310 is caused to move on the Y-axis direction rails 311, and the contact arms 315 is caused to position above the second socket 301 of the test head 300. Then, as shown in FIG. 36, the contact arm 315 is moved downward by the Z-axis direction actuator 313, and the electronic device under test 100 held by the contact arm 315 is caused to contact the second socket 301.

This allows, as shown in FIG. 37, the contact pins 302 of the second socket 301 and the second device terminals 104 of the electronic device under test 100 to contact one another. In addition, at the same time, the connecting terminals 319c of the first socket 319 and the connecting terminals 303 of the second socket 301 are caused to contact one another. Here, as the contact pins 319a are electrically connected with the connecting terminals 319c via the wirings 319b, the first device terminals 102 of the electronic device under test 100 are to be electrically connected with the second socket 301 via the first socket 319.

In the testing step S50, as shown in FIG. 37, while causing the electronic device under test 100 to intervene between the sockets 301 and 319, the test head 300 inputs and outputs test signals for the device terminals 102 and 104 via the sockets 301 and 319.

After completing the test, the Z-axis direction actuator 313 of the YZ moving apparatus 310 causes the contact arm 315 to move upward. Thereafter, the X-axis direction actuator 602b of the buffer part 602 for unloader is extended to cause the movable part 602a to move into the working area of the YZ moving apparatus 310. Then, the X-axis direction supporting member 311a of the YZ moving apparatus 310 is caused to move on the Y-axis direction rails, and the contact arm 315 is thus positioned above the movable part 602a. Then, the contact arm 315 is moved downward by the Z-axis direction actuator 313 to release the held electronic device under test 100.

Thereafter, the contact arm 315 is moved upward by the Z-axis direction actuator 313. Then, the lock-and-free mechanism 318 is subjected to centering operation. This allows the first socket 319 to be returned to the initial position before alignment.

As described above, the electronic device test method according to the present embodiment enables an electronic device under test 100 to be tested which has device terminals 102 and 104 provided on the both surfaces.

In addition, the CCD camera 505 images the electronic device under test 100 held by the movable part 502a of the buffer parts 502 for loader, the image processing apparatus 70 recognizes, based on image information imaged by the CCD camera 505, the first relative position of the first socket 319 with respect to the electronic device under test 100, the alignment apparatus 320 performs correction of the position of the first socket 319 based on the first relative position, and therefore the occurrence frequency of miss contacts between the electronic device under test 100 and the first socket 319 is enabled to be reduced.

Furthermore, the CCD camera 327 images the electronic device under test 100 held by the contact arm 315, the image processing apparatus 70 recognizes, based on image information imaged by the CCD camera 327, the second relative position of the electronic device under test 100 with respect to the second socket 301, the alignment apparatus 320 performs correction of the position of the electronic device under test 100 based on the second relative position, and therefore the occurrence frequency of miss contacts between the electronic device under test 100 and the second socket is enabled to be reduced.

The above advantageous effect is significant particularly in the case where the device terminals 102 and 104 of the electronic device under test 100 are arranged with small pitches.

In general, it is actually difficult to execute at the same time the positioning between an electronic device under test and a first socket and the positioning between the electronic device under test and a second socket.

In contrast, according to the present embodiment, in the status where the first socket 319 and the electronic device under test 100 are contacted with each other, the suction pad 317c of the holding-side contact arm 317 holds the electronic device under test 100. In addition, the alignment apparatus 320 causes this holding-side contact arm 317 to move in a plane, thereby positioning the electronic device under test 100 with respect to the second socket 301.

That is, according to the present embodiment, while moving integrally the electronic device under test 100 and the first socket 319, the electronic device under test 100 and the second socket 301 are positioned. For this reason, the electronic device under test 100 and the second socket 301 are positioned in the status where the electronic device under test 100 and the first socket 319 are suppressed from missing the positioning, and therefore the occurrence frequency of miss contacts between the electronic device under test 100 and the first socket 319 may be reduced while at the same time the occurrence frequency of miss contacts between the electronic device under test 100 and the second socket 301 may be also reduced.

Second Embodiment

Figure 38:
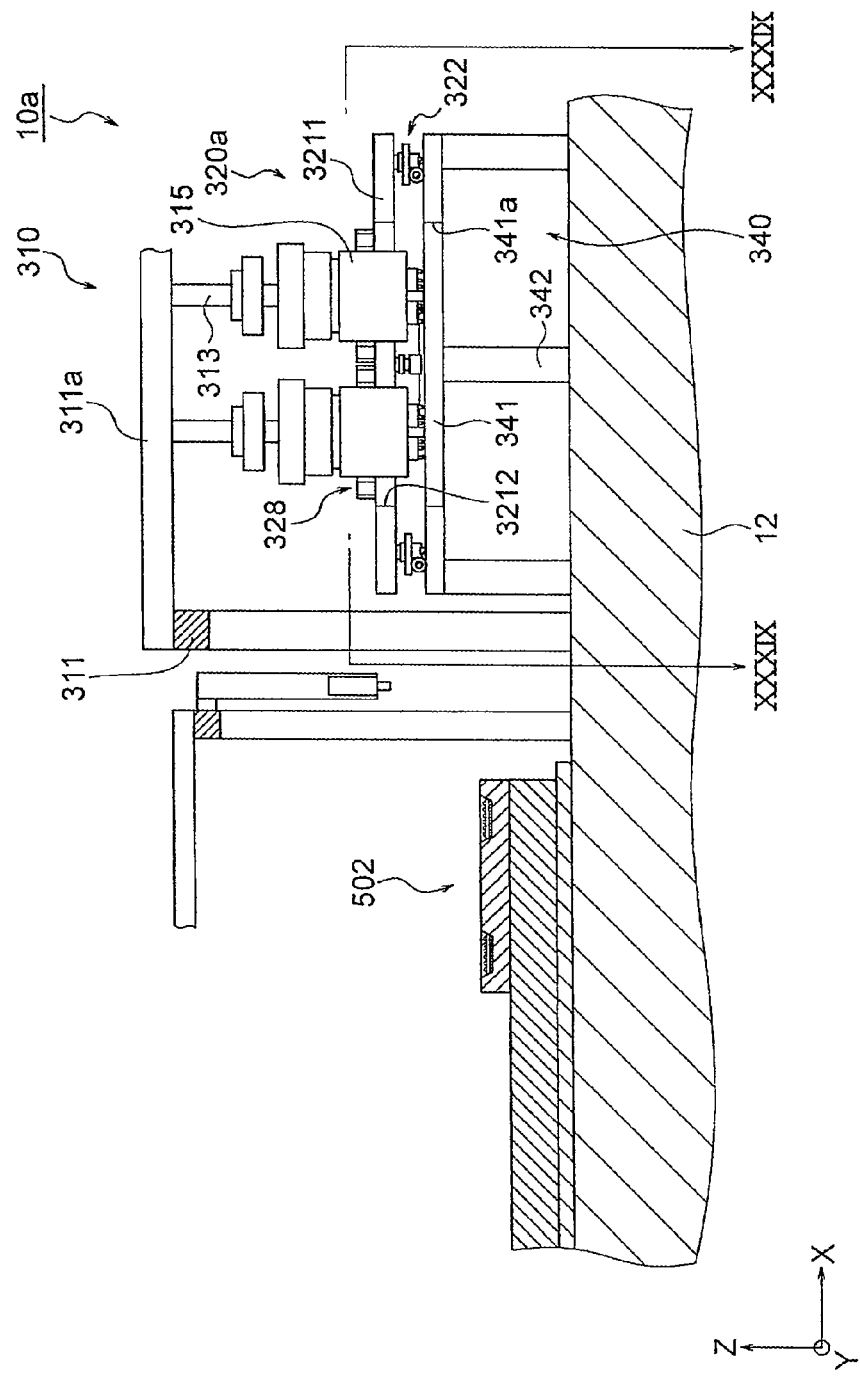
FIG. 38 is a cross sectional view of an electronic device handling apparatus according to a second embodiment of the present invention.
Figure 39:
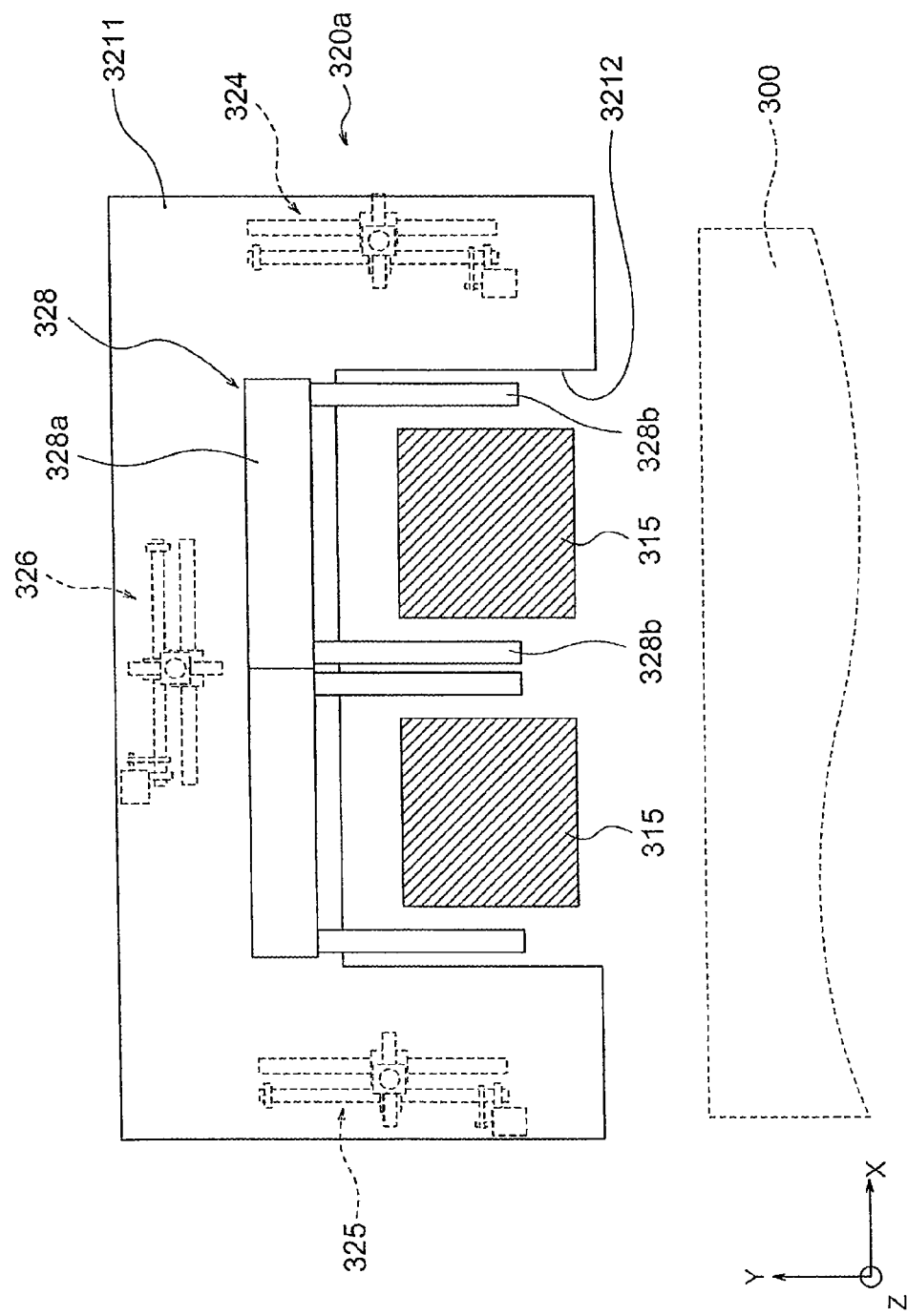
FIG. 39 is a cross sectional view along the line XXXIX-XXXIX of FIG. 38.
Figure 40:
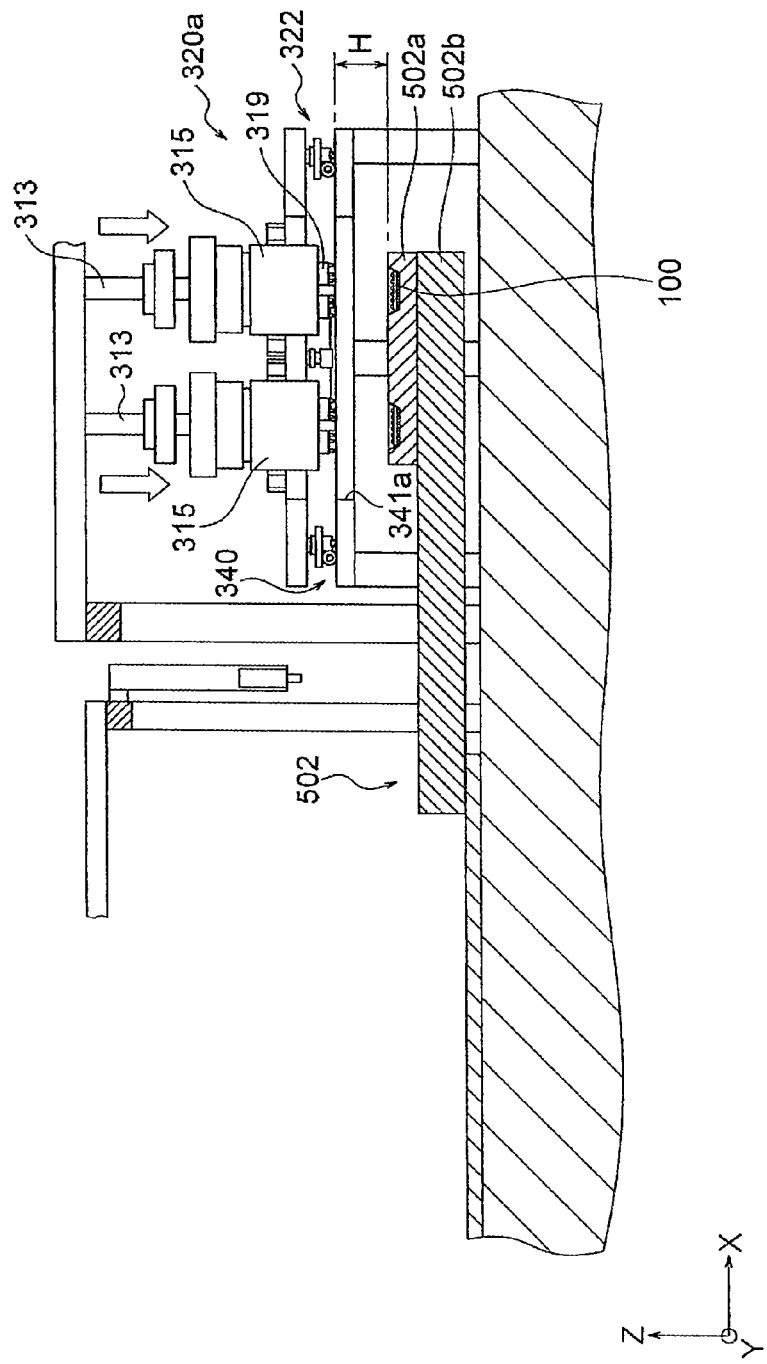
FIG. 40 is a cross sectional view for explaining the function of the electronic device handling apparatus according to the second embodiment of the present invention.

FIG. 38 is a cross sectional view of an electronic device handling apparatus according to the present embodiment, FIG. 39 is a cross sectional view along the line XXXIX-XXXIX of FIG. 38, and FIG. 40 is a cross sectional view for explaining the operation of the electronic device handling apparatus according to the present embodiment.

Although the present embodiment is modified from the first embodiment in the point that a handler 10a further comprises a supporting member 340 and in the structure of an alignment apparatus 320a, other structural features of the present embodiment are similar with the first embodiment. Hereinafter, the modifications from the first embodiment will only be described, and the same features with the first embodiment will be omitted to be described by denoting with same reference numerals.

The alignment apparatus 320a of the handler 10a according to the present embodiment has, as shown in FIG. 38, an alignment movable part 3211, an alignment movable part driving apparatus 322, clamping apparatuses 328, an electronic device under test side illumination, a reflecting mirror for alignment, a CCD camera side illumination, and a CCD camera (a second camera). Note that, although the electronic device under test side illumination, the reflecting mirror for alignment, the CCD camera side illumination, and the CCD camera are not particularly shown, they are arranged in a similar manner as the first embodiment such that the first socket 319 and the electronic device under test 100 may be imaged.

The alignment movable part 3211 according to the present embodiment is formed with a cutout 3212. This cutout 3212 has, in the plan viewing shown as FIG. 39, dimensions capable of being inserted with two contact arms 315 supported by the X-axis direction supporting member 311a, and the cutout 3212 is opened toward the test head 300 side.

The alignment movable part driving apparatus 322 is similar to that of the first embodiment other than that the alignment movable part 3211 is directly supported by the first and second Y-axis direction moving apparatuses 324 and 325 and the X-axis direction moving apparatus 326. Note that this alignment movable part driving apparatus 322 may support the alignment movable part 3211 via an alignment movable part supporting member similarly in the first embodiment, and not particularly limited.

Each clamping apparatus 328, which has a main body part 328a and two clamp members 328b, and the two clamp members is fixed to the upper surface of the alignment movable part 3211 so as to project toward the test head 300 side from the cutout 3212 of the alignment movable part 3211. This clamping apparatus 328 holds the holding-side contact arm 317 of the contact arm 315 by the operation of the main body part 328a causing the two clamp members to come close to each other. The present embodiment involves two clamping apparatuses 328 corresponding to the arrangement of the two contact arms 315 supported by the X-axis direction supporting member 311a.

As this clamping apparatus 328 clamps the holding-side contact arm 317, the alignment apparatus 320a may cause the holding-side contact arm 317 to move in a plane.

The supporting member 340 supports, as shown in FIG. 40, the alignment apparatus 320a at the position H higher than the receiving position where the contact arm 315 receives the electronic device under test 100 from the buffer parts 502 for loader. This supporting member 340 has a supporting plate 341 and supporting pillars 342.

The supporting plate 341 is a plate to which the alignment movable part driving apparatus 322 is attached, and a cutout 341a is formed with the supporting plate 341. Note that this cutout 341a is formed in a similar manner as the cutout 3212 of the alignment movable part 3211 so as to be opened toward the test head 300 side and with dimensions capable of being inserted with the two contact arms 315.

The supporting pillars 342, which support the supporting plate 341, are attached to the base table 12 of the handler 10 at positions not to interfere with the buffer parts 502 for loader. The present embodiment involves three supporting pillars 342 for supporting the supporting plate 341, but not particularly limited to this.

Note that the supporting member 340 is sufficient if capable of supporting the alignment apparatus 320a at a position higher than the buffer parts 502 for loader, and may alternatively be configured by attaching the supporting plate 341 to a frame supporting the YZ moving apparatus 310 without providing the supporting pillars 342.

According to the present embodiment, the alignment apparatus 320a is provided at a position higher than the buffer parts 502 for loader, and therefore, as shown in FIG. 40, during a transition from the first positional correction step S13 to the first contacting step S20, the contact arm 315 completed to be aligned may be promptly caused to move downward by the Z-axis direction actuator 313. That is, different from the first embodiment (refer to FIG. 29), it is not necessary to once move the contact arm 315 upward, and therefore the electronic device test apparatus may be efficiently operated.

Third Embodiment

Figure 41:
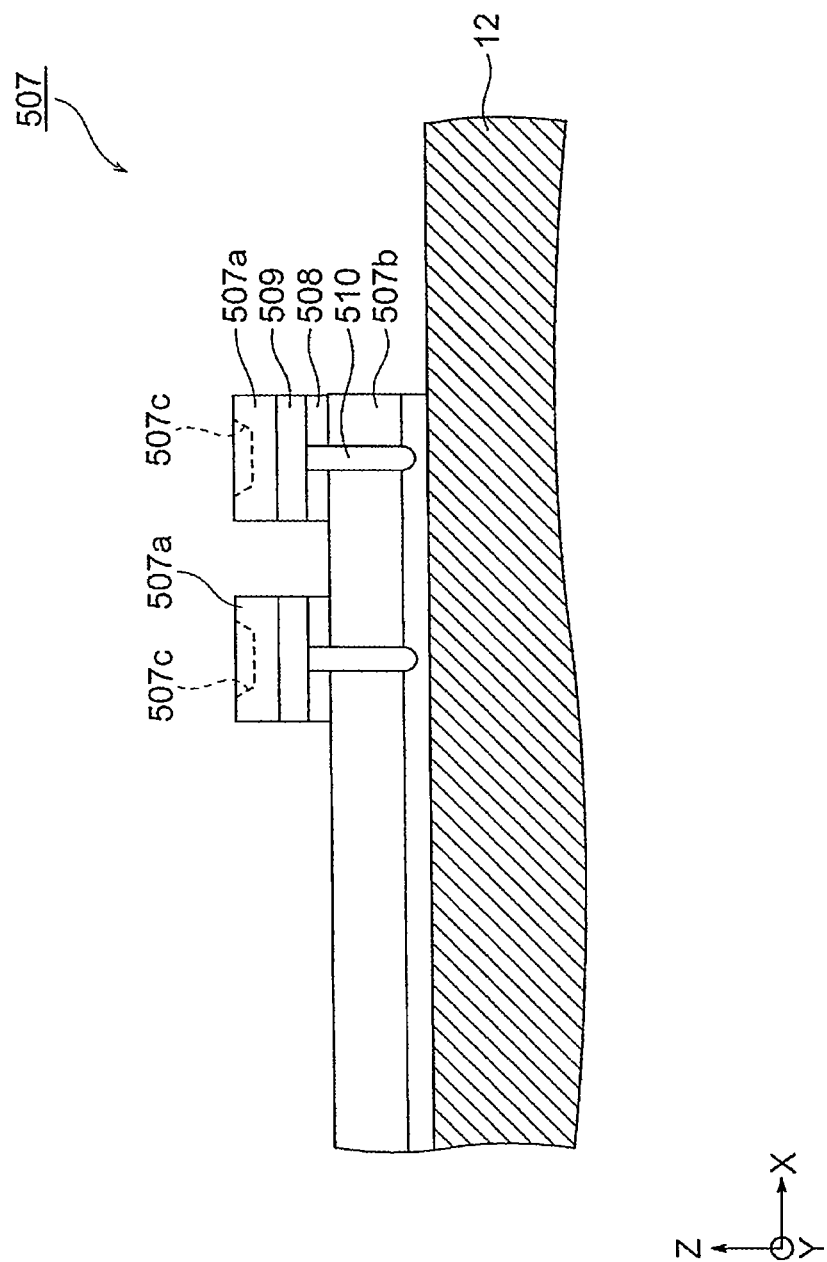
FIG. 41 is a side elevational view of a buffer for loader according to a third embodiment of the present invention.
Figure 42:
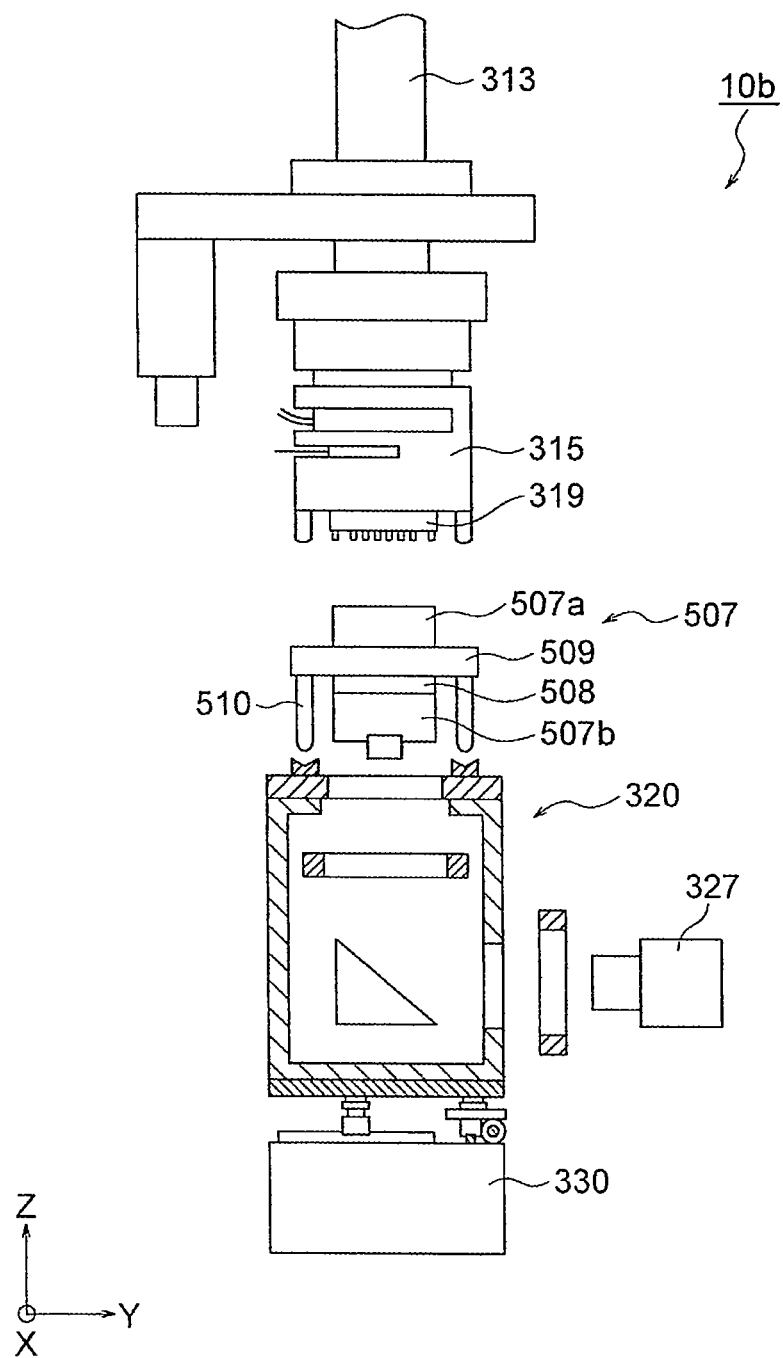
FIG. 42 is a schematic cross sectional view of an electronic device handling apparatus according to the third embodiment of the present invention.
Figure 43:
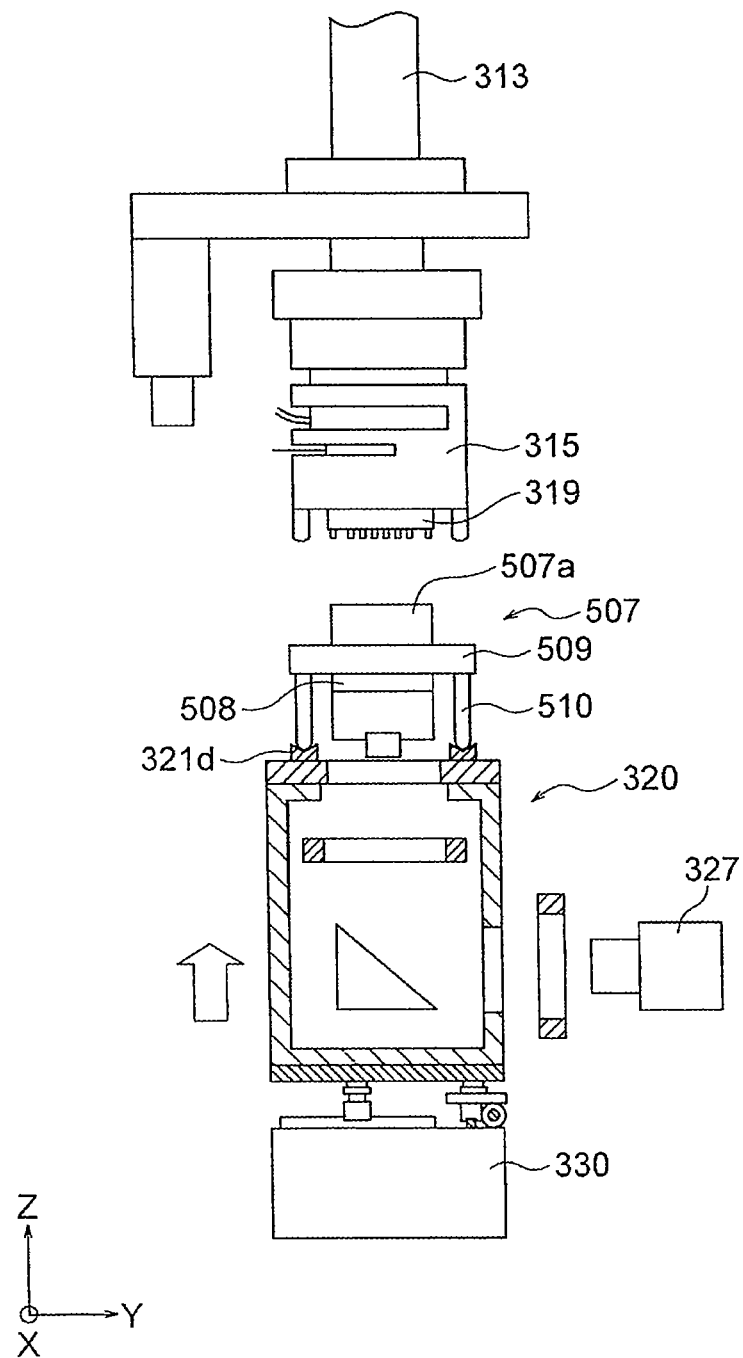
FIG. 43 is a schematic cross sectional view (part 1) illustrating an operation of the electronic device handling apparatus according to the third embodiment of the present invention.
Figure 44:
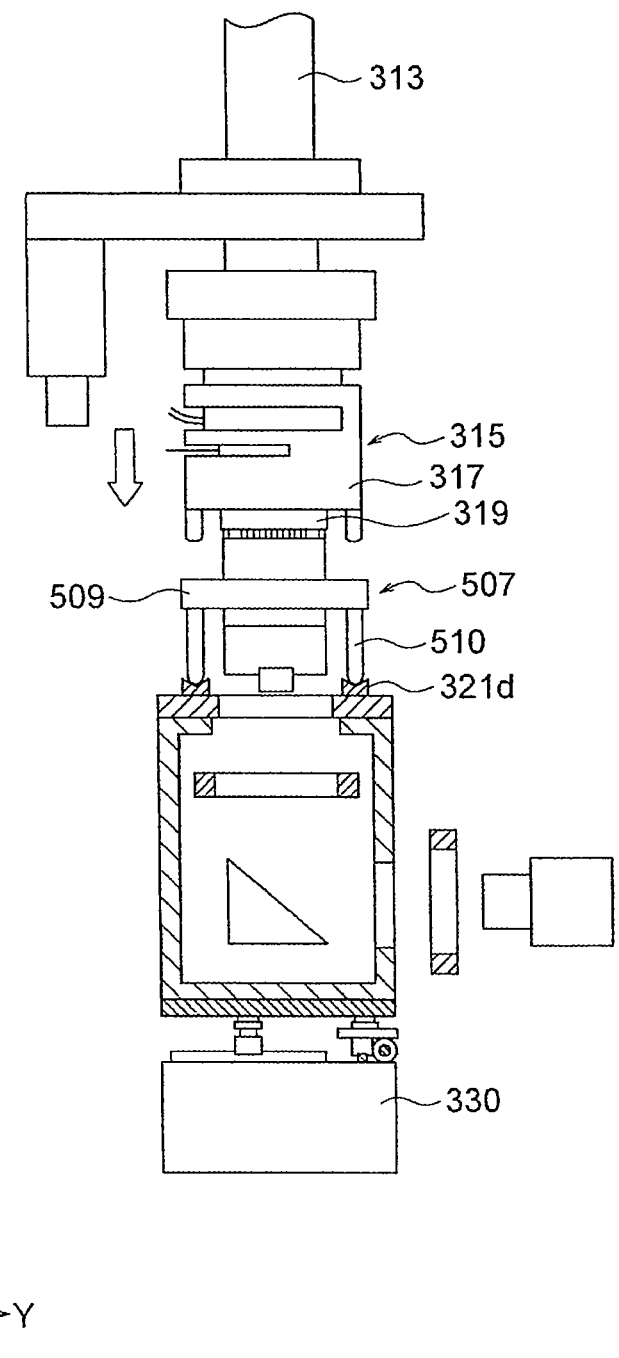
FIG. 44 is a schematic cross sectional view (part 2) illustrating the operation of the electronic device handling apparatus according to the third embodiment of the present invention.
Figure 45:
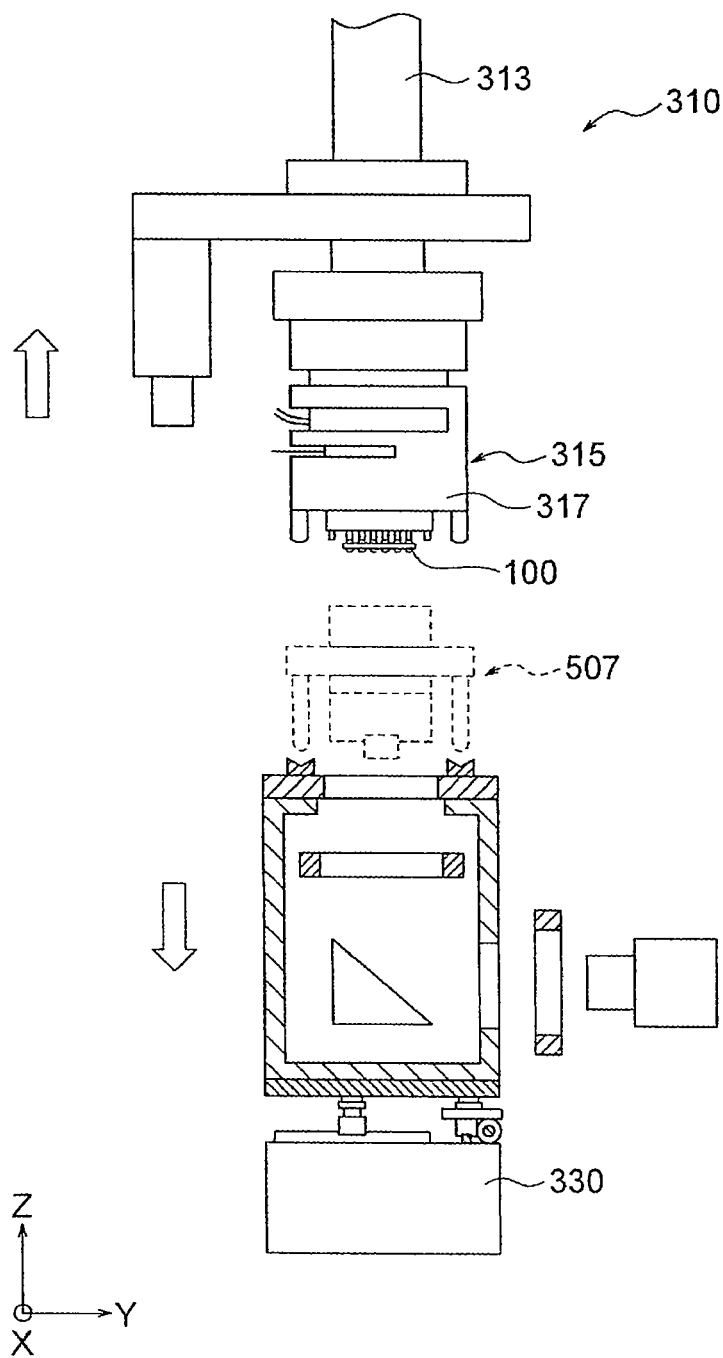
FIG. 45 is a schematic cross sectional view (part 3) illustrating the operation of the electronic device handling apparatus according to the third embodiment of the present invention.
Figure 46:
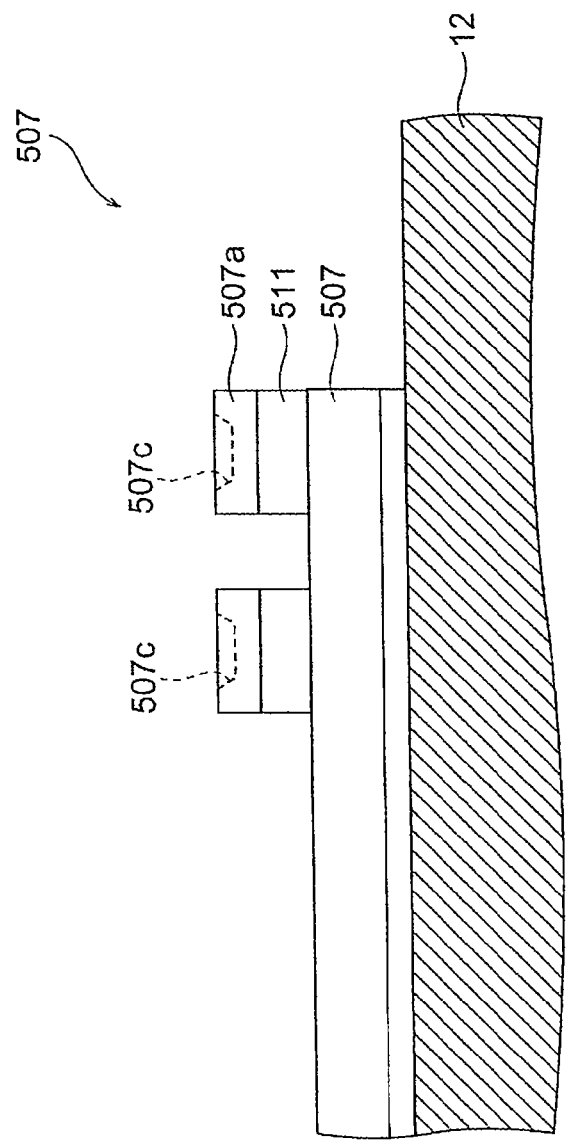
FIG. 46 is a side elevational view illustrating a modified example of the buffer for loader according to the third embodiment of the present invention.

FIG. 41 is a side elevational view of a buffer for loader according to the present embodiment, FIG. 42 is a schematic cross sectional view of an electronic device handling apparatus according to the present embodiment, FIG. 43 to FIG. 45 are schematic cross sectional views illustrating an operation of the electronic device handling apparatus according to the present embodiment, and FIG. 46 is a side elevational view illustrating a modified example of the buffer for loader according to the present embodiment.

Although a handler 10b according to the present embodiment is modified from the first embodiment in the structure of a buffer 507 for loader and in the point that the handler 10b further comprises a Z-axis direction actuator 330 for causing the alignment apparatus 320 to move up-and-down, other structural features of the present embodiment are similar with the first embodiment. Hereinafter, the modifications from the first embodiment will only be described, and the same features with the first embodiment will be omitted to be described by denoting with same reference numerals.

The buffer 507 for loader according to the present embodiment has, as shown in FIG. 41, divided two movable parts 507a, each of which is formed thereon with a recess 507c. This buffer 507 for loader has a lock-and-free mechanism 508, a movable plate 509, and a contacting member 510 between each movable part 507a and an X-axis direction actuator 507b.

The lock-and-free mechanism 508, which is disposed between the X-axis direction actuator 507b and the movable plate 509, causes a planar movement, relative to the X-axis direction actuator 507b, of the movable part 507a fixed to the movable plate 509 to be locked or non-locked. Note that this lock-and-free mechanism 508 has the same structure as the lock-and-free mechanism 318 in the first embodiment.

The movable plate 509 and the contacting member 510 are members for transmitting a driving force by the alignment apparatus 320 to the movable part 507a, and the movable plate 509 and the contacting member 510 are connected with the movable part 507a by the upper surface of the movable plate 509. In addition, as shown in FIG. 42, the movable plate 509 has a width in the Y-axis direction larger than the lock-and-free mechanisms 508 and the X-axis direction actuator 507b, and the movable plate 509 thus extends in the Y-axis direction from the lock-and-free mechanisms 508 and the X-axis direction actuator 507b.

The contacting members 510 are pin-like members capable of being engaged with the engaging members 321d of the alignment apparatus 320, and are fixed to the lower end surface of the portion within the movable plate 509 extended from the lock-and-free mechanisms 508 and the X-axis direction actuator 507b.

The Z-axis direction actuator 330 supports the alignment apparatus 320 and causes it to be movable in the Z-axis direction.

The operation of the electronic device test apparatus according to the present embodiment will now be described.

In the first positional correction step S13 according to the present embodiment, as shown in FIG. 43, after extending the X-axis direction actuator 507b of the buffer 507 for loader to position the movable part 507a below the contact arm 315, the Z-axis direction actuator 330 supporting the alignment apparatus 320 is extended to cause the engaging members 321d to contact the contacting members 510 of the buffer 507 for loader.

Thereafter, the lock-and-free mechanism 508 are caused to be in the non-locked status thereby allowing the movable part 507a to move in a plane with respect to the X-axis direction actuator 507b.

The alignment apparatus 320 then moves the movable part 507a in a plane to align the electronic device under test 100 held by the movable part 507a with respect to the first socket 319.

Subsequently in the first contacting step S20, as shown in FIG. 44, the Z-axis direction actuator 313 of the YZ moving apparatus causes the contact arm 315 to move downward thereby resulting in that the electronic device under test and the first socket 319 are caused to contact each other and the suction pad of the holding-side contact arm 317 adsorbs the electronic device under test.

Thereafter, as shown in FIG. 45, the Z-axis direction actuator 313 of the YZ moving apparatus causes the contact arm 315 to move upward, and the Z-axis direction actuator 330 causes the alignment apparatus 320 to move downward. Then, the buffer 507 for loader is evicted from the working area of the YZ moving apparatus.

Thus, according to the present embodiment, the buffer part for loader and the alignment apparatus aligns an electronic device under test with respect to the first socket, and therefore while the contact arm presses another electronic device under test to the test head to test the another electronic device under test, an electronic device under test to be next tested is also allowed to be aligned. Accordingly, the electronic device test apparatus may be efficiently operated.

Note that, although the present embodiment employs the lock-and-free mechanisms 508 provided with the buffer 507 for loader, as shown in FIG. 46, a planar movement apparatuses 511 may be provided between the movable parts 507a and the X-axis direction actuator 507b of the buffer 507 for loader so as to be capable of planar moving in the X-axis and Y-axis directions and also capable of rotational motion around the Z-axis direction. This allows the buffer 507 for loader to directly align an electronic device under test 100 without using the alignment apparatus 320, thereby further efficiently operating the electronic device test apparatus.

In addition, as such planar movement apparatuses 511, the same structure as the alignment movable part driving apparatus 322 described above may be used, for example.

It is to be noted that the embodiments as explained above are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 . . . electronic device test apparatus
10 . . . handler
20 . . . tester
30 . . . test part
300 . . . test head
301, 319 . . . socket
302, 319a . . . contact pin (socket terminal)
310 . . . YZ moving apparatus (first moving means)
312b, 327, 505 . . . CCD camera (imaging apparatus)
315 . . . contact arm
316 . . . basement-side contact arm (fixed part)
317 . . . holding-side contact arm (attaching part)
318 . . . lock-and-free mechanism (locking means)
320, 320a . . . alignment apparatus
322 . . . alignment movable part driving apparatus (planar movement means)
40 . . . storage part
50 . . . loader part
502, 507 . . . buffer part for loader
502a, 507a . . . movable part (holding part)
502b, 507b . . . X-axis direction actuator (second moving means)
60 . . . unloader part
70 . . . image processing apparatus
71, 74 . . . contact pins extraction part
72, 75 . . . device terminals extraction part
73, 76 . . . calculation part
100 . . . electronic device under test
101, 103 . . . main surface
102, 104 . . . device terminal

The invention claimed is:

1. An electronic device test method for testing an electronic device under test, the electronic device under test having a first main surface provided thereon with a first device terminal and a second main surface provided thereon with a second device terminal, the electronic device test method comprising:
(a) positioning a first socket and the electronic device under test;
(b) causing the first socket and the electronic device under test to contact each other;
(c) positioning the electronic device under test with respect to a second socket in a status where the first socket and the electronic device under test are contacted with each other;
(d) causing the electronic device under test to contact the second socket; and
(e) testing the electronic device under test in a status where the electronic device under test is caused to intervene between the first socket and the second socket;
wherein
(a) positioning the first socket and the electronic device under test includes:
(f) imaging the first main surface of the electronic device under test;
(g) recognizing, based on a first image information imaged by (f) imaging the first main surface of the electronic device under test, a first relative position of the electronic device under test with respect to the first socket; and
(h) correcting a position of the first socket or the electronic device under test based on the first relative position, and
(c) positioning the electronic device under test with respect to the second socket includes:
(i) imaging the second main surface of the electronic device under test;
(j) recognizing, based on a second image information imaged by (i) imaging the second main surface of the electronic device under test, a second relative position of the electronic device under test with respect to the second socket; and
(k) correcting a position of the electronic device under test based on the second relative position;
wherein
(a) positioning the first socket and the electronic device under test further includes
(l) imaging the first socket,
(g) recognizing the first relative position of the electronic device under test with respect to the first socket includes:
(m) extracting a position of a first socket terminal from a third image information imaged by (l) imaging the first socket, the first socket terminal being electrically connected with the first device terminal within the first socket;
(n) extracting a position of the first device terminal from the first image information; and
(o) comparing the position of the first socket terminal and the position of the first device terminal to calculate the first relative position,
(c) positioning the electronic device under test with respect to the second socket further includes
(p) imaging the second socket, and (j) recognizing the second relative position of the electronic device under test with respect to the second socket includes:
(q) extracting a position of a second socket terminal from a fourth image information imaged by (p) imaging the second socket, the second socket terminal being electrically connected with the second device terminal within the second socket;
(r) extracting a position of the second device terminal from the second image information; and
(s) comparing the position of the second socket terminal and the position of the second device terminal to calculate the second relative position.

2. An electronic device test method for testing an electronic device under test, the electronic device under test having a first main surface provided thereon with a first device terminal and a second main surface provided thereon with a second device terminal, the electronic device test method comprising:
(a) positioning a first socket and the electronic device under test;
(b) causing the first socket and the electronic device under test to contact each other;
(c) positioning the electronic device under test with respect to a second socket in a status where the first socket and the electronic device under test are contacted with each other;
(d) causing the electronic device under test to contact the second socket; and
(e) testing the electronic device under test in a status where the electronic device under test is caused to intervene between the first socket and the second socket;
wherein
(a) positioning the first socket and the electronic device under test includes:
(f) imaging the first main surface of the electronic device under test;
(g) recognizing, based on a first image information imaged by (f) imaging the first main surface of the electronic device under test, a first relative position of the electronic device under test with respect to the first socket; and
(h) correcting a position of the first socket or the electronic device under test based on the first relative position, and
(c) positioning the electronic device under test with respect to the second socket includes:
(i) imaging the second main surface of the electronic device under test;
(j) recognizing, based on a second image information imaged by (i) imaging the second main surface of the electronic device under test, a second relative position of the electronic device under test with respect to the second socket; and
(k) correcting a position of the electronic device under test based on the second relative position;
wherein
(a) positioning the first socket and the electronic device under test further includes
(l) imaging the first socket provided thereon with a first alignment mark, and
(g) recognizing the first relative position of the electronic device under test with respect to the first socket includes:
(t) extracting a position of the first alignment mark from a third image information imaged by (l) imaging the first socket;
(n) extracting a position of the first device terminal from the first image information; and
(o) comparing the position of the first alignment mark and the position of the first device terminal to calculate the first relative position.

3. An electronic device test method for testing an electronic device under test, the electronic device under test having a first main surface provided thereon with a first device terminal and a second main surface provided thereon with a second device terminal, the electronic device test method comprising:
(a) positioning a first socket and the electronic device under test;
(b) causing the first socket and the electronic device under test to contact each other;
(c) positioning the electronic device under test with respect to a second socket in a status where the first socket and the electronic device under test are contacted with each other;
(d) causing the electronic device under test to contact the second socket; and
(e) testing the electronic device under test in a status where the electronic device under test is caused to intervene between the first socket and the second socket;
wherein
(a) positioning the first socket and the electronic device under test includes:
(f) imaging the first main surface of the electronic device under test;
(g) recognizing, on a first image information imaged by (f) imaging the first main surface of the electronic device under test, a first relative position of the electronic device under test with respect to the first socket; and
(h) correcting a position of the first socket or the electronic device under test based on the first relative position, and
(c) positioning the electronic device under test with respect to the second socket includes:
(i) imaging the second main surface of the electronic device under test;
(j) recognizing, on a second image information imaged by (i) imaging the second main surface of the electronic device under test, a second relative position of the electronic device under test with respect to the second socket; and
(k) correcting a position of the electronic device under test based on the second relative position;
wherein
(c) positioning the electronic device under test with respect to the second socket further includes
(p) imaging the second socket provided thereon with a second alignment mark, and
(j) recognizing the second relative position of the electronic device under test with respect to the second socket includes:
(u) extracting a position of the second alignment mark from a fourth image information imaged by (p) imaging the second socket;
(r) extracting a position of the second device terminal from the second image information; and
(s) comparing the position of the second alignment mark and the position of the second device terminal to calculate the second relative position.

* * * * *